(12) United States Patent
Patil et al.

(10) Patent No.: US 12,077,432 B2
(45) Date of Patent: Sep. 3, 2024

(54) LASER-ASSISTED MATERIAL PHASE-CHANGE AND EXPULSION MICRO-MACHINING PROCESS

(71) Applicant: Massachusetts Institute of Technology, Cambridge, MA (US)

(72) Inventors: Prashant Patil, Cambridge, MA (US); Neil Gershenfeld, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 524 days.

(21) Appl. No.: 17/092,284

(22) Filed: Nov. 8, 2020

(65) Prior Publication Data
US 2021/0139321 A1     May 13, 2021

Related U.S. Application Data

(60) Provisional application No. 62/932,914, filed on Nov. 8, 2019.

(51) Int. Cl.
    *B81C 1/00*        (2006.01)
    *B23K 26/00*      (2014.01)
    (Continued)

(52) U.S. Cl.
    CPC ...... *B81C 1/00547* (2013.01); *B23K 26/0006* (2013.01); *B23K 26/354* (2015.10);
    (Continued)

(58) Field of Classification Search
    CPC .............................................. B81C 2203/054
    See application file for complete search history.

(56) References Cited

U.S. PATENT DOCUMENTS 4,642,160 A * 2/1987 Burgess ............... H05K 3/4679
                                                                                       216/48
2002/0074520 A1    6/2002 Yu et al.
(Continued)

FOREIGN PATENT DOCUMENTS

AU       2020378152 B2    7/2022
CN        106029589 A      10/2016
(Continued)

OTHER PUBLICATIONS

Translation of JP-H10261862-A (Year: 1998).*
(Continued)

*Primary Examiner* — Elizabeth M Kerr
(74) *Attorney, Agent, or Firm* — Dunlap Bennett & Ludwig, PLLC

(57) ABSTRACT

A laser micro-machining process called laser-assisted material phase-change and expulsion (LAMPE) micromachining that includes cutting features in a cutting surface of a piece of material using a pulsed laser with intensity, pulse width and pulse rate set to melt and eject liquid material without vaporizing said material, or, in the case of silicon, create an ejectible silicon oxide. Burrs are removed from the cutting surface by electro-polishing the cutting surface with a dilute acid solution using an electric potential higher than a normal electro-polishing electric potential. A multi-lamina assembly of laser-micro-machined laminates (MALL) may utilize MEMS. In the MALL process, first, the individual layers of a micro-electromechanical system (MEMS) are fabricated using the LAMPE micro-machining process. Next, the fabricated microstructure laminates are stack assembled and bonded to fabricate MEM systems. The MALL MEMS fabrication process enables greater material section and integration, greater design flexibility, low-cost manufacturing, rapid development, and integrated packaging.

16 Claims, 40 Drawing Sheets

(51) Int. Cl.
*B23K 26/354* (2014.01)
*B23K 101/40* (2006.01)
*B23K 103/00* (2006.01)

(52) U.S. Cl.
CPC ...... *B81C 1/00611* (2013.01); *B81C 1/00904* (2013.01); *B23K 2101/40* (2018.08); *B23K 2103/50* (2018.08); *B81C 2201/0125* (2013.01); *B81C 2201/0143* (2013.01); *B81C 2203/032* (2013.01); *B81C 2203/054* (2013.01)

(56) References Cited

U.S. PATENT DOCUMENTS

| | | | | |
|---|---|---|---|---|
| 2005/0042805 | A1* | 2/2005 | Swenson | B23K 26/40 438/460 |
| 2008/0108122 | A1 | 5/2008 | Paul et al. | |
| 2011/0210106 | A1* | 9/2011 | Schaefer | B23K 26/082 219/121.72 |
| 2012/0125892 | A1 | 5/2012 | Shimoi et al. | |
| 2013/0069204 | A1 | 3/2013 | Duffy et al. | |
| 2014/0182917 | A1* | 7/2014 | Mikado | B23K 26/386 174/262 |
| 2015/0166396 | A1* | 6/2015 | Marjanovic | B23K 26/04 428/137 |
| 2021/0139321 | A1 | 5/2021 | Patil | |

FOREIGN PATENT DOCUMENTS

| | | | | |
|---|---|---|---|---|
| CN | 106498484 | A * | 3/2017 | ........ C25F 3/22 |
| EP | 4025375 | A1 | 7/2022 | |
| JP | 03032486 | A | 2/1991 | |
| JP | H0332486 | A | 2/1991 | |
| JP | H10261862 | A * | 9/1998 | ........ H05K 3/00 |
| JP | 200102010 | A | 1/2001 | |
| JP | 2001020100 | A | 1/2001 | |
| JP | 2004275789 | A | 10/2004 | |
| WO | 2010036503 | | 4/2010 | |
| WO | 2010036503 | A2 | 4/2010 | |
| WO | 2021092527 | A1 | 5/2021 | |

OTHER PUBLICATIONS

Translation of CN-106498484A (Year: 2017).*
International Search Report for Application PCT/US 2020/059587, mailed on Mar. 4, 2021, 2 Pages.
Written Opinion of the International Searching Authority for Application PCT/US 2020/059587, mailed on Mar. 4, 2021, 5 Pages.
Patent Examination Report; New Zealand Application No. 786842; Mailed Jan. 10, 2023.
Jaroniec et al., "High-resolution molecular structure of a peptide in an amyloid fibril determined by magic angle spinning NMR spectroscopy," Proceedings of the National Academy of Sciences of the United States of America, vol. 101, No. 3, Jan. 20, 2004, pp. 711-716.
Robert Tycko, "Solid State NMR Studies of Amyloid Fibril Structure," Annual Review of Physical Chemistry, vol. 62, No. 1, May 2011, pp. 24.
Bbckmann et al., "Spinning proteins, the faster, the better?," Journal of Magnetic Resonance, vol. 253, 2015, pp. 26.
Polenoval et al., "Magic Angle Spinning NMR Spectroscopy: A Versatile Technique for Structural and Dynamic Analysis of Solid-Phase Systems," American Chemical Society, vol. 25, No. 3, Mar. 20, 2015, pp. 5458-5469.
Penzel et al., "Spinning faster: protein NMR at MAS frequencies up to 126 kHz," Journal of Biomolecular NMR, vol. 73, No. 1-2, Jan. 24, 2019, pp. 19-29.
Bouleau et al., "Pushing NMR sensitivity limits using dynamic nuclear polarization with closed-loop cryogenic helium sample spinning," Chemical Science, DOI: 10.1039/c5sc02819a, vol. 6, No. 12, pp. 6806-6812, 2015.
Wendell H. Potter, "Apparatus to Rotate Samples Rapidly at Temperatures Less Than 2 K in High Transverse Magnetic Fields," Review of Scientific Instruments, vol. 42, No. 5, 1971, pp. 618-625. [Abstract Only].
S. Wegner, Solid State NMR News and Updates, accessed Aug. 10, 2019. https://www.bruker.com/fileadmin/user_upload/8-PDF-Docs/MagneticResonance/Events_NMR/UM_DE18/Solid_State_NMR_Workshop_2.pdf.
Jensen et al., "Brookhaven national laboratory selected cryogenic data notebook", Sections I-IX, vol. I, Brookhaven National Laboratory, 1980, pp. 557.
Olson et al., "Tensile strength of synthetic chemical-vapor-deposited diamond," Journal of Applied Physics, vol. 78, No. 8, 1995, pp. 5177-5179. [Abstract Only].
A. G. Hamlir, B. J. Roberts, U. Kingdom, and A. Energy, "Feb. 20, 1960," Nature, vol. 185, No. 4712, p. 522, 1960.
Vita et al., "A microscopic model for surface-induced diamond-to-graphite transitions," Nature, vol. 379, Feb. 8, 1996, pp. 523-526. [Abstract Only].
Hedlund et al., "Microloading effect in reactive ion etching," Journal of Vacuum Science & Technology A: Vacuum, Surfaces, and Films, vol. 12, No. 4, 1994, pp. 1962-1965. [Abstract Only].
University Wafer, retrieved on Feb. 8, 2021, 3 pages. Available at: https://order.universitywafer.com.
Ramm et al., "Handbook of wafer bonding", Technology & Engineering, John Wiley & Sons, Nov. 17, 2011, pp. 425.
Beeby et al., "MEMS mechanical sensors", Artech House Microelectromechanical Systems, Microelectromechanical systems series, Artech House, 2004, pp. 269.
Henri et al., "A survey on the reactive ion etching of silicon in microtechnology," Journal of Micromechanics and Microengineering, vol. 6, No. 1, 1996, pp. 15.
Judy et al., "Polysilicon hollow beam lateral resonators," [1993] Proceedings IEEE Micro Electro Mechanical Systems, Fort Lauderdale, USA, doi: 10.1109/MEMSYS.1993.296911, 1993, pp. 265-271. [Abstract Only].
Yoon et al., "4-Terminal MEMS relay with an extremely low contact resistance employing a novel one-contact design," 2017 19th International Conference on Solid-State Sensors, Actuators and Microsystems (Transducers), IEEE, 2017, pp. 906-909. [Abstract Only].
Nathanael et al., "Four-Terminal-Relay Body-Biasing Schemes For Complementary Logic Circuits," IEEE Electron Device Letters, vol. 31, No. 8, Aug. 2010, pp. 890-892. [Abstract Only].
S. Farrens, "Wafer-Bonding Technologies and Strategies for 3D ICs", Wafer level 3-D ICs process technology, Integrated Circuits and Systems, Springer Science & Business Media, 2009, pp. 35. [Abstract Only].
Lee et al., "Wafer-to-wafer alignment for three-dimensional integration: A review," Journal of Microelectromechanical Systems, vol. 20, No. 4, Aug. 2011, pp. 885-898.
Tung et al., "Flip-chip bonding alignment accuracy enhancement using self-aligned interconnection elements to realize low-temperature construction of ultrafine-pitch copper bump interconnections," Proceedings—IEEE 64th Electronic Components and Technology Conference (ECTC), Orlando, FL, 2014, doi: 10.1109/ECTC.2014.6897268, pp. 62-67. [Abstract Only].
Slocum et al., "Precision Passive Mechanical Alignment of Wafers," Journal of Microelectromechanical Systems, vol. 12, No. 6, Dec. 2003, pp. 826-834.
Stafe et al., "Pulsed Laser Ablation of Solids: Basics, Theory and Applications", vol. 53. Springer Science & Business Media, 2013, pp. 233. [Abstract Only].
Sugioka et al., "Femtosecond laser three-dimensional micro- and nanofabrication," Applied Physics Reviews, vol. 1, No. 4, 2014, pp. 36.
A. A. Tseng, "Recent developments in micromilling using focused ion beam technology," Journal of Micromechanics and Microengineering, vol. 14, No. 4, Jan. 19, 2004, pp. 20.
Watanabe et al., "Plasma ion-beam 3d printing: A novel method for rapid fabrication of customized mems sensors," 2018 IEEE Micro Electro Mechanical Systems (MEMS), IEEE, 2018, pp. 459-462. [Abstract Only].

(56) References Cited

OTHER PUBLICATIONS

Vaezi et al., "A review on 3D micro-additive manufacturing technologies," International Journal of Advanced Manufacturing Technology, DOI 10.1007/s00170-012-4605-2, Springer, vol. 63, No. 9-12, Nov. 25, 2012, pp. 36.
Maruo et al., "Submicron Stereolithography for the Production of Freely Movable Mechanisms by Using Single-Photon Polymerization," Sensors and Actuators, A: Physical, vol. 100, No. 1, Aug. 15, 2002, pp. 70-76. [Abstract Only].
Maruo et al., "Movable Microstructures Made By Two-Photon Three-Dimensional Microfabrication," MHS'99, Proceedings of 1999 International Symposium on Micromechatronics and Human Science (Cat. No. 99TH8478), IEEE, 1999, pp. 173-178. [Abstract Only].
Newport Corporation, "AgilisTM Piezo Motor Driven Linear Stages", retrieved on Feb. 8, 2021, 3 pages. Available at: https://www.newport.com/f/agilis-piezo-motor-linear-stages.
Nadya Peek, "Making Machines That Make: Object-Oriented Hardware Meets Object-Oriented Software", PhD thesis, Massachusetts Institute of Technology, Sep. 2016, 150 pages.
MTM, "Machine That Makes", retrieved on Feb. 8, 2021, 7 pages. Available at: http://mtm.cba.mit.edu/.
Neumann et al., "Theory of Self-Reproducing Automata," University of Illinois Press, 1966, 403 pages.
Wu et al., "Microfluidic printed circuit boards," Proceedings—Electronic Components and Technology Conference, pp. 1576-1581, 2011.
Weigl et al., "Design and rapid prototyping of thin-film laminate-based microfluidic devices," Biomedical Microdevices, vol. 3, No. 4, pp. 267-274, 2001.
Chichkov et al., "Femtosecond, picosecond and nanosecond laser ablation of solids," Appl. Phys, vol. 63, pp. 109-115, 1996. [Abstarct Only].
Leitz et al., "Metal ablation with short and ultrashort laser pulses," Physics Procedia, vol. 12, No. Part 2, pp. 230-238, 2011.
Dieter Bauerle, "Laser Processing and Chemistry", Springer Science & Business Media, Fourth ed., 2013, pp. 22.
Laser micromachining, retrieved on Feb. 8, 2021, pp. 4, available at: https://www.oxfordlasers.com/laser-micromachining.
Steen et al., "Laser Material Porcessing", Springer Science & Business media, 2010, pp. 558.
Paschotta et al., "Encyclopedia of laser physics and technology", vol. 1, Wiley Online Library, 2008, pp. 856.
Dr. Rüdiger Paschotta, "Optical Intensity", pp. 5, retrieved on Feb. 8, 2020, available at: https://www.rp-photonics.com/optical_intensity.html.
Thorlabs, Small Beam Diameter Scanning Galvo Mirror Systems, retrieved on Feb. 8, 2020, available at: https://www.thorlabs.com/thorproduct.cfm?partnumber=GVS202.
Hosford et al., "Metal forming: mechanics and metallurgy", Cambridge University Press, 2011.
Karnakis et al., "High quality laser milling of ceramics, dielectrics and metals using nanosecond and picosecond lasers," in Photon Processing in Microelectronics and Photonics V, vol. 6106, 2006, pp. 11.
Heyl et al., "Manufacturing of 3D structures for micro-tools using laser ablation," Microelectronic Engineering, vol. 57-58, pp. 775-780, 2001. [Abstract Only].
J. Meijer, "Laser beam machining (LBM), state of the art and new opportunities," Journal of Materials Processing Technology, vol. 149, No. 1-3, pp. 2-17, 2004.
Breitling et al., "Fundamental aspects in machining of metals with short and ultrashort laser pulses," Photon Processing in Microelectronics and Photonics III, vol. 5339, Jul. 2004, p. 49, 2004. [Abstract Only].
Forsman et al., "Double-pulse machining as a technique for the enhancement of material removal rates in laser machining of metals," Journal of Applied Physics, vol. 98, No. 3, 2005, pp. 7.
R. W. Pryor, Multiphysics modeling using COMSOL: a first principles approach. Jones & Bartlett Publishers, 2009.
Walter Frei, "Modeling thermal ablation for material removal", Mar. 30, 2016, pp. 8.
Go et al., "Microscale gas breakdown: Ion-enhanced field emission and the modified Paschen's curve," Journal of Physics D: Applied Physics, vol. 47, No. 50, 2014. [Abstract Only].
D. Landolt, "Fundamental Aspects of Electropolishing," Ekcuochimiru Aore, vol. 12, No. 1, 1987, pp. 1-11.
K. E. Petersen, "Silicon as a mechanical material," in Proceedings of the IEEE, vol. 70, IEEE, 1982, pp. 420-457.
Wu et al., "High aspect ratio silicon etch: A review," Journal of Applied Physics, vol. 108, No. 5, 2010. [Abstract Only].
Brandi et al., "Very large spot size effect in nanosecond laser drilling efficiency of silicon," Optics Express, vol. 18, No. 22, 2010, pp. 7.
Molpeceres et al., "Microprocessing of ITO and a-Si thin films using ns laser sources," Journal of Micromechanics and Microengineering, vol. 15, No. 6, pp. 1271-1278, 2005. [Abstract Only].
Kaspar et al., "Laser helical drilling of silicon wafers with ns to fs pulses: Scanning electron microscopy and transmission electron microscopy characterization of drilled through-holes," Journal of Laser Applications, vol. 18, No. 2, pp. 85-92, 2006.
Hendowand et al., "Structuring materials with nanosecond laser pulses," Optics Express, vol. 18, No. 10, 2010, pp. 12.
Lim et al., "Mass removal modes in the laser ablation of silicon by a Q-switched diode-pumped solid-state laser (DPSSL)," Journal of Physics D: Applied Physics, vol. 39, No. 12, pp. 2624-2635, 2006.
Lee et al., "Analysis of silicon via hole drilling for wafer level chip stacking by UV laser," International Journal of Precision Engineering and Manufacturing, vol. 11, No. 4, pp. 501-507, 2010.
Herfurth et al., "Micromachining with tailored nanosecond pulses," Photonics North 2007, vol. 6796, No. Oct. 2007, p. 67961G, 2007, pp. 8.
Karnakis et al., "High power dpss laser micromachining of silicon and stainless steel," in Proceedings of the Third International WLT-Conference on Lasers in Manufacturing, Jun. 2005, pp. 5.
Yoo et al., "Evidence for phase-explosion and generation of large particles during high power nanosecond laser ablation of silicon," Applied Physics Letters, vol. 76, No. 6, pp. 783-785, 2000. [Abstract Only].
Wu et al., "High aspect ratio silicon etch: A review," Journal of Applied Physics, vol. 108, No. 5, 2010, pp. 20.
Beyeler et al., "Monolithically Fabricated Microgripper With Integrated Force Sensorfor Manipulating Microobjects and Biological Cells Aligned in an Ultrasonic Field," Journal of Microelectromechanical Systems, vol. 16, No. 1, pp. 7-15, 2007.
Garcia et al., "Surface Micromachined Microengine as the Driver for Electromechanical Gears," Eurosensors IX, pp. 365-368, 1995.
Lynx Evo Eyepiece-less Stereo Microscope, retrieved on Feb. 9, 2021. Available at: https://www.visioneng.us/products/eyepiece-less-stereo-microscopes/lynx-evo/.
Xie et al., "Passively self-aligned assembly of compact barrel hinges for high-performance, out-of-plane mems actuators," Proceedings of the IEEE International Conference on Micro Electro Mechanical Systems (MEMS), Jan. 22-26, 2017, pp. 813-816.
Xie et al., "A pivot-hinged, multilayer SU-8 micro motion amplifier assembled by a self-aligned approach," Proceedings of the IEEE International Conference on Micro Electro Mechanical Systems (MEMS), Shanghai, 2016, pp. 75-78. [Abstract Only].
Lee et al., "Fine Keyed Alignment and Bonding for Wafer-Level 3D ICs," Materials Research Society Symp. Proc., vol. 914, 2006, pp. 6.
Legtenberg et al., "Comb-drive actuators for large displacements," Journal of Micromechanics and Microengineering, vol. 6, No. 3, 1999, pp. 10.
L. J. Durney, "Graham's Electroplating Engineering Handbook", Springer Science & Business Media, 1984, 790 pages.
Ville Kaajakari, "Practical MEMS : Analysis and Design of Microsystems, MEMS Sensors (accelerometers, Pressure Sensors, Gyroscopes), Sensor Electronics, Actuators, RF MEMS, Optical MEMS, and Microfuidic Systems," Small Gear Publishing, Mar. 17, 2009, pp. 496.

(56) References Cited

OTHER PUBLICATIONS

Strong et al., "Electrical breakdown across micron scale gaps in MEMS structures," Reliability, Packaging, Testing, and Characterization of MEMS/MOEMS V, vol. 6111, 2006, p. 611103. [Abstract Only].
Klas et al., "Experimental and theoretical studies of the breakdown voltage characteristics at micrometre separations in air," EPL (Europhysics Letters Association), vol. 95, No. 3, Jul. 20, 2011. [Abstract Only].
Hariri et al., "Modeling of dry stiction in micro electro-mechanical systems (MEMS)," Journal of Micromechanics and Microengineering, vol. 16, No. 7, 2006, pp. 1195-1206. [Abstract Only].
Zhuang et al., "Vapor-Phase Self-Assembled Monolayers for Anti-Stiction Applications in MEMS," Journal of Microelectromechanical Systems, vol. 16, No. 6, Dec. 2007, pp. 1451-1460.
Ashurst et al., "Vapor phase anti-stiction coatings for MEMS," IEEE Transactions on Device and Materials Reliability, vol. 3, No. 4, Dec. 2003, pp. 173-178.
Knowles et al., "The amyloid state and its association with protein misfolding diseases," Nature Reviews Molecular Cell Biology, vol. 15, No. 6, Jun. 2014, pp. 384-396.
Jang et al., "New structures help the modeling of toxic amyloidll ion channels," Trends in Biochemical Sciences, vol. 33, Issue 2, Feb. 2008, pp. 91-100. [Abstract Only].
Andrew et al., "Nuclear magnetic resonance spectra from a crystal rotated at high speed," Nature, vol. 182, No. 4650, Dec. 13, 1958, p. 1658.
Cohen et al., "Physical Review Letters Free Induction Decays of Rotating Solids," Phys. Rev. Lett, vol. 2, No. 7, p. 71, 1957.
Office Action; Chinese Application No. 202080077072.X; Mailed Sep. 7, 2022.
Patent Examination Report; New Zealand Application No. 786842; Dated Jul. 8, 2022.
Japanese Search Report; JP2022526693; Mailed Oct. 18, 2022.
India Examination Report; 202217031173; Mailed Oct. 7, 2022.
D. Niarchos, "Magnetic MEMS: key issues and some applications," Sensors and Actuators, A: Physical, vol. 109, No. 1-2, 2003, pp. 166-173.
S. D. Senturia, "Microsystem Design", Springer Science & Business Media, 2001, 689 pages.
Ramadoss et al., "Fabrication, Assembly, and Testing of RF MEMS Capacitive Switches Using Flexible Printed Circuit Technology," IEEE Transactions on Advanced Packaging, vol. 26, No. 3, 2003, pp. 248-254. [Abstract Only].
Weber et al., "PCB-MEMS RF switch: Parametric analysis and design guide lines," SBMO/IEEE MTT-S International Microwave and Optoelectronics Conference Proceedings, 2007, pp. 141-144. [Abstract Only].
Chang et al., "RF MEMS switches fabricated on microwave-laminate printed circuit boards," IEEE Electron Device Letters, vol. 24, No. 4, 2003, pp. 227-229. [Abstract Only].
Mapar et al., "Laminate MEMS for Heterogeneous Integrated Systems," MRS Online Proceedings Library Archive, vol. 1427, 2012. [Abstract Only].
Tsai et al., "A Laminate Cantilever Waveguide Optical Switch," Proceedings—Electronic Components and Technology Conference, 2012, pp. 203-207. [Abstract Only].
Bachman et al., "MEMS in laminates and package substrates," 2013 IEEE International Symposium on Advanced Packaging Materials, vol. 1, No. Paper 32, 2013, pp. 121-125. [Abstract Only].
Nimrod Copper, "4 Mil Copper Foils", retrieved on Feb. 8, 2021, 4 pages. Available at: https://www.nimrodcopper.com/shop/4-mil-copper-foils-(-004)-13250.
McClintock et al., "The milliDelta: A high-bandwidth, high-precision, millimeter-scale Delta robot," Science Robotics, Research Article, vol. 3, No. 14, 2018, pp. 10.
Bachman et al., "Laminates for MEMS and BioMEMS," 2012 14th International Conference on Electronic Materials and Packaging (EMAP), Lantau Island, 2012, pp. 1-5. [Abstract Only].

A. S. Holmes, "Laser processes for MEMS manufacture," Proceedings of SPIE—The International Society for Optical Engineering, vol. 4426, No. 43, 2002, pp. 203-209. [Abstract Only].
M. C. Gower, "Laser micromachining for manufacturing MEMS devices," MEMS Components and Applications for Industry, Automobiles, Aerospace, and Communication, vol. 4559, Oct. 2001, pp. 53-59.
El-Bandrawy et al., "Femtosecond laser micromachining of silicon for MEMS," Proc. SPIE 4977, Photon Processing in Microelectronics and Photonics II, vol. 4977, Oct. 2003, pp. 219-225. [Abstract Only].
Abbott et al., "New techniques for laser micromachining MEMS devices," High-Power Laser Ablation IV, vol. 4760, no. Sep. 2002, pp. 8.
Knowles et al., "Micro-machining of metals, ceramics and polymers using nanosecond lasers," International Journal of Advanced Manufacturing Technology, vol. 33, No. 1-2, 2007, pp. 95-102.
Tbnshoff et al., "Microdrilling of metals with ultrashort laser pulses," Journal of Laser Applications, vol. 12, No. 1, 2000, pp. 23-27. [Abstract Only].
N. H. Rizvi, "Femtosecond Laser Micromachining: Current Status and Applications," Optics Communications, vol. 114, No. 1-2, 2002, pp. 10.
Lawes et al., "The formation of moulds for 3D microstructures using excimer laser ablation," Microsystem Technologies, Springer-Verlag, vol. 3, No. 1, 1996, pp. 17-19.
Yeom et al., "Maximum achievable aspect ratio in deep reactive ion etching of silicon due to aspect ratio dependent transport and the microloading effect," Journal of Vacuum Science & Technology B: Microelectronics and Nanometer Structures, vol. 23, No. 6, 2005, pp. 11.
Jaecklin et al., "Optical Microshutters and Torsional Micromirrors for Light Modulator Arrays," Cycle, 2007, pp. 124-127. [Abstract Only].
Yung et al., "Rapid prototyping of polymer-based MEMS devices using UV YAG laser," Journal of Micromechanics and Microengineering, vol. 14, No. 12, 2004, pp. 1682-1686. [Abstract Only].
Tang et al., "Laterally Driven Polysilicon Resonant Microstructures," Micromechanics and MEMS: Classic and Seminal Papers to 1990, vol. 20, 1997, pp. 7.
Lin et al., "Microelectromechanical Filters for Signal Processing," Proceedings IEEE Micro Electro Mechanical Systems, Journal of Microelectromechanical Systems, vol. 7, No. 3, Sep. 1998, pp. 286-294.
Palasagaram et al., "MEMS-capacitive pressure sensor fabricated using printed-circuit-processing techniques," EEE Sensors Journal, vol. 6, No. 6, 2006, pp. 1374-1375. [Abstract Only].
Janney et al., "MEMS Accelerometer Fabricated Using Printed Circuit Processing Techniques," in IEEE International Symposium on Industrial Electronics, 2007, pp. 3250-3254.
Bachman et al., "Latched microswitches in laminates for high power 0-6.5 GHz applications," Electronics Letters, vol. 50, No. 14, 2014, pp. 1010-1012.
Henri et al., "A survey on the reactive ion etching of silicon in microtechnology," Journal of Micromechanics and Microengineering, vol. 6, No. 1, 1996, pp. 14-28.
Marty et al., "Advanced etching of silicon based on deep reactive ion etching for silicon high aspect ratio microstructures and three-dimensional micro-and nanostructures," Microelectronics journal, vol. 36, No. 7, 2005, pp. 673-677.
Ayon et al., "Deep reactive ion etching: a promising technology for micro- and nanosatellites," Smart materials and structures, vol. 10, No. 6, 2001, p. 1135. [Abstract Only].
Fujimoto et al., "Development of multi-stack process on wafer-on-wafer (wow)," in 2010 IEEE CPMT Symposium Japan, IEEE, 2010, pp. 1-4.
Luque et al., "Electroosmotic impulsion device for integration in PCB-MEMS," Proceedings of the 2013 Spanish Conference on Electron Devices, CDE2013, pp. 119-122, 2013. [Abstract Only].
Bachman et al., "MEMS in laminates," Proceedings—Electronic Components and Technology Conference, pp. 262-267, 2011. [Abstract Only].

(56) References Cited

OTHER PUBLICATIONS

Bachman et al., "Integrated mems in package," Circuit World, vol. 38, No. 4, pp. 184-192, 2012. [Abstract Only].
Shim et al., "An Integrated RF MEMS Tunable Filter," 2012 IEEE 25th International Conference on Micro Electro Mechanical Systems (MEMS), IEEE, 2012, pp. 15-18.
P. Goel, "Mems non-silicon fabrication technologies," Sensors & Transducers, vol. 139, No. 4, 2012, pp. 23.
Bachman et al., "Laminates for mems and biomems," in 2012 14th International Conference on Electronic Materials and Packaging (EMAP), pp. 1-5, IEEE, 2012. [Abstract Only].
Maddela et al., "A MEMS-based tunable coplanar patch antenna fabricated using PCB processing techniques," Journal of Micromechanics and Microengineering, vol. 17, No. 4, 2007, pp. 812-819.
Luque et al., "Single axis accelerometer fabricated using printed circuit board techniques and laser ablation," Sensors and Actuators A: Physical, vol. 192, pp. 119-123, 2013. [Abstract Only].
Rogers et al., "A microelectromechanical accelerometer fabricated using printed circuit processing techniques," Journal of Micromechanics and Microengineering, vol. 18, No. 1, 2007, pp. 8.
Cardenas-Valencia et al., "Aluminum-anode, silicon-based microcells for powering expendable mems and lab-on-a-chip devices," Sensors and Actuators B: Chemical, vol. 122, No. 1, Mar. 8, 2007, pp. 328-336. [Abstract Only].
Whitney et al., "Pop-up book MEMS," Journal of Micromechanics and Microengineering, vol. 21, No. 11, 2011, pp. 7.
York et al., "Meso scale flextensional piezoelectric actuators," Smart Materials and Structures, vol. 27, No. 1, p. 015008, 2017. [Abstract Only].
Lessing et al., "Inkjet printing of conductive inks with high lateral resolution on omniphobic "rf paper" for paper-based electronics and mems," Advanced Materials, vol. 26, No. 27, pp. 29, 2014.
J. A. Lewis, "Direct-write assembly of ceramics from colloidal inks," Current Opinion in Solid State and Materials Science, vol. 6, No. 3, pp. 245-250, 2002.
Visser et al., "Toward 3d printing of pure metals by laser-induced forward transfer," Advanced Materials, vol. 27, No. 27, 2015, pp. 5.
C. G. K. Malek, "Su8 resist for low-cost x-ray patterning of high-resolution, high-aspect-ratio mems," Microelectronics Journal, vol. 33, No. 1-2, pp. 101-105, 2002.
R. T. Howe, "Surface micromachining for microsensors and microactuators," Journal of Vacuum Science & Technology B: Microelectronics and Nanometer Structures, vol. 6, No. 6, 1988, p. 1809. [Abstract Only].
Gardner et al., Microsensors, MEMS, and Smart Devices. Wiley New York, 2001, pp. 521.
J. G. Korvink, "MEMS: A Practical Guide to Design", Analysis and Applications. Springer Science & Business Media, 2010 pp. 30.
European Search Report; 20884709.5; Dated Sep. 11, 2023.
Indian Examination Report; 202217031173; Dispatched Oct. 10, 2022.
Korean Office Action; 10-2022-7014448; Delivered Sep. 7, 2023.
Brazilian Office Action; BR112022007843-9; Dated Aug. 8, 2023.
Canadian Examination Search Report; 3,158,185; Dated May 25, 2023.
Extended European Search Report; 20884709.5; Dated Jan. 30, 2024.

* cited by examiner

Material melting and expulsion

LASER-ASSISTED MATERIAL PHASE-CHANGE AND EXPULSION MICRO-MACHINING PROCESS

This application is related to, and claims priority from U.S. Provisional Patent Application No. 62/932,914 filed Nov. 8, 2019. Application 62/932,914 is hereby incorporated by reference in its entirety.

BACKGROUND

Field of the Invention

The present invention relates generally to the field of micro-electromechanical systems (MEMS), and more particularly to a laser-assisted micro-machining process.

Description of the Problem Solved

Micro-electromechanical systems (MEMS) have many applications in fields like healthcare, consumer electronics, automobiles, and energy. However, the development of novel MEMS devices has been significantly hindered by several limitations of lithography-based microfabrication processes used to manufacture MEMS. First, these processes require access to expensive microfabrication tools such as photolithography systems, mask aligners, and deposition and etching tools. Moreover, these processes have a lengthy process development time. The high cost of equipment ownership and long development time associated with the lithography-based microfabrication processes makes them unsuitable for research and development, and low-volume MEMS production.

Second, the fabrication material is largely restricted to silicon and related materials such as silicon oxide and silicon nitride. The restriction in the choice of fabrication material limits the variety of MEM systems that can be designed and fabricated. For example, magnetic MEMS can potentially have distinct advantages over electrostatic/piezoelectric actuators such as high strength, polarity, and long actuation distance. However, fabricating magnetic MEMS is challenging due to the incompatibility of magnetic materials with lithography-based MEMS fabrication processes [1]. Furthermore, the performance of MEMS devices is compromised due to the restricted choice of fabrication materials. For example, even though spring steel is an excellent choice for making high-performance micro-springs for MEMS, generally silicon is used because spring steel is incompatible with lithography-based MEMS fabrication processes.

Finally, during MEMS design and fabrication, integrating various materials and corresponding fabrication process is often the most difficult task [2]. In the lithography-based fabrication process, MEM systems are fabricated in monolithic fashion by successive deposition and patterning layers of materials. Each material layer is deposited and patterned using a unique process, which must be compatible with the previously deposited materials. However, integrating these processes is difficult due to material incompatibilities, thermal constraints (for example, polymeric parts cannot be subjected to high-temperature processing step such as LPCVD silicon deposition), and mechanical stability of interim structures. In summary, the conventional lithography-based MEMS fabrication processes are costly, offer a limited choice of fabrication materials, and the integration of various materials is challenging.

Laser micromachining is an attractive alternative to conventional microfabrication processes. However, the application of laser micromachining in fabricating MEMS has been limited to drilling holes [1], [2], milling micro-trenches [3], and fabricating millimeter-scale structures [3]-[5]. The limited applications are due to two limitations of laser micromachining process.

First, manufacturing MEMS requires fabricating high aspect ratio (typically 10:1 or higher) microstructures with small lateral feature size (typically 10 µm and less). However, laser micromachining produces structures with low aspect ratio and large feature sizes. Therefore, the application of laser micromachining has been limited to drilling low-aspect ratio holes with diameter in the order of 40 to 50 micrometer or patterning surfaces.

Second, the laser micro-machined parts suffer from micro-burrs and debris around the machined parts. These imperfections are of the order of tens of microns, making these laser-micro-machines parts unsuitable for MEMS fabrication. Eliminating these micro-burrs from delicate MEMS microstructure parts is challenging. Methods like sonication and physical scrub are not practical for MEMS structures due to their fragile nature. An etching process often results in dissolving the MEM structures along with the burrs because the size of the burrs is of the same order as the size of MEMS parts. For these reasons, the laser-micromachining process has been largely used to fabricate rigid parts such as patterned surfaces, holes and trenches, where physical scrub or sonication can be utilized to remove burrs.

It would be extremely advantageous to have a laser micromachining process that produces micro-machined parts with high aspect ratios and small lateral features. It would also be advantageous to have an electro-deburring process to remove the burrs in the laser micro-machined parts to produce clean parts comparable to conventional microfabrication process such as deep reactive ion etching (DRIE).

SUMMARY OF THE INVENTION

The present invention relates to a laser micro-machining process called laser-assisted material phase-change and expulsion (LAMPE) micromachining. In addition, the present invention relates to a novel MEMS fabrication process called multi-lamina assembly of laser-micro-machined laminates (MALL) to fabricate MEMS. In the MALL process, first, the individual layers of a micro-electromechanical system (MEMS) are fabricated using the LAMPE micromachining process. Next, the fabricated microstructure laminates are stack assembled and bonded to fabricate MEM systems. The MALL MEMS fabrication process enables greater material section and integration, greater design flexibility, low-cost manufacturing, rapid development, and integrated packaging.

An object of the invention is a laser micromachining process called laser-assisted material phase-change and expulsion (LAMPE) micromachining process to produce sub diffraction-limited lateral features with aspect ratio as large as 10:1. Such features were previously not achievable using conventional laser micromachining process.

A further object of the invention is an electro-deburring process for removing micro-burrs from LAMPE micromachined or laser micro-machined metal parts. These micro-burrs are formed due to solidification of melted metal during laser micromachining and hinders the application of these parts in fabricating micro-electromechanical system (MEMS). The disclosed process and its application remove these burrs and produces clean parts suitable for MEMS fabrication that are comparable to parts produced using a conventional deep reactive ion etching (DRIE) process. Further disclosed is the application of an electro-deburring process to deburr metal parts produced using a micro-milling process, thereby, also enabling their application in MEMS fabrication.

A further object of the invention is the application of the LAMPE process for silicon micro-machining to rapidly produce small lateral features and high-aspect ratio (10:1) features. In this process, a laser is used to oxidize silicon (induce phase-change), and the newly formed granular silicon oxide is removed using pressure generated by partially vaporized silicon.

A further object of invention is an electro-deburring process for removing micro-burrs formed during LAMPE micro-machining or laser micro-machining of silicon. These burrs are formed due to solidification of silicon and silicon oxide formed during the micro-machining process and hinders the application of these parts in making MEMS. The disclosed process and its application remove these burrs and produce clean parts suitable for MEMS fabrication.

A further object of the invention is the application of the LAMPE process for diamond micro-machining to produce diffraction-limited lateral features and ultra-high aspect ratio features. This process can thus be utilized to fabricate diamond parts for micro-electromechanical (MEMS) system.

A further object of the invention is a novel MEMS fabrication process called multi-lamina assembly of laser micro-machined laminates (MALL) to fabricate MEMS. In this process, first, LAMPE micromachining is used to fabricate individual layer of MEMS. Second, the electro-deburring process is used to remove the micro-burrs from LAMPE micro-machined parts. Third, the individual layers are stack-assembled and bonded to fabricate MEMS. Often an optional fourth step is used to dissolve the sacrificial layer to create free-standing micro-structures in MEMS. For MEMS that do not require small features and high aspect ratio, a traditional laser micro-machining process in conjunction with electro-deburring process can be used to fabricate MEMS layers.

A further object of the invention is a roll-to-roll MEMS fabrication process utilizing MALL for volume manufacturing of MEMS. In this process, individual layers of MEMS are fabricated simultaneously using laser micromachining. Using a set of rollers, these layers are brought together and bonded to form MEMS.

A further object of the invention is the post-processor used to generate a toolpath for the LAMPE micromachining process. This post-processor generates a toolpath program that contains desired process variables and their set values to insure LAMPE micro-machining.

A further object of the invention is a process to fabricate ultra-thin metal foils (less than 10 micrometer thickness) for LAMPE micro-machining, and their application in MEMS fabrication. In this process, a water-soluble film is used as a substrate film on which metal is electro-deposited. The metal-substrate film is laser micro-machined and laminated, and the water-soluble film is removed to fabricate MEMS.

Finally, it is an object of the present invention is the application of the LAMPE micro-machining process in fabricating MEMS on a silicon-on-insulator (SOI) substrate. In this process, first, LAMPE micro-machining is used to pattern the device layer in SOI wafer. Next, the buried oxide is dissolved to using a hydrofluoric acid (HF) etch to create free-standing MEMS structures.

DESCRIPTION OF THE FIGURES

Attention is now directed to several figures that illustrate features of the present invention.

Figure 1A:
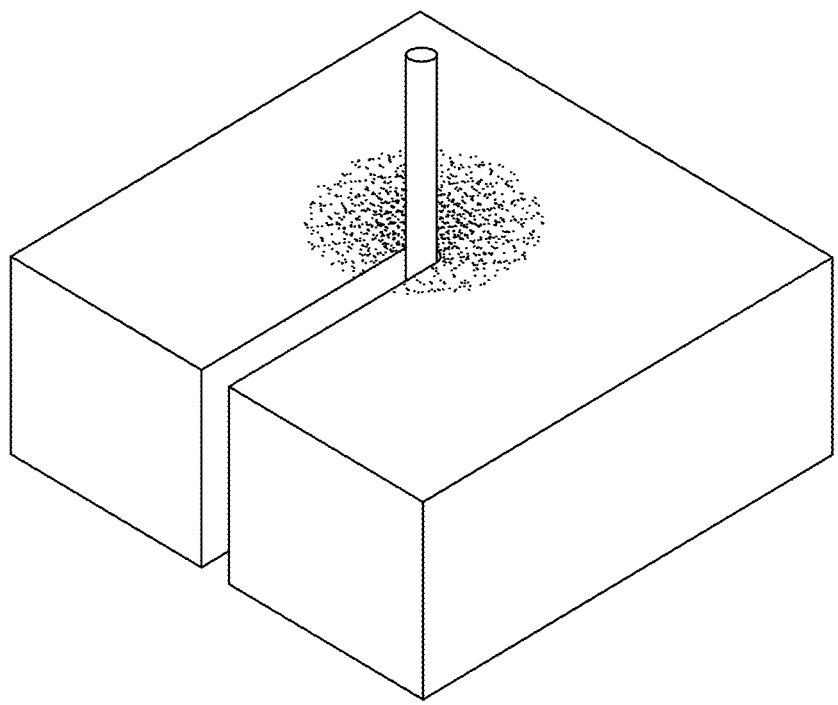
FIG. 1A shows a schematic diagram of LAMPE micromachining process illustrating fabrication of high aspect ratio structures.

Several illustrations have been presented to aid in understanding the present invention. The scope of the present invention is not limited to what is shown in the figures.

DESCRIPTION OF THE PREFERRED EMBODIMENTS

1 Laser-Assisted Material Phase-Change & Expulsion (LAMPE) Micro-Machining 1.1 Introduction Enabling MEMS fabrication using metals is advantageous because they offer a wide range of mechanical and electrical properties. Moreover, these properties can be tuned by the alloying process. The ability to fabricate MEM systems using metals empowers a new paradigm in MEMS design. Moreover, the metal foils used for MEMS fabrication are low-cost and easy to fabricate using a roll forming process [61]. Unfortunately, the existing wet and dry etching processes are isotropic and not suitable for fabricating high aspect ratio microstructures required for making MEMS.

At a macro-scale, lasers are widely used for cutting metal sheets. In this process, a laser is used to melt the metal, and a high-pressure air jet is used to expel the melted material. However, high-pressure jets cannot be employed at a micro-scale due to the delicate nature of the laser micro-machined structures. For this reason, laser micro-machining utilizes vaporization to remove the material. However, the vaporization process typically results in low aspect ratio micro-machining.

The low aspect ratio in pulsed laser ablation micro-machining utilizing vaporization is due to several reasons. First, during the ablation process, the vaporized material creates a plasma above the ablated region. This plasma absorbs the laser light, thereby reducing the energy available for ablation. As the depth of ablation crater increases, the laser absorption by the plasma becomes significant, and the laser energy available to the target is no longer enough to process the material. This phenomenon limits the maximum depth of micro-machining achievable using the PLA laser-micro-machining process.

Also, the aspect ratio depends upon the optical penetration depth of the material. For metals, the absorption coefficient $\alpha > 10^5$ cm$^{-1}$ [55], and the optical penetration depth, $1/\alpha$ is on the order of a few nanometers. Therefore, with a typical laser, the laser energy is confined to a very thin layer on the surface, and the laser acts as a surface heat source. Due to isotropic heat conduction, the surface heating of the metal results in an equal temperature gradient in all directions, thereby resulting in approximately 1:1 aspect ratio of ablation profile. However, in the special case of a laser with a Gaussian intensity, the distribution results in the depth of the ablation profile being larger than the width due to the high intensity at the center of the Gaussian beam.

Finally, the material vaporization also results in large melt-pool around the ablated region. This melted material is shifted by the high-pressure escaping vapors, thereby increasing the width of the ablation region.

1.2 LAMPE Micromachining

The present invention relates to a novel approach to laser micro-machine material sheets to create high aspect ratio structures significantly exceeding the optical penetration depth and thermal diffusion length of the material. The approach utilizes a laser-assisted, material phase-change and expulsion (LAMPE) process to achieve a high aspect ratio, while still maintaining small lateral features. In this process, low energy laser power is used to first induce a phase-change in the material, and then expel the altered material utilizing pressure generated by vapor bubbles formed at the laser-material interface due to the partial vaporization of material.

The expelled liquid-metal re-solidifies at the edges of the LAMPE micro-machined part. These re-solidified liquid-metal burrs can then be removed using an electro-deburring process herein disclosed. The process utilizes high current density at sharp burrs and edges to selectively electrochemically etch burrs without significantly affecting the dimensions of the LAMPE micro-machined part. It must be noted that for MEM systems that do not require high aspect ratio structures with small lateral features, traditional pulsed laser ablation (PLA) micro-machining in conjunction with the electro-deburring process can be used for MALL MEMS fabrication. The electro-deburring process is described in section 1.5.1 It is shown that the LAMPE micro-machining process can be used to fabricate lateral feature size smaller than the diffraction-limited spot size, and ultra-deep structures far exceeding the optical penetration depth of the laser beam.

A careful setting of laser power is required to achieve the laser-assisted material-phase change and expulsion process. A laser power below this level would not result in partial vaporization of the material, and no expulsion would occur. The laser power above the level will result in the creation of large melt-pool and complete vaporization, thereby increasing the feature size.

The LAMPE micro-machining can be used for a wide range of materials such as metals, silicon, and diamond. In LAMPE micromachining of metal sheets, first, the laser beam is used to melt (i.e., induce phase-change) the material, and then, the liquid-phase metal is expelled through the rear of the sheet; as a result, creating features as small as the diffraction-limited spot size and as deep as the Rayleigh length of the focused beam. Such small features-size and high aspect ratio are not achievable using conventional laser micro-machining utilizing vaporization to remove the material.

Similarly, in LAMPE micro-machining of silicon, low energy laser pulses are used to oxidize the silicon (i.e. induce phase-change). The newly formed silicon oxide transmits the laser light (due to its low absorption coefficient) causing further oxidation of silicon beneath it as a result, enabling oxidation far beyond the optical penetration depth of silicon. The formed silicon oxide is granular and expelled through the rear of the wafer utilizing pressure generated by vapor bubbles formed at the laser-material interface due to the partial vaporization of material.

Likewise, in LAMPE micro-machining of diamond, first, the laser is used to convert the diamond into graphite (i.e. induce phase-change), and then the newly formed graphite is removed by oxidizing the graphite into carbon dioxide. Using LAMPE micro-machining of diamond, a very high aspect ratio machining of diamond is achieved.

Using the LAMPE micro-machining process, burr-free parts with lateral features as small as 1 μm and aspect ratio as large as 20:1 can be fabricated. These features are comparable to features produced using conventional lithography-based micro-fabrication processes such as deep reactive ion etching (DRIE). The LAMPE micromachining process can result in a lateral feature size smaller than the diffraction-limited spot size of the beam and the aspect ratio as the Rayleigh length far exceeds the optical penetration depth of the material.

The LAMPE micromachining process has several advantages over laser ablation micro-machining. First, the laser power required for LAMPE micro-machining is significantly lower than the power required for laser micro-machining using vaporization. The low power requirement is because the enthalpy of melting is less than the enthalpy of vaporization. Moreover, the absence of vapor plasma shown in FIGS. 1A-1B results in no laser absorption, and the entire laser power is available for material processing. Second, the thermal and mechanical shock exerted on the material during melting is less the thermal and mechanical shock exerted on the material during vaporization. As a result, the heat-affected zone (HAZ) in LAMPE micro-machining is smaller than HAZ resulting in vaporization.

1.3 Difference Between PLA and LAMPE Micromachining

Figure 2A:
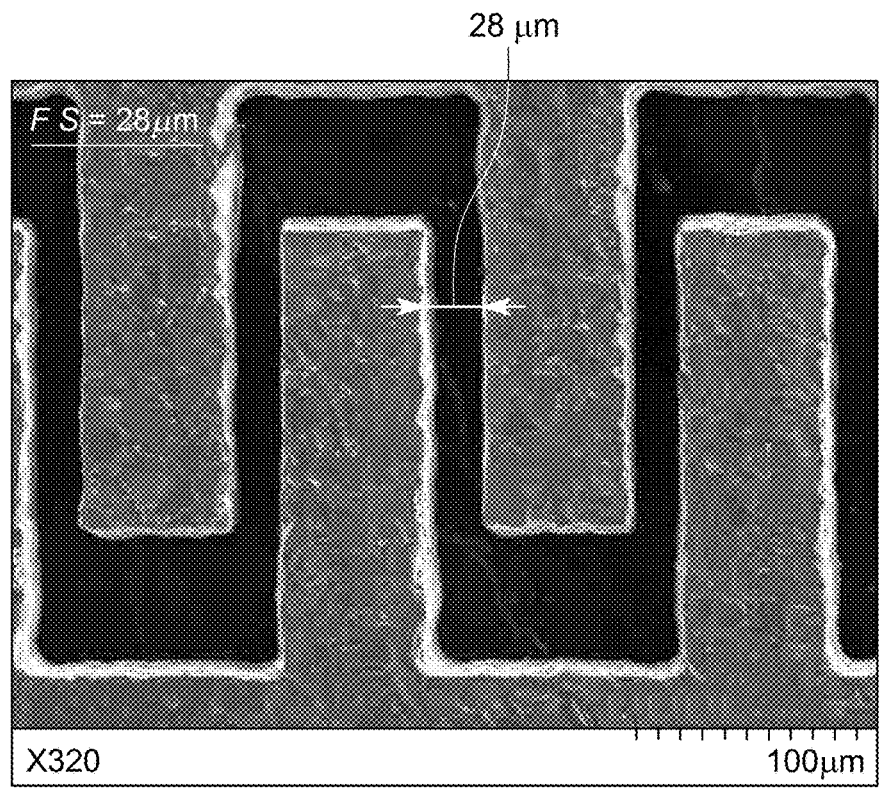
FIGS. 2A-2B show a comparison of lateral feature size (FS) produced in PLA and LAMPE micromachining. These parts have been cleaned using the electro-deburring process. (A) Lateral features produced in pulsed laser ablation (PLA) micromachining. (B) Lateral features produced in LAMPE micromachining.
Figure 2B:
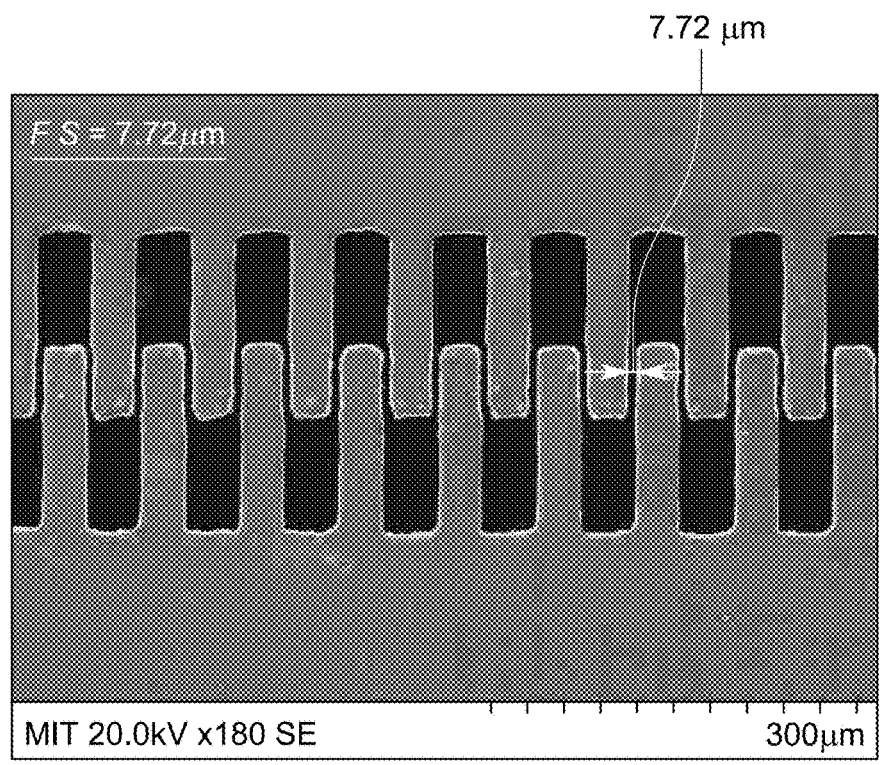

The differences between conventional laser micro-machining utilizing pulsed laser ablation and LAMPE micromachining process are as follows:

1. In conventional pulsed laser ablation (PLA) micro-machining, the material is removed using vaporization, and the mass of the target is reduced after the laser micromachining process. However, in the LAMPE micro-machining process, the metal is melted, and the liquid-metal is expelled through the rear of the sheet using the pressure generated by vapor bubbles formed at the laser-material interface. This expelled liquid-metal re-solidifies at the edges of the micro-machined part. Thus, the mass of the target remains unchanged. In LAMPE micro-machining, the material is removed using the electro-deburring process.
2. The laser fluence required in PLA micro-machining is higher than the laser fluence required in LAMPE micro-machining process because the enthalpy of vaporization is higher than the enthalpy of melting. The low fluence requirement for LAMPE micro-machining considerably reduces the cost of a laser source.
3. The conventional PLA laser micro-machining process can be used to fabricate 2.5D structures by raster scanning overlapping pulse irradiation spots [62][63]. However, the LAMPE micro-machining process is limited to micromachining material sheets.
4. The PLA micro-machining produces lateral features larger than the diffraction-limited spot size because of the formation of large melt-pool around the ablation region. However, as shown in section 3.4, the LAMPE micro-machining can produce lateral features as small as the diffraction-limited spot size. FIG. 2 shows the lateral feature size created using PLA and LAMPE micro-machining process. As can be seen, the minimum feature size produced in PLA micro-machining is 28 μm and in the LAMPE micro-machining process is 8 μm.
5. In the conventional laser micro-machining, the vaporized material creates a plasma above the ablation region. This plasma absorbs the laser beam, thereby reducing the energy available for vaporization and limits the achievable depth of micromachining. In contrast, no vapor plasma is formed in LAMPE micro-machining, and the aspect ratio is only limited by the Rayleigh length of the laser beam.

1.4 Lateral Feature Size in LAMPE Micromachining

The minimum achievable feature size depends upon the focused beam spot size and laser pulse duration. In a conventional pulsed ablation process, the material is removed through vaporization, resulting in large melt-pool, plasma plume, and thermal shock on the material lattice. As a result, the minimum feature size is much larger than the theoretical limit [64][65][66][62]. However, using the laser-assisted material phase-change and expulsion (LAMPE) micro-machining, feature size comparable to the theoretical limit can be achieved. Moreover, using LAMPE micromachining, much higher aspect ratio can be achieved than previously possible.

Figure 3:
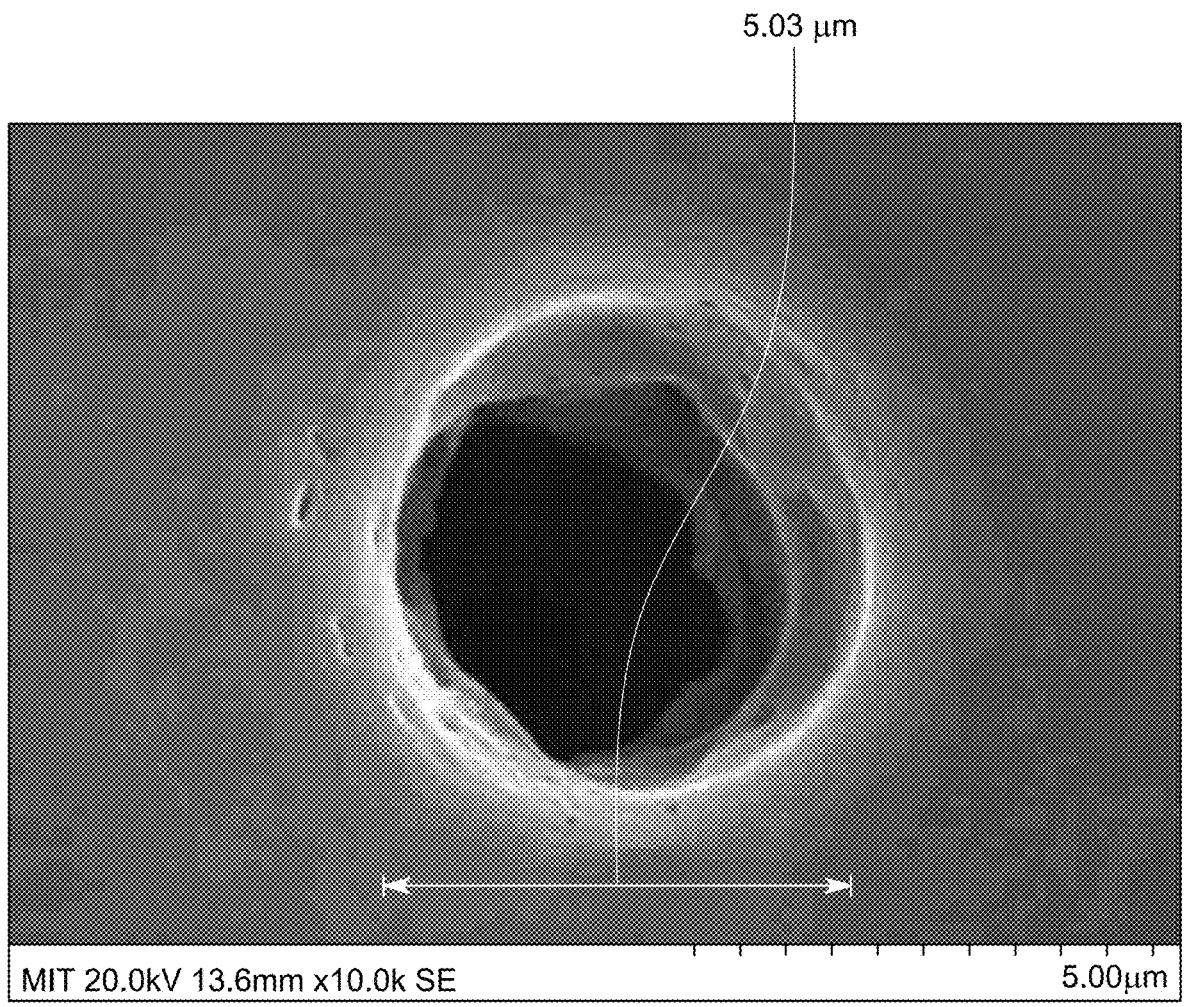
FIG. 3 shows a crater fabricated using LAMPE micromachining to demonstrate the minimum achievable feature size. The diameter of the hole is 5 µm.

FIG. 3 shows the minimum achievable feature size of 5 μm using LAMPE micromachining process when a 10 micrometer beam spot-size is used. This feature is created by irradiating a single pulse of laser with wavelength 532 nm and pulse duration 20 ns on a copper target. The pulse energy is 5.6 µJ, which is set by reducing the original pulse energy of 561 µJ to its 1% value using an external attenuator. The reflectivity of the copper target, R=0.47; therefore, the effective energy available for material processing is 3.2 µJ. The laser beam is focused using a microscope objective with numerical aperture NA=0.65. The focused beam spot diameter is 1 µm, giving the maximum intensity at the center of Gaussian distribution as $I_0$=71.5 GW/cm$^2$. Table 1 summarizes the laser conditions used for LAMPE micromachining process.

TABLE 1

Laser parameters for LAMPE micromachining.

| Laser Parameter | Value |
|---|---|
| Wavelength, λ | 532 nm |
| Average Power, $P_{avg}$ | 28 mW |
| Pulse Frequency, $F_p$ | 5 KHz |
| Pulse Duration, $\tau_1$ | 20 ns |
| Reflectivity of Copper, R | 0.43 |
| Pulse Energy, $E_p$ | 3.2 µJ |
| Peak Power, $P_{pk}$ | 280 W |
| Beam Spot size, $2\omega_0$ | 1 µm |
| Rayleigh Length, $Z_R$ | 1.5 µm |
| Maximum Intensity, $I_0$ of Focused Beam | 71.5 GW/cm$^2$ |

Figure 4A:
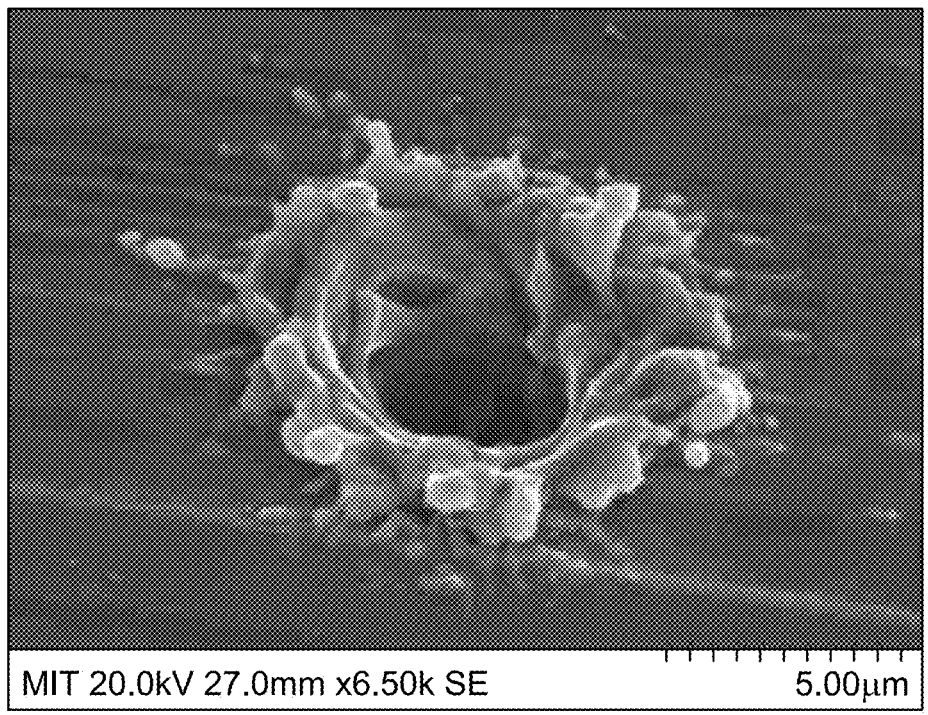
FIGS. 4A-4B show electro-deburring of LAMPE micromachined crater. (A) Before electro-deburring. (B) After electro-deburring.
Figure 4B:
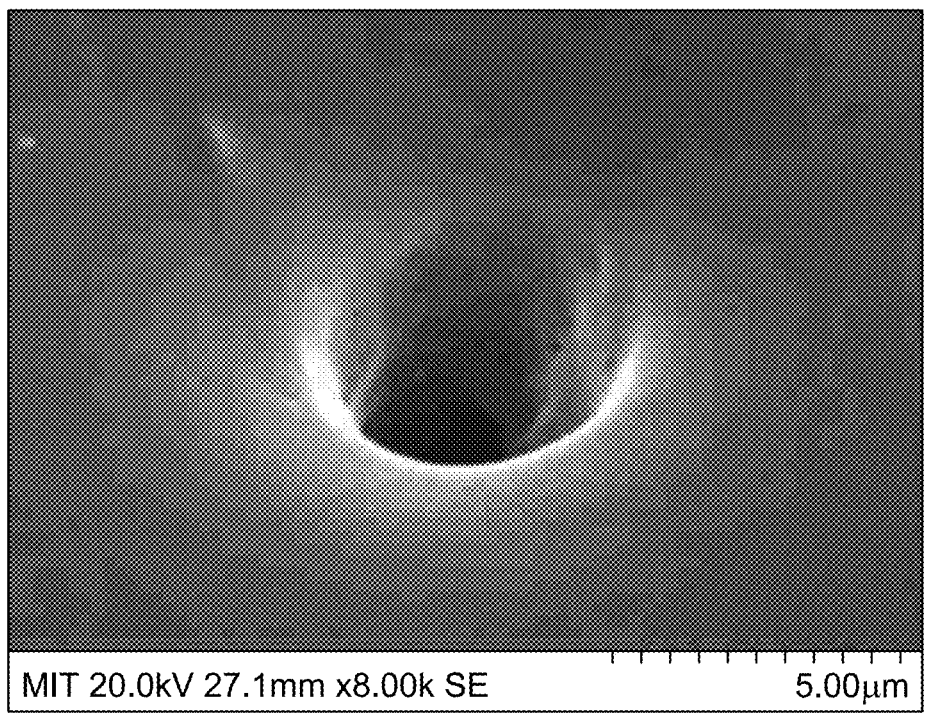

The small feature size is possible in the LAMPE micromachining because the laser is used to melt and expel the material, thereby eliminating the drawbacks of vaporization present in the pulsed ablation process. The expelled liquid metal re-solidifies at the rim of the hole and can be removed using an electro-deburring process developed in this work (section 1.5.1). FIGS. 3-4 shows the LAMPE fabricated hole before and after removing the re-solidified metal.

Figure 5A:
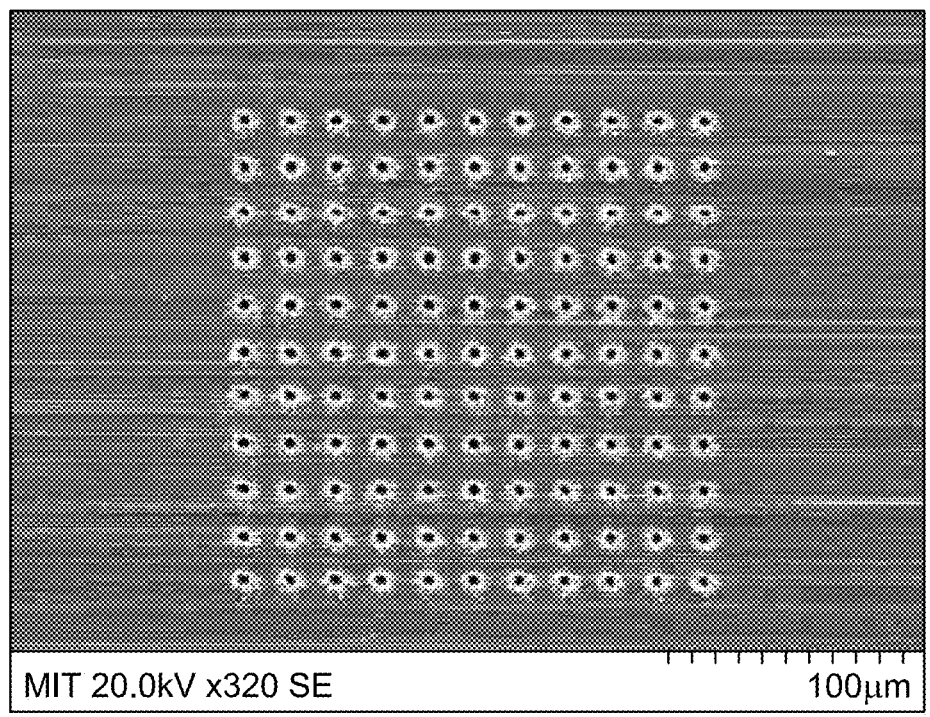
FIGS. 5A-5F show pulse exposure with varying pitch distance to confirm material melting & expulsion. (A) & (B) Pitch=20 µm, (C) & (D) Pitch=10 µm, and (E) & (F) Pitch=5 µm.
Figure 5B:
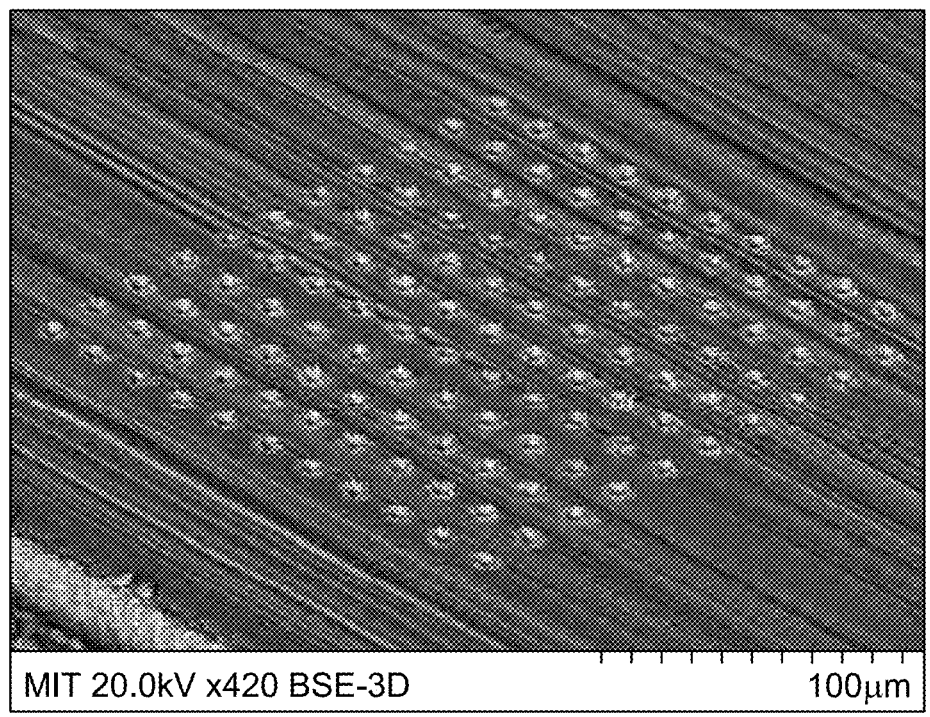
Figure 5C:
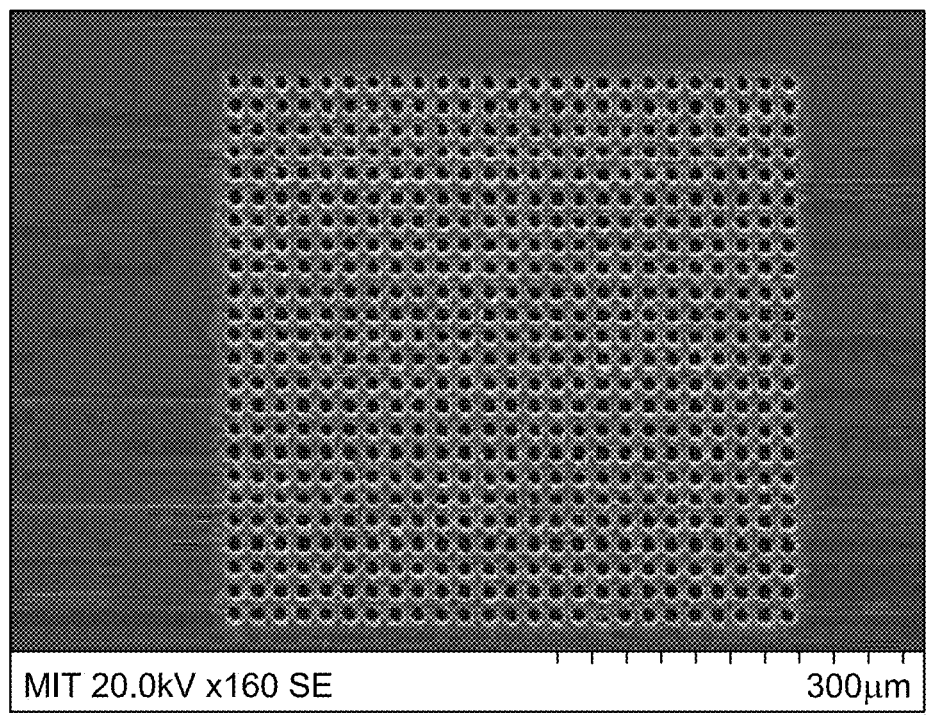
Figure 5D:
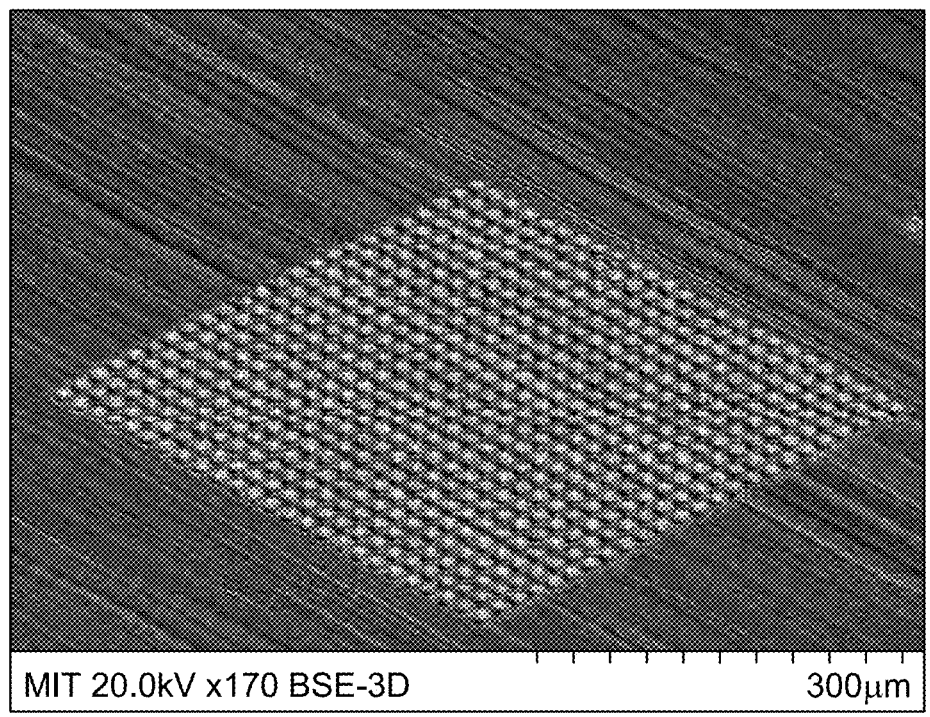
Figure 5E:
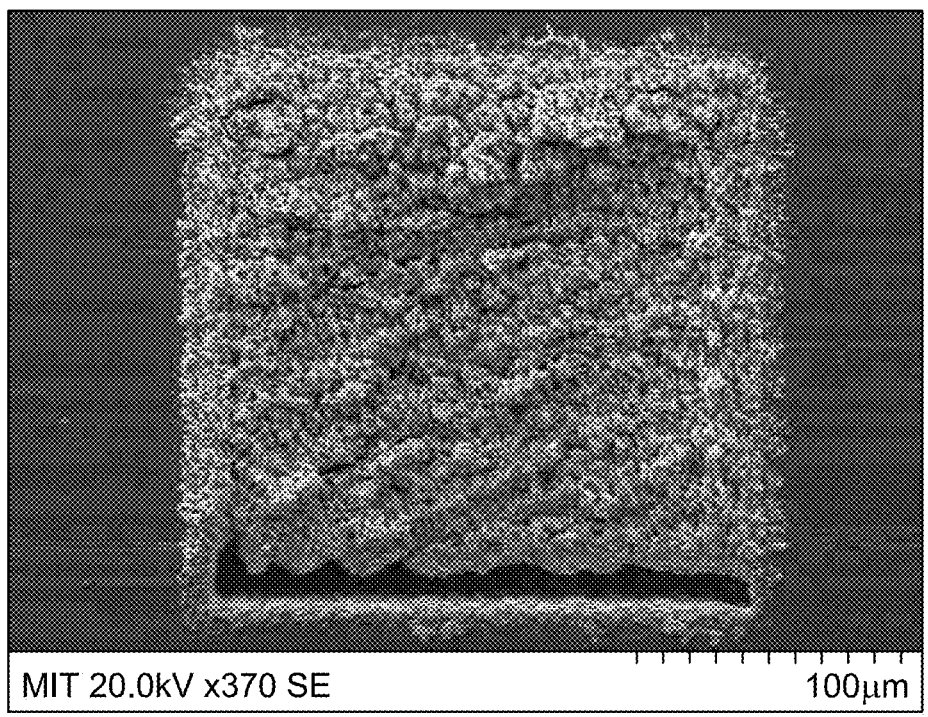
Figure 5F:
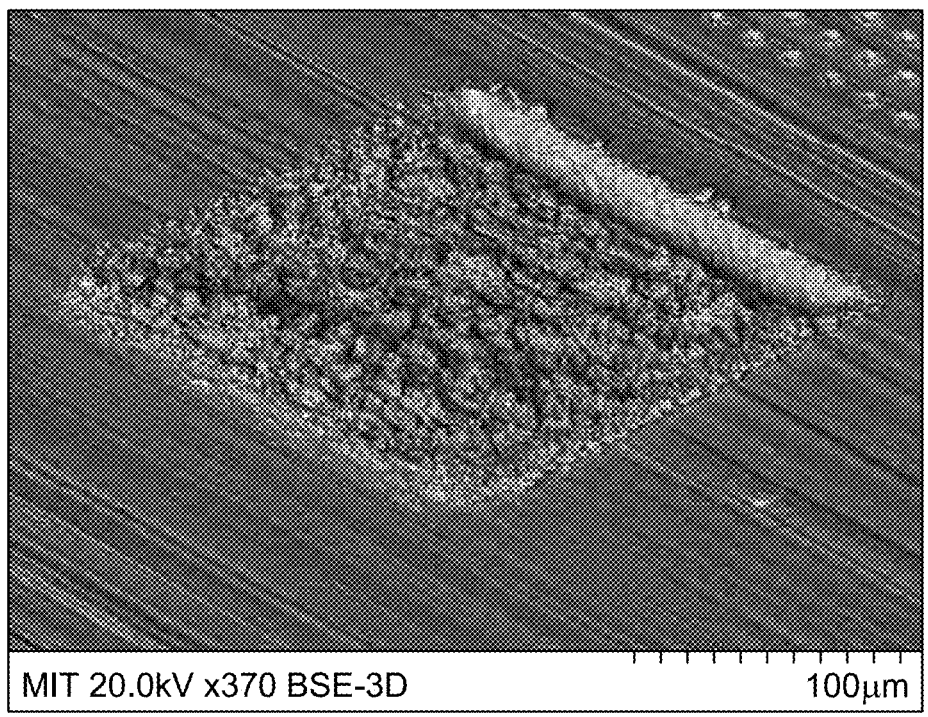

It should be noted that the material is largely melted (and only partially vaporized). This hypothesis can be validated empirically by performing a series of dot array machining with varying pitch distance. FIG. 5A-5F show the micromachined dot array at pitch distance of 20 µm, 10 µm, and 5 µm. In FIG. 5A, the machined dots are far apart, and the melted metal is forced to expel upward, creating a crater. As the dot patterns overlap, the pulsed laser ablation process involving vaporization to remove material results in a recess or 2.5D micromachining [63]. However, the LAMPE micromachining process results in re-solidified slag as shown in FIG. 5C. The slag is formed due to the mere shifting of the melted material and re-solidification when dots overlap. These findings confirm that in the LAMPE micromachining process, there is minimal vaporization, and micro-machining process is dominated by liquid-metal expulsion.

1.5 LAMPE High-Aspect-Ratio Micromachining

It was seen in the previous section that short laser pulses can be utilized to melt, partially evaporate, and expel the material. The analytical model, along with process development, can be used to empirically estimate the pulse duration and threshold pulse energy $E_{LAMPE}$ required for achieving laser-assisted melting and expulsion.

Figure 1B:
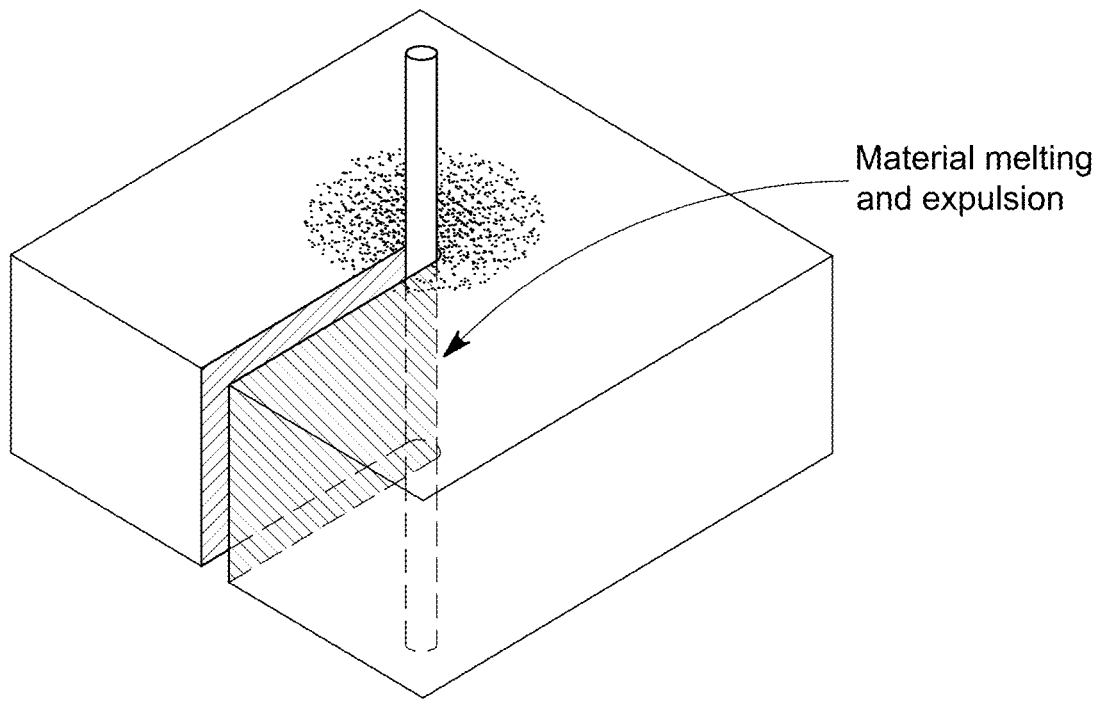
FIG. 1B is an image highlighting the melt region of the sheet. The melted material is expelled downwards.
Figure 7:
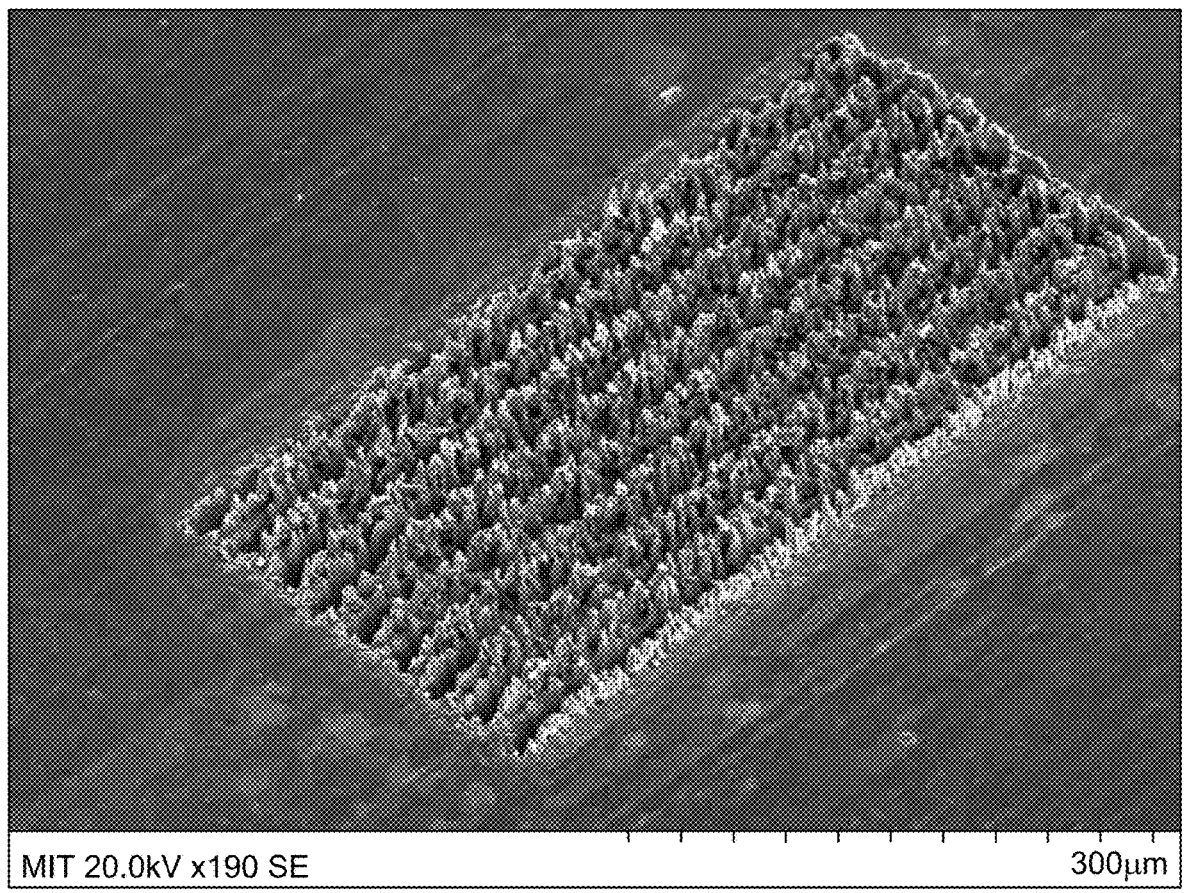
FIG. 7 shows a SEM image of the backside of the LAMPE micro-machined copper sheet showing re-solidified melt ejects.
Figure 8:
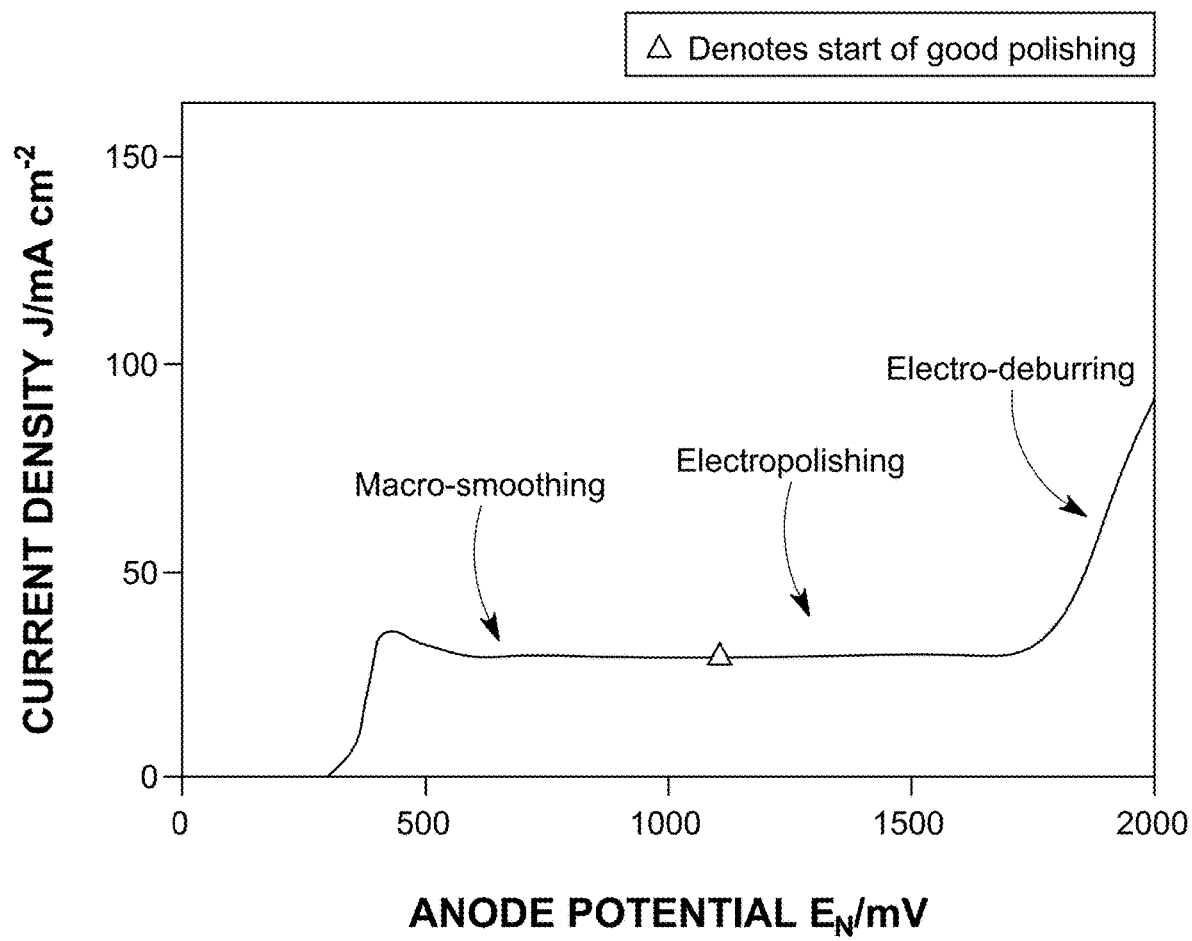
FIG. 8 is a prior art graph of the polarization curve of copper in phosphoric acid. It shows the region of the polarization curve that is used for the electro-deburring process.

FIGS. 1A-1B show the schematic diagram using the LAMPE micro-machining process to fabricate high aspect-ratio (HAR) structures. The high aspect ratio machining is achieved by using laser pulses to gradually melt the vertical face of the laminate (shown in FIG. 1B) and expel it downwards. The laser pulse energy is set to $E_{LAMPE}$ to ensure melting and expulsion, and no vaporization. The high aspect ratio (HAR) machining of metal sheet using LAMPE micro-machining process is similar to laser cutting of thick sheets of metals used at macro-scale. In the laser cutting of metals at macro-scale, the laser is used to melt the metal (and not vaporize), and a high-pressure air jet is used to expel the melted material. However, in the LAMPE micro-machining process, the metal is ejected by the pressure generated from the vapor bubbles formed at the laser-metal interface due to the partial vaporization of the material. The expelled material re-solidifies at the rear of the sheet, as shown in FIG. 7.

Figure 6A:
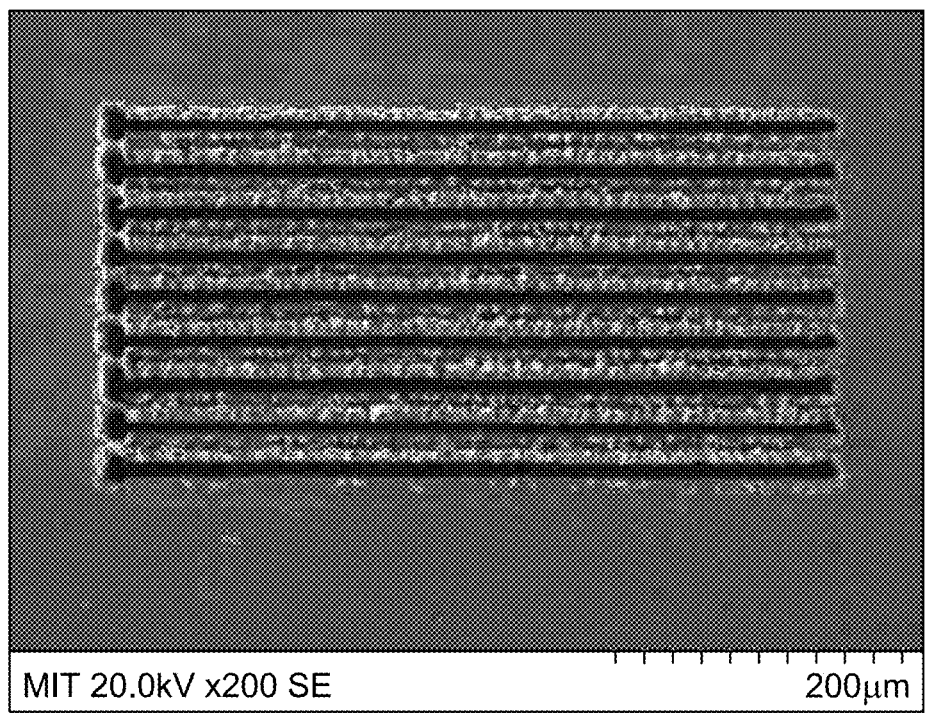
FIGS. 6A-6B show high-aspect-ratio microfabrication using LAMPE micromachining. (A) 10 µm wide micro-slits fabricated on 100 µm thick copper sheet using LAMPE micromachining. (B) Magnified image showing the dimension of the micro-slit.
Figure 6B:
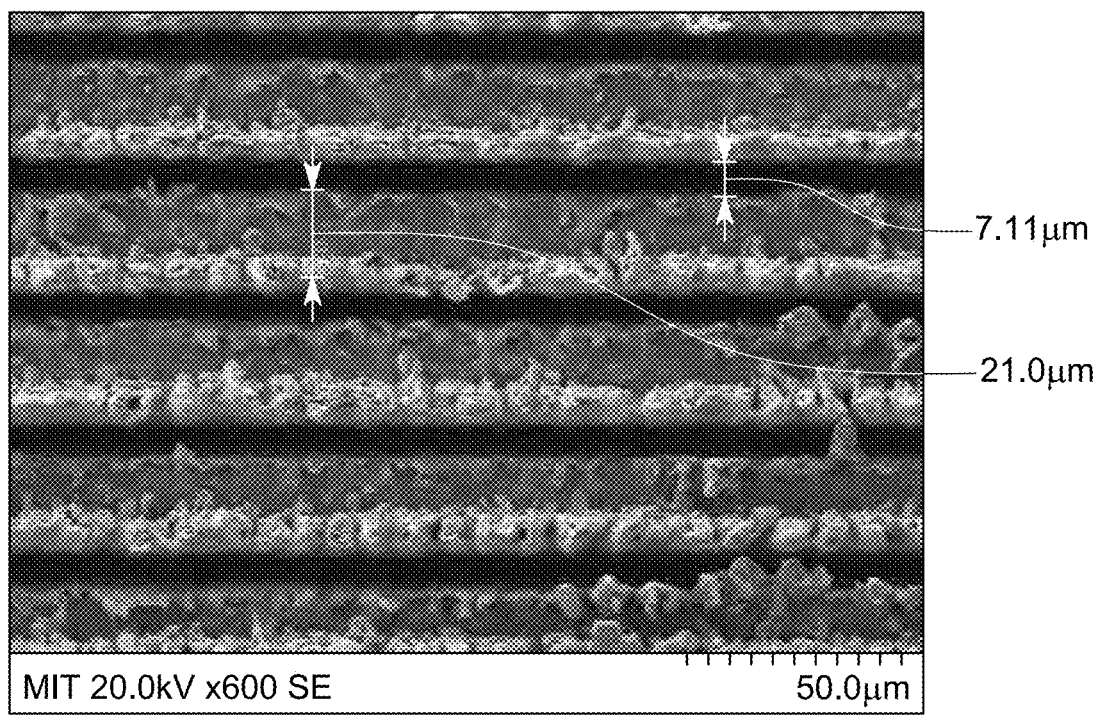

FIGS. 6A-6B show the 10 µm wide micro-slights fabricated using LAMPE micromachining on a 100 µm thick copper sheet. The high aspect ratio (HAR) structure is fabricated using the pulse energy of 56 µJ, which is set by reducing the original pulse energy of 561 µJ to its 10% value using an external attenuator. The reflectivity of the copper target, R=0.47; therefore, the effective energy available for material processing is 32 µJ. The laser beam is focused using a 100 mm focal length lens and the focused beam spot diameter is 12.98 µm. Table 2 summarizes the laser conditions used for the LAMPE micromachining process.

In the LAMPE micro-machining process, the expelled metal re-solidifies at the edges of the micro-machined part creating micro-burrs. FIG. 7 shows a SEM image of the backside of the LAMPE micro-machined copper sheet, displaying the micro-burrs. These micro-burrs must be removed from the laser micro-machined part to make them suitable for MEMS fabrication. The next section describes the developed electro-deburring process to remove these micro-burrs.

TABLE 2

Laser parameters for LAMPE micromachining high aspect ratio (HAR) features.

| Laser Parameter | Value |
|---|---|
| Wavelength, λ | 532 nm |
| Average Power, $P_{avg}$ | 280 mW |
| Pulse Frequency, $F_p$ | 5 KHz |
| Pulse Duration, $\tau_1$ | approx. 20 ns |
| Reflectivity of Copper, R | 0.43 |
| Pulse Energy, $E_p$ | 32 µJ |
| Peak Power, $P_{pk}$ | 2.8 kW |
| Beam Spot size, $2\omega_0$ | 12.98 µm |
| Rayleigh Length, $Z_R$ | 850 µm |

1.5.1 Electro-Deburring of LAMPE Micromachined Metal Layers

The LAMPE micro-machining process can create small lateral features with high aspect ratio. However, the micro-machined parts suffer from re-solidified micro-burrs. These burrs pose two difficulties in making MEMS. First, in a typical MEM system, microstructure parts are very close to each other (typically as close as 5 µm-10 µm), and often held at a different electric potential. For example, in an electrostatic comb-drive actuator, the comb fingers are kept close to each other to increase the electrostatic force of attraction and a bias voltage is applied between the fingers. The protruding burrs can create electric contact between these fingers. Second, the sharp metal protrusion can generate field-emitted electrons resulting in the dielectric breakdown of air, thereby causing damage to the MEM system [69].

Removing the burrs in MEMS microstructures is challenging due to two reasons. First, macro-scale deburring processes such as physical scrub and abrasive jet cannot be utilized for MEMS structures due to their small size and delicate nature. Second, at macro-scale, etching process can etch the burrs without significantly affecting the dimensions of the parts. However, in MEMS parts, the burrs and the features are of the same order, and these methods result in significant etching of the parts.

The burrs produced in the LAMPE micromachining process have two interesting properties; first, these burrs have sharp features and large surface area, and second, they are located at the edges of the micro-machined parts. These properties of the burr is utilized to develop a novel process, called electro-deburring, to selectively remove burrs. The electro-deburring process consists of an electro-chemical cell with anode as the LAMPE or laser micromachined part and also a cathode. When a voltage is applied, a current flows in the cell due to the migration of ions from anode to the cathode. The current density is higher near the burrs due to two reasons: first, the burrs have sharp features, and second, they are located at the edges where the current density is higher. As a result, the electric field and the available mass transport rates are high at the burrs, resulting in a high etch rate. When the cell voltage is increased beyond the electro-polishing voltage, the etch rate at the burr increases significantly; however, the etch rate at the other area remains the same due to saturation in the etch rate. Using this phenomenon, the burrs can be selectively etched without significantly affecting the dimensions of the microparts.

Figure 9A:
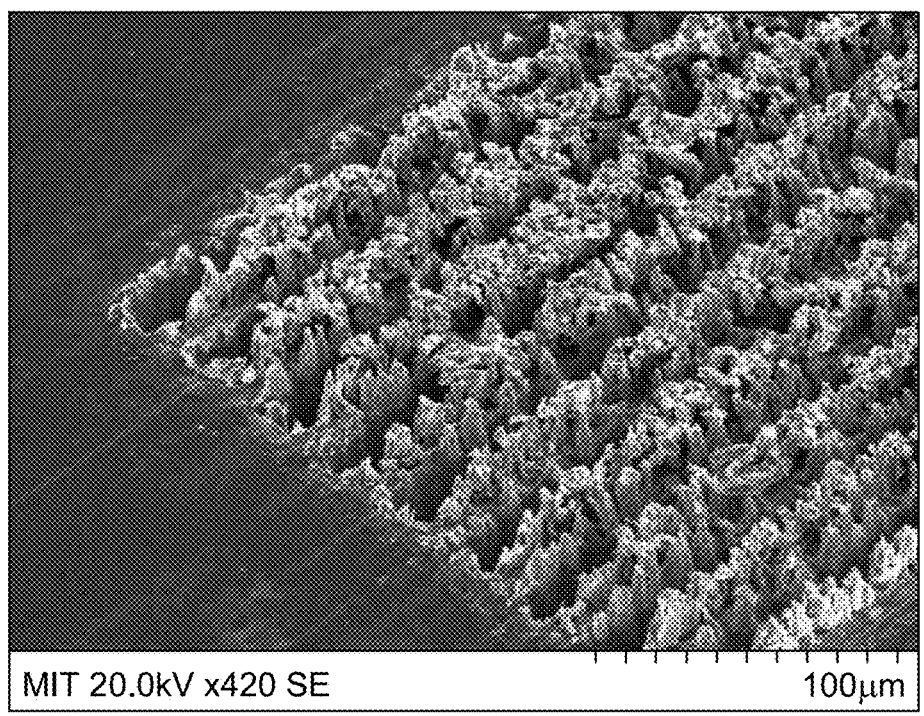
FIGS. 9A-9B show electro-deburring of LAMPE micromachined parts to remove micro burrs. (A) Before electro-deburring. (B) After electro-deburring.
Figure 9B:
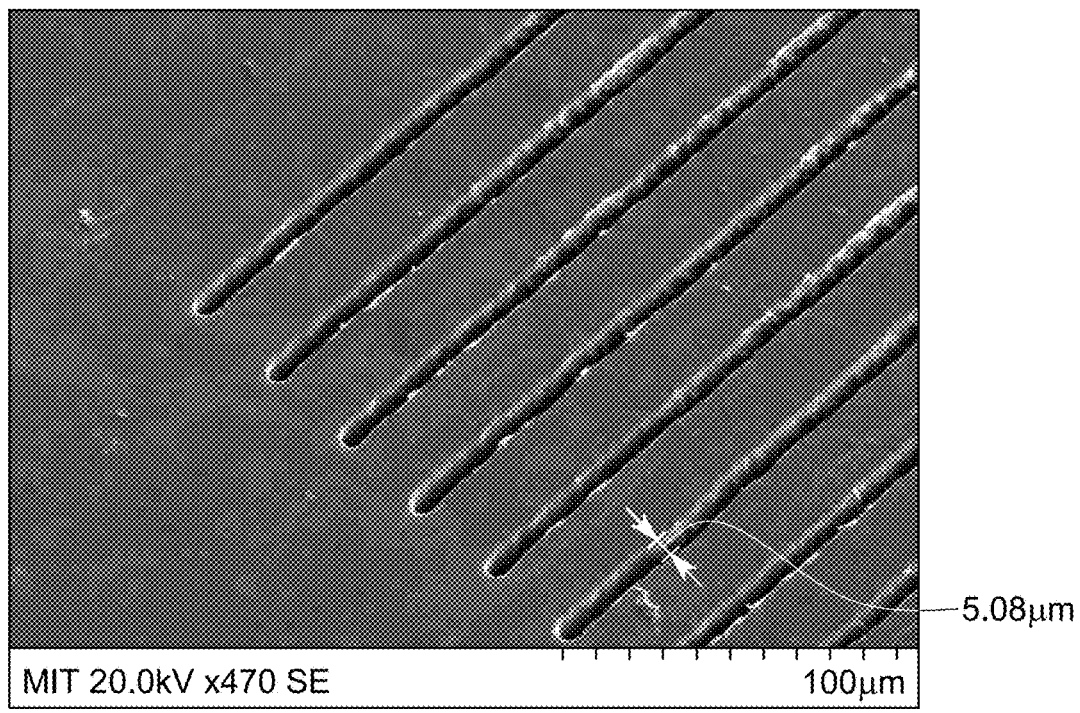
Figure 10A:
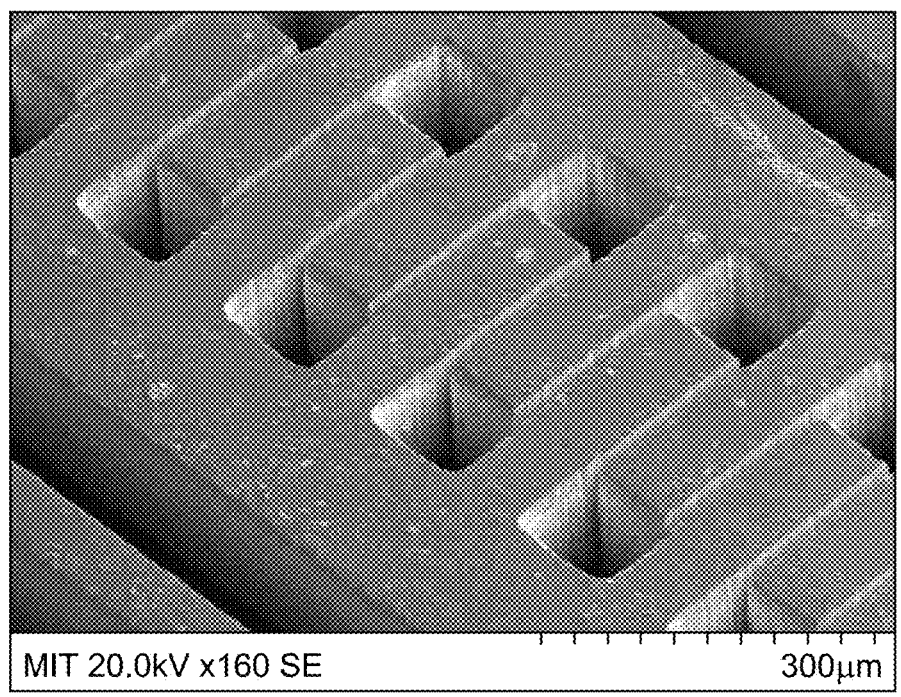
FIGS. 10A-10B High aspect ratio interdigitated fingers fabricated using the LAMPE micro-machining—(A) Low-magnification image showing the interdigitated fingers. (B) Magnified image of the fingers showing 10:1 aspect ratio. The lateral feature size is 10 µm.
Figure 10B:
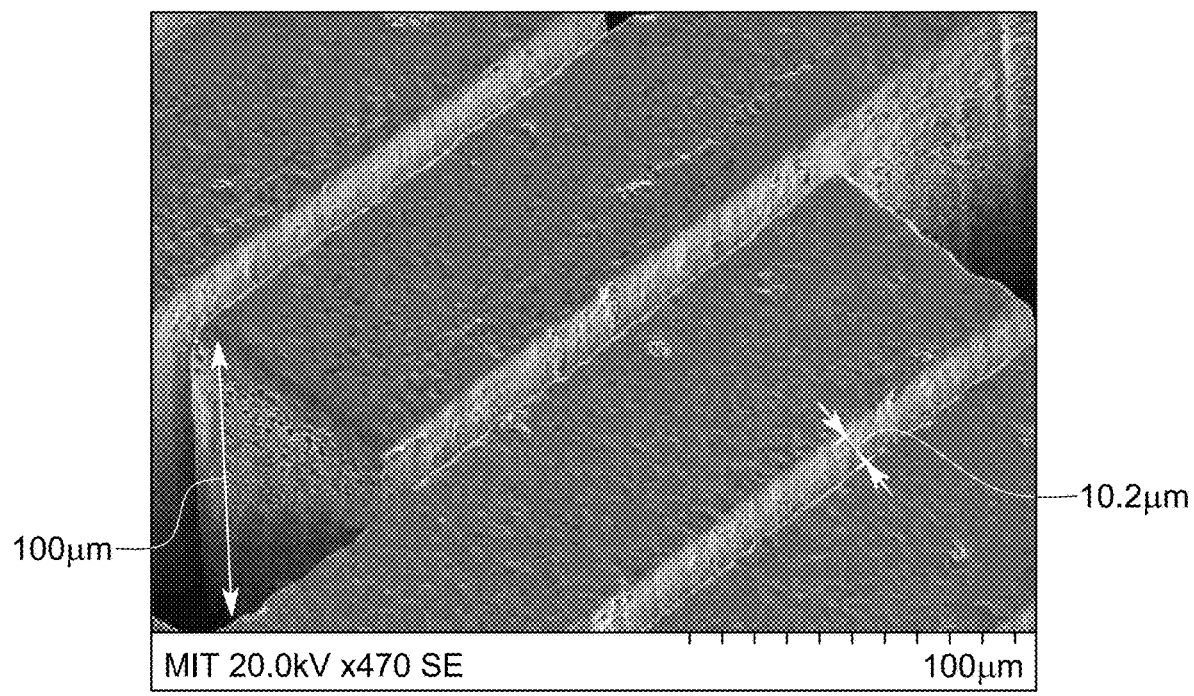

FIGS. 9A-9B show performing electro-deburring of copper in 14M phosphoric acid at 5V for 30 seconds. For certain application, electro-deburring can be followed by electroplating of gold to avoid surface oxidation. FIG. 3-11 shows the high aspect ratio interdigitated fingers fabricated using the LAMPE micromachining. Such small features and high aspect ratio were previously achievable only using deep reactive ion etching (DRIE). It must be noted that for MEMS that does not require small lateral-features and high aspect ratio, traditional pulsed laser ablation (PLA) micromachining in conjunction with the electro-deburring process can be used for MALL MEMS fabrication.

1.6 LAMPE Micromachining of Silicon

Figure 11A:
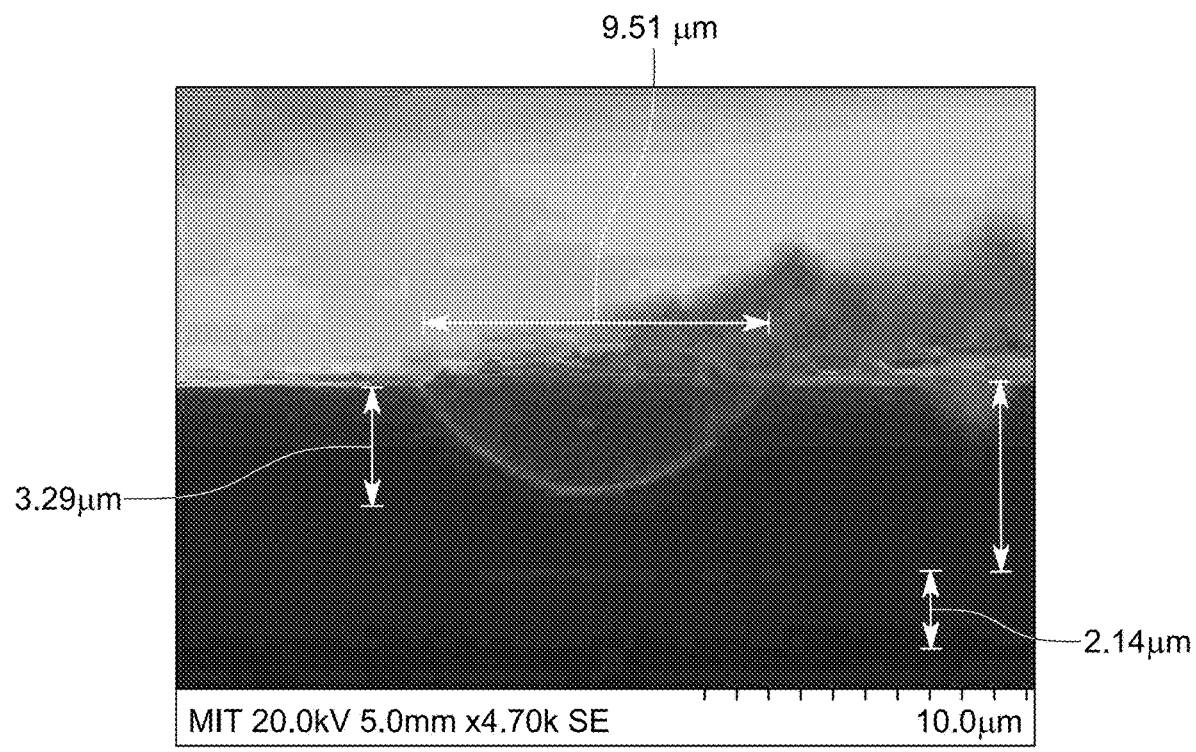
FIGS. 11A-11B show pulsed laser ablation (PLA) of silicon using 20 ns long laser pulses. (A) Ablation profile created by a 5.6 µJ pulse. The diameter of the crater is 9.51 µm and it is 3.29 µm deep. (B) Ablation profile created by a 56 µJ pulse. The diameter of the crater is 18.6 µm and the depth is 6.8 µm.
Figure 11B:
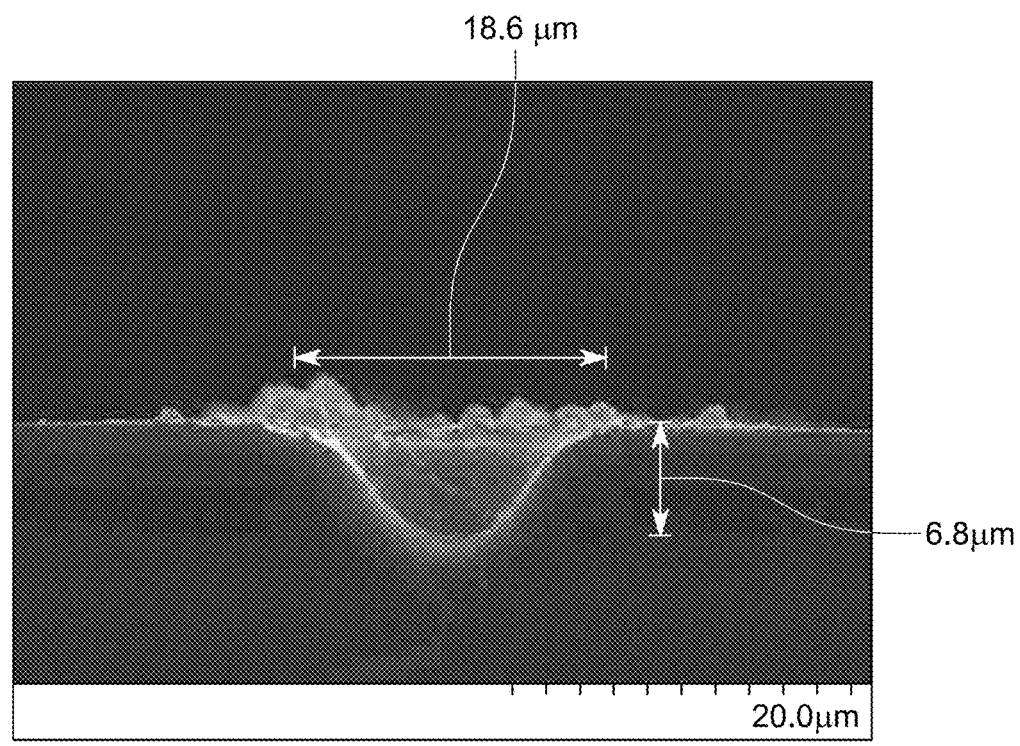

Silicon is widely used as a mechanical material for fabricating MEM systems [71]. Conventionally, deep reactive ion etching (DRIE) of silicon is used to fabricate MEMS [72]. However, DRIE tools are expensive and require expensive etching gases. The LAMPE micro-machining process is an attractive alternative for manufacturing high aspect ratio (HAR) microstructure silicon laminates. FIGS. 11A-11B show pulsed laser ablation of silicon. Moreover, these LAMPE micro-machined silicon laminates in conjunction with the MALL process, can be used to make MEM systems.

In the LAMPE process, the silicon is first converted into silicon oxide using laser (i.e. induce phase-change), and next, the granular silicon oxide is expelled from the rear of the wafer using the pressure generated from vapor bubbles formed at the laser-silicon interface due to partial vaporization of silicon.

Figure 12:
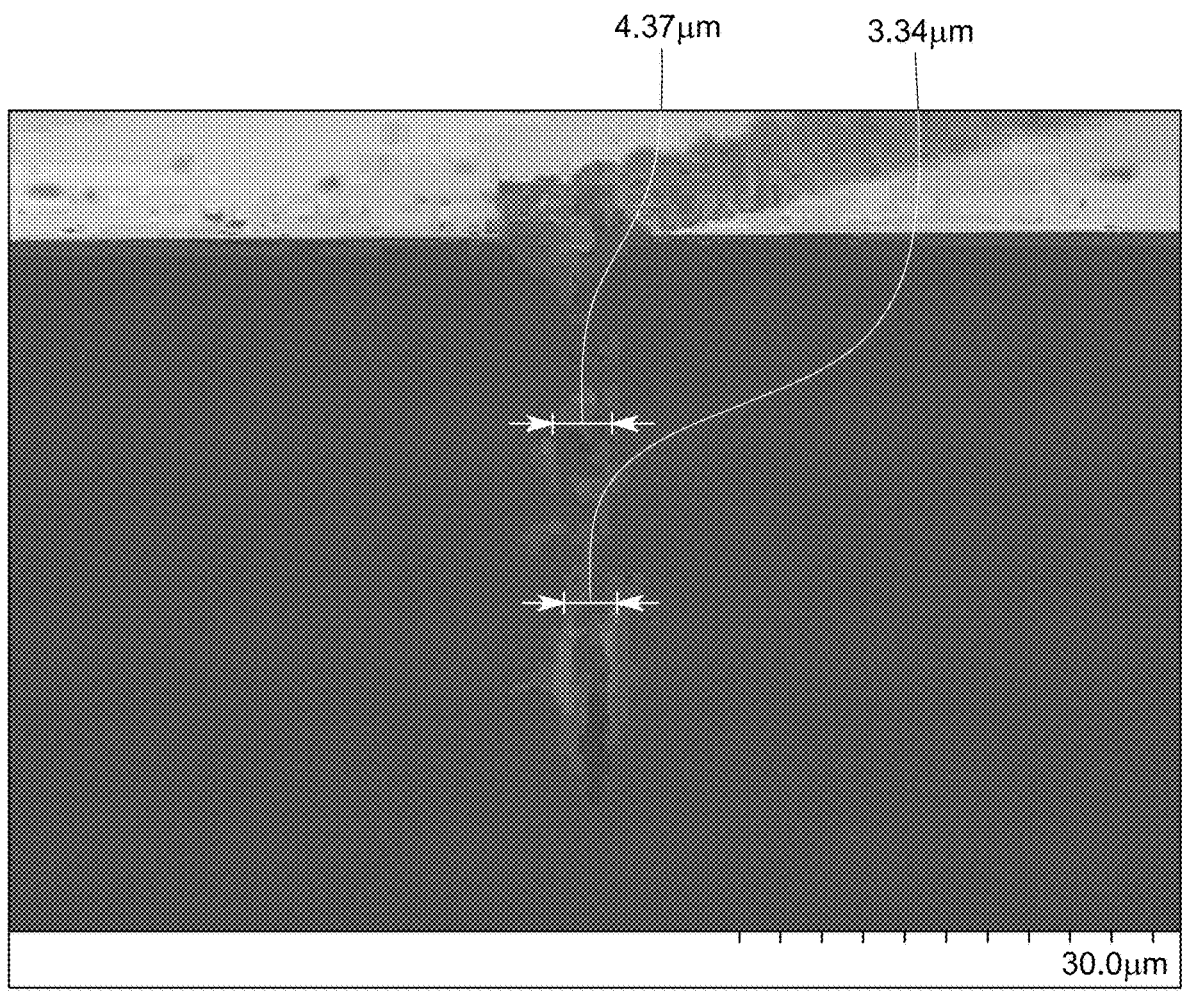
FIG. 12 shows the cross-section image showing laser assisted oxidation of silicon. As can be seen, the laser assisted oxidation can significantly increase the effective optical penetration depth.
Figure 13:
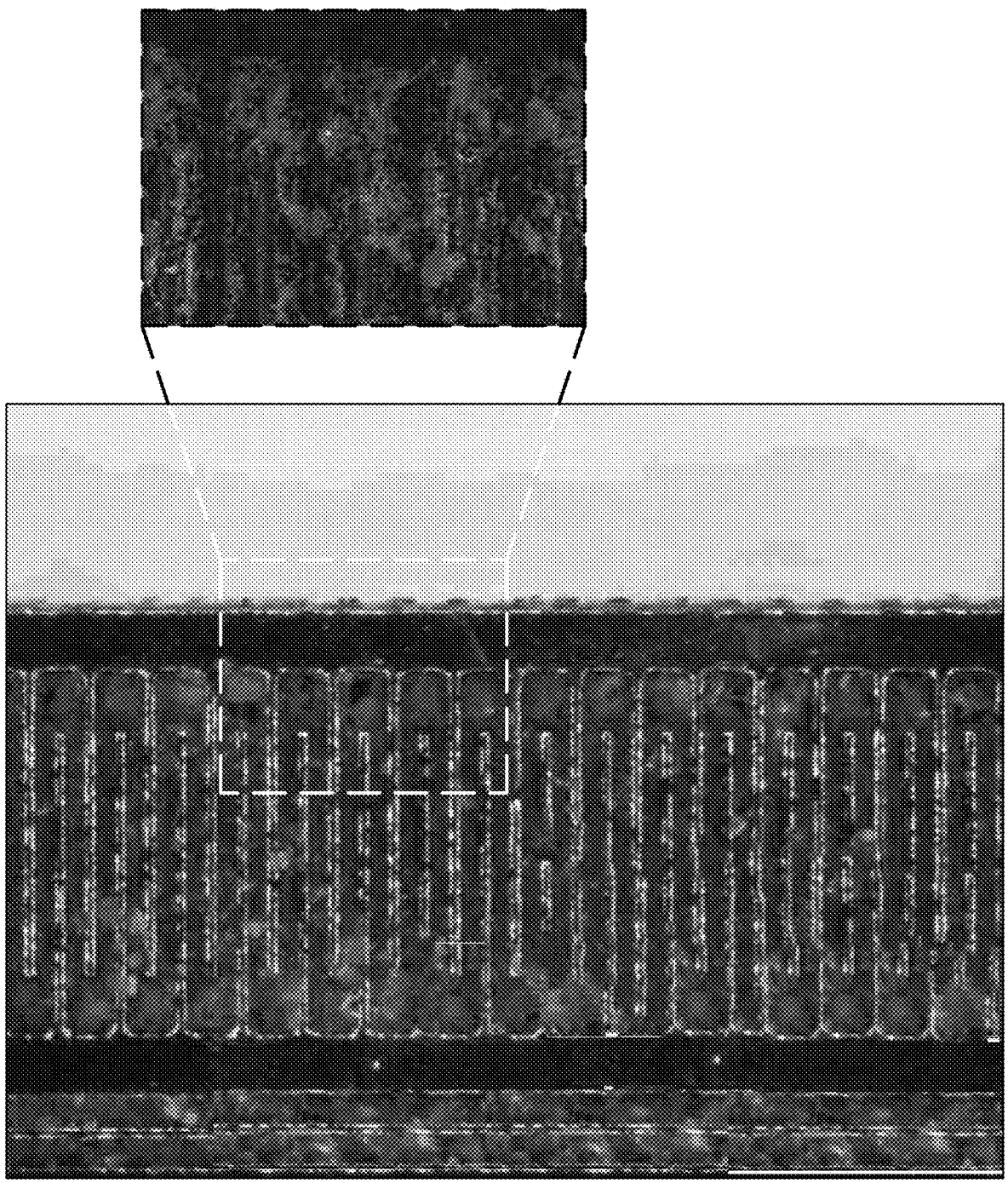
FIG. 13 shows the optical microscope image confirming the oxidized silicon. The energy dispersive x-ray spectroscopy (EDS) image shown in the inset further confirms the present of silicon oxide. The lighter-shaded region in the magnification box is silicon oxide, the rest is silicon.

When silicon is irradiated with low power laser in the oxygen environment, it converts to silicon oxide without resulting in any ablation. The absorption coefficient of $SiO_2$ is $\alpha<1$ cm$^{-1}$ [55]; therefore, the optical penetration depth is $1_\alpha > 1$ cm. Since the absorption coefficient of silicon oxide is low, the newly formed silicon oxide transmits the large percentage of the laser energy, which further oxidizes the silicon beneath. In this manner, a high aspect ratio structure much longer than the optical penetration depth of silicon can be oxidized. FIG. 12 shows the laser-assisted oxidation of silicon. As can be seen, the oxidation length far exceeds the optical penetration depth. The oxidation of the silicon can be verified by using an optical microscope and energy-dispersive x-ray spectroscopy (EDS) image as shown in FIG. 13.

The successive oxidation of silicon takes place until the bottom of the wafer is reached. The oxidized silicon is in granular form and loosely bound to the silicon wafer. As a result, the small recoil pressure generated by partially vaporized silicon is sufficient to expel the granular silicon oxide from the bottom of the wafer, resulting in micromachining.

The maximum achievable aspect ratio is limited by two factors. First, the oxidized silicon exists in granular form and the effective absorption coefficient of granular oxide is larger than bulk silicon oxide due to light scattering. Second, the silicon oxide is expelled only when the oxidation is reached to the bottom of the wafer. As a result, for thick wafers, the attenuation could be significant to stop oxidation before the rear of the wafer is reached, thereby resulting in no micromachining. The aspect ratio in LAMPE micromachining could be further increased by performing the micromachining in HF vapor. The HF vapor can facilitate the selective removal of silicon oxide by forming gaseous $SiF_4$.

Figure 14A:
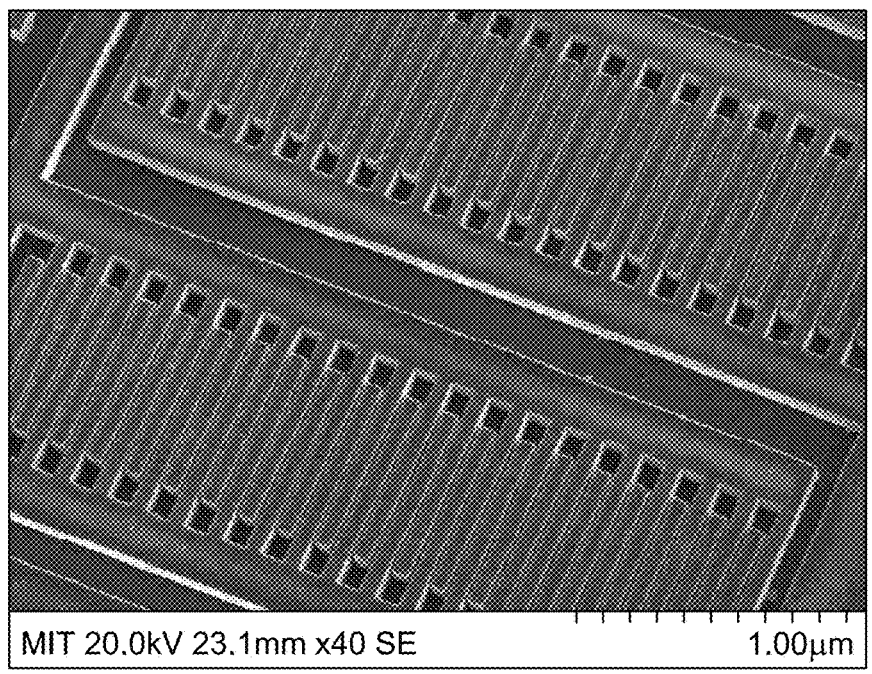
FIGS. 14A-14B show examples of high-aspect-ratio microstructures fabricated using LAMPE micromachining of silicon. (A) Low-magnification image showing fabricated interdigitated finger structures. (B) High-magnification image showing the distance between the fingers.
Figure 14B:
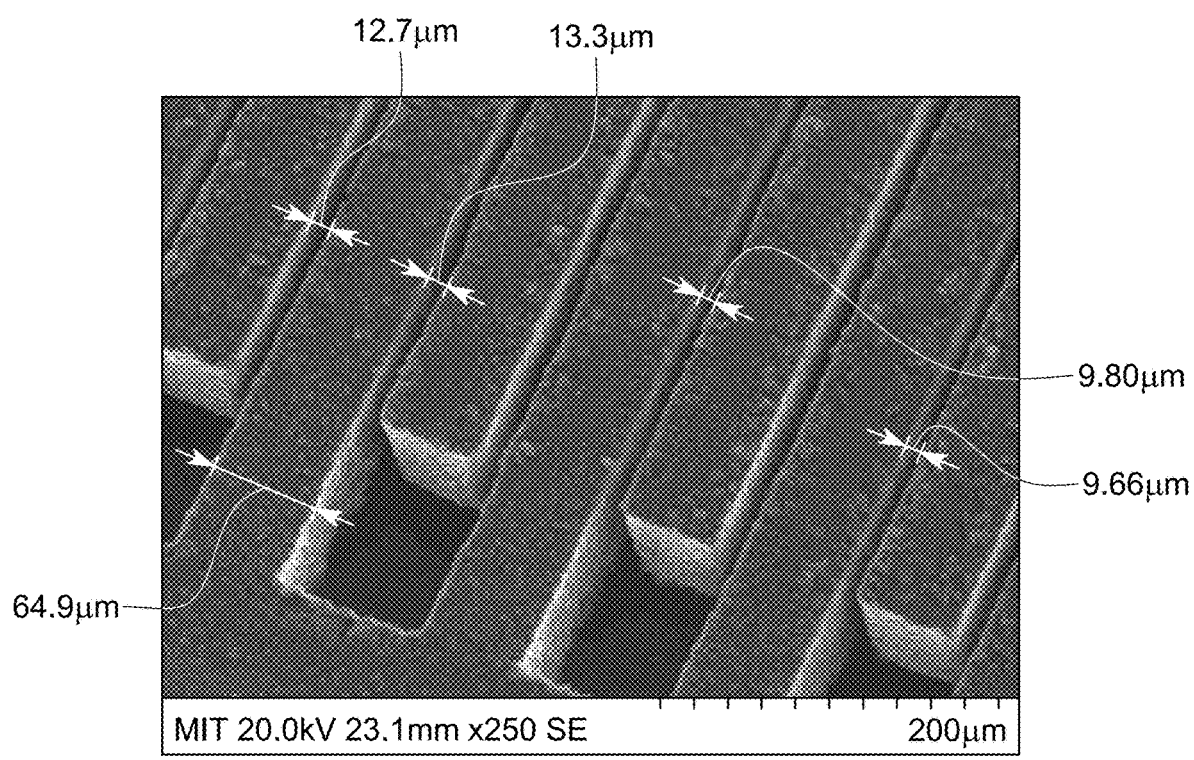
Figure 15A:
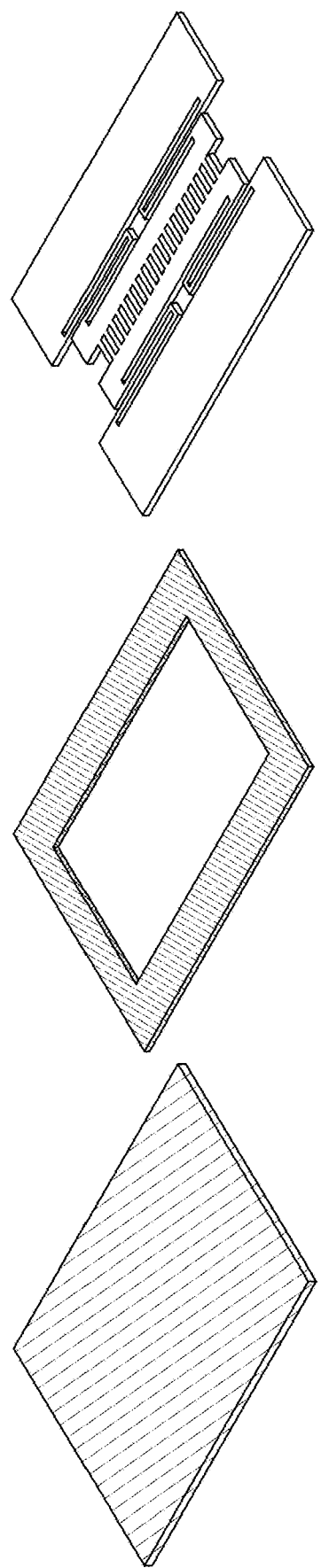
FIGS. 15A-15B and FIG. 16 show a schematic diagram of multi-lamina assembly.
Figure 15B:
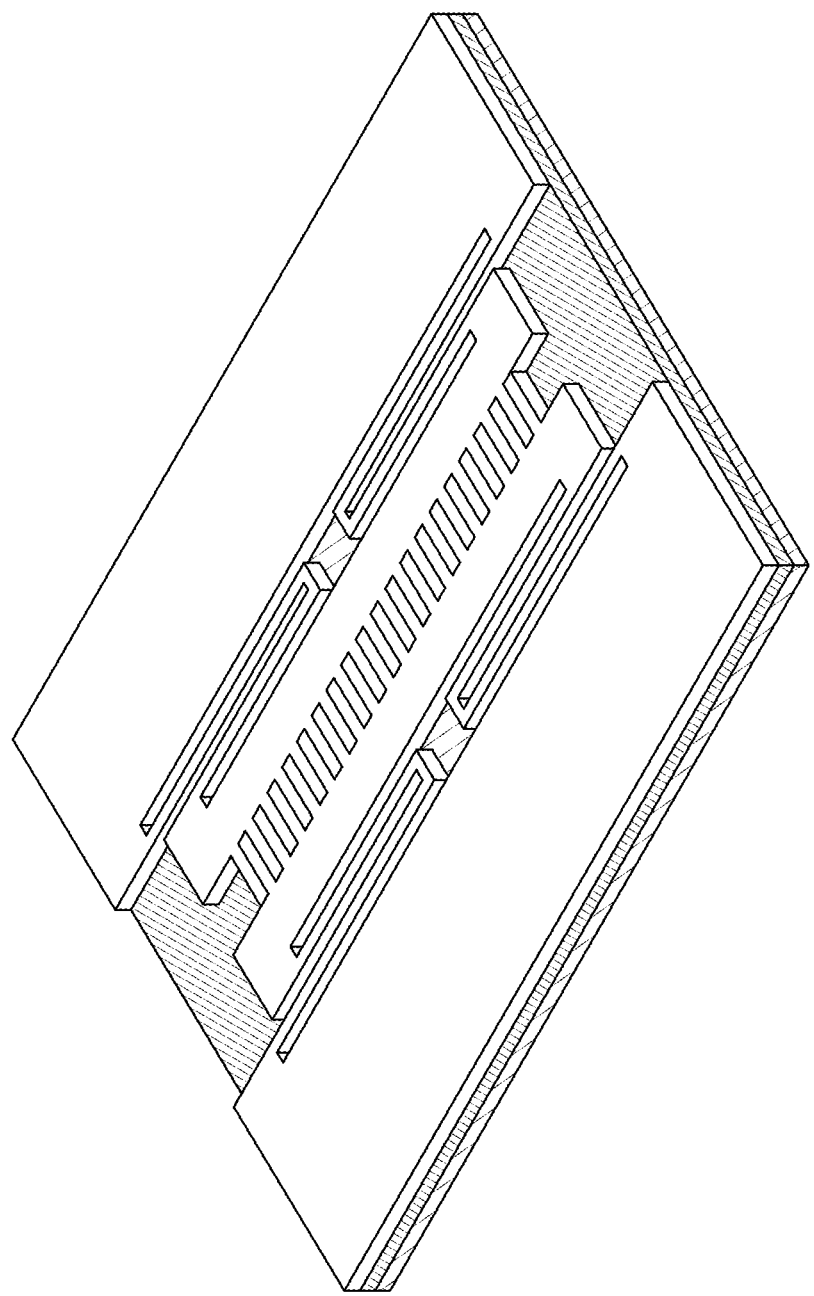

FIGS. 14A-14B show examples of high-aspect-ratio microstructures fabricated using LAMPE micromachining of silicon. (A) Low-magnification image showing fabricated interdigitated finger structures. (B) High-magnification image showing the distance between the fingers 2 MALL MEMS Fabrication We disclose a novel approach to fabricate MEMS using multi-lamina assembly of laser-micro-machined laminates (MALL). FIGS. 15A-15B show schematic diagram of the MALL fabrication process. The process includes two steps. First, the individual layers of the MEMS are fabricated using laser micromachining. Second, these layers are stack assembled and bonded to construct the MEM systems. The previous section described fabricating microstructure layers using the LAMPE micromachining process. This section describes the multi-lamina assembly and bonding of these microstructure layers to fabricate MEMS.

Figure 16:
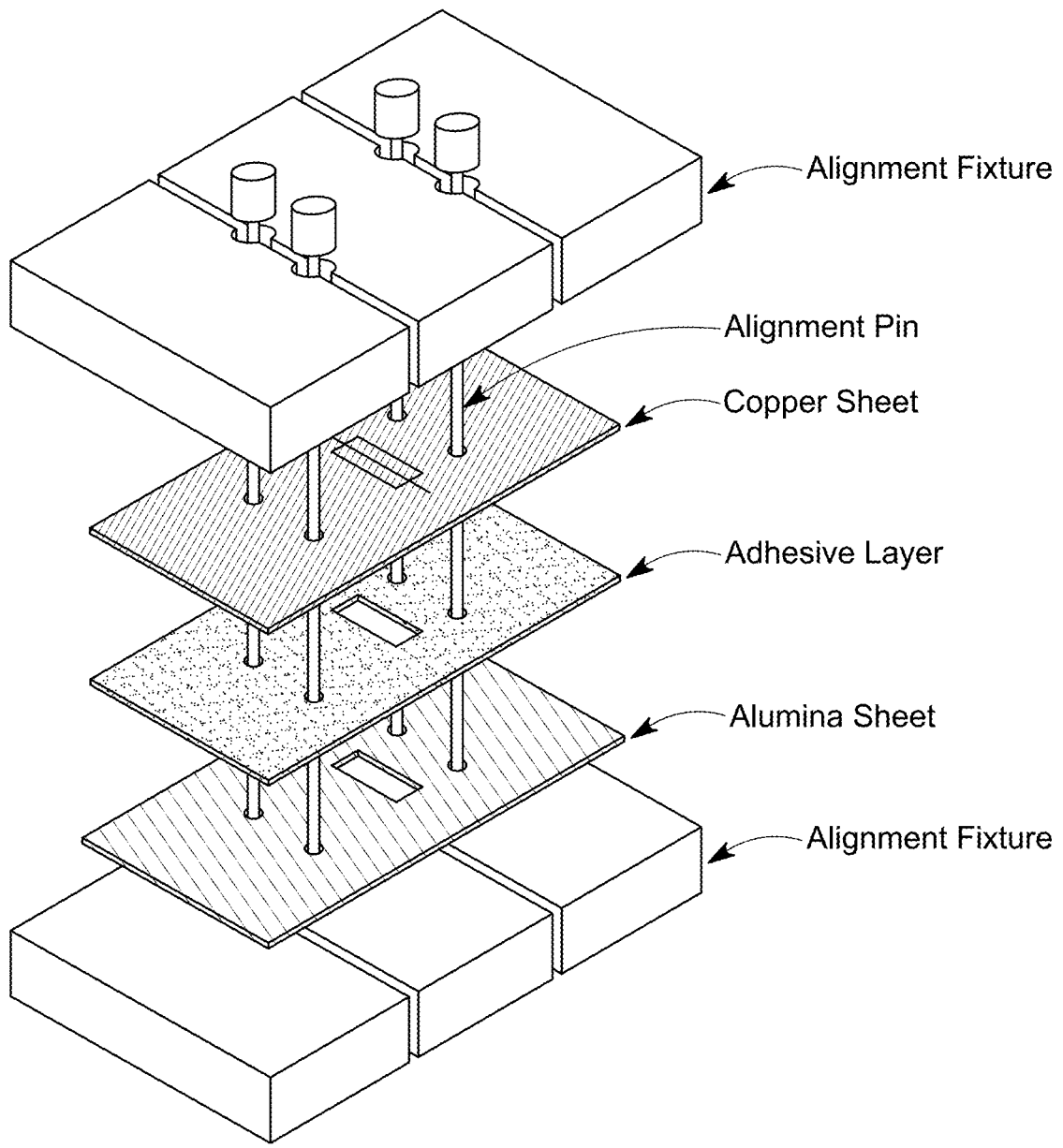

Mechanical alignment of laminates using dowel pins and alignment holes is widely used in precision macro-fabrication, and employed to align and bond microstructure laminates. FIG. 16 shows a schematic diagram of the alignment-pin and alignment-hole assembly process. Using this method, alignment accuracy exceeding 2.5 μm is demonstrated. The multi-lamina assembly process is described in section 4-1

2.1 MALL Fabrication of Comb-Drive Actuator

To demonstrate the application of MALL in fabricating MEMS devices, fabrication of a comb-drive actuator is presented. The comb-drive actuator is fabricated using copper as a structural material. The comb-drive actuator is selected because the interdigitated comb finger structure is an essential building block in many MEM systems such as optical shutters [21], micro-grippers [83], micro-engines [84], accelerometer [22], resonators [23], and electromechanical filters [24]. The ability to fabricate interdigitated comb finger structures using copper can significantly reduce the cost of these MEM systems. Moreover, fabricating comb fingers is challenging because it requires high aspect ratio structures with small lateral features. Previously, comb fingers with comparable features and aspect ratio could be fabricated from silicon alone using the lithography-based deep reactive ion etching (DRIE) process [28]. However, the process of the present invention can fabricate these structures from metal using the LAMPE micromachining process.

2.1.1 Comb-Drive Actuator Design

Figure 17A:
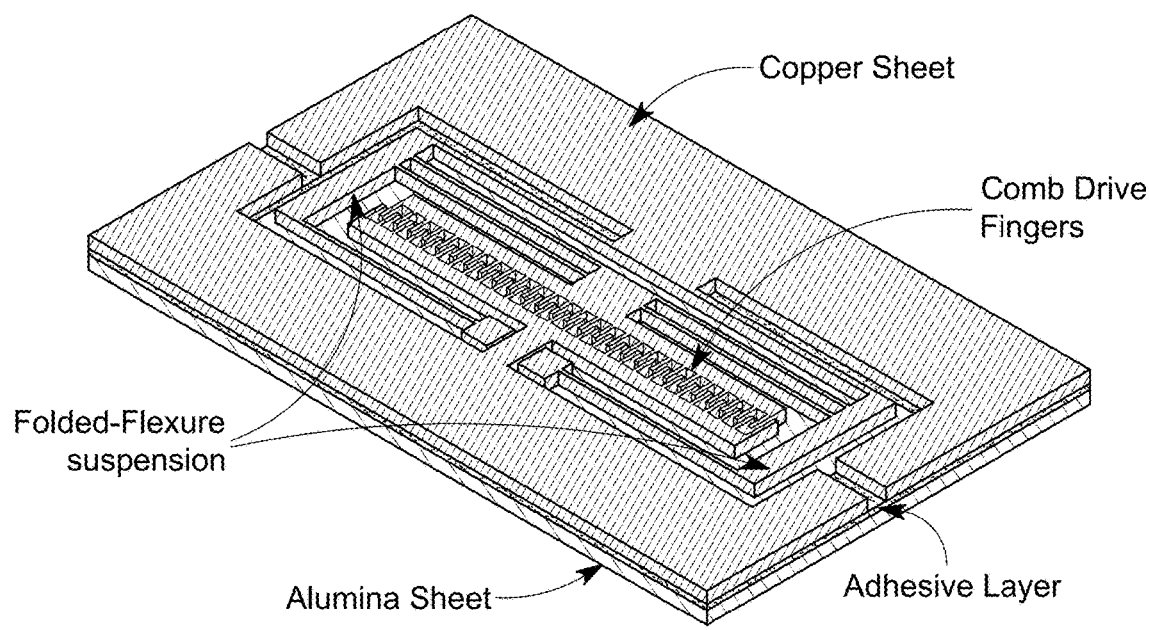
FIGS. 17A-17B show a schematic diagram of the comb-drive actuator. showing design parameters.
Figure 17B:
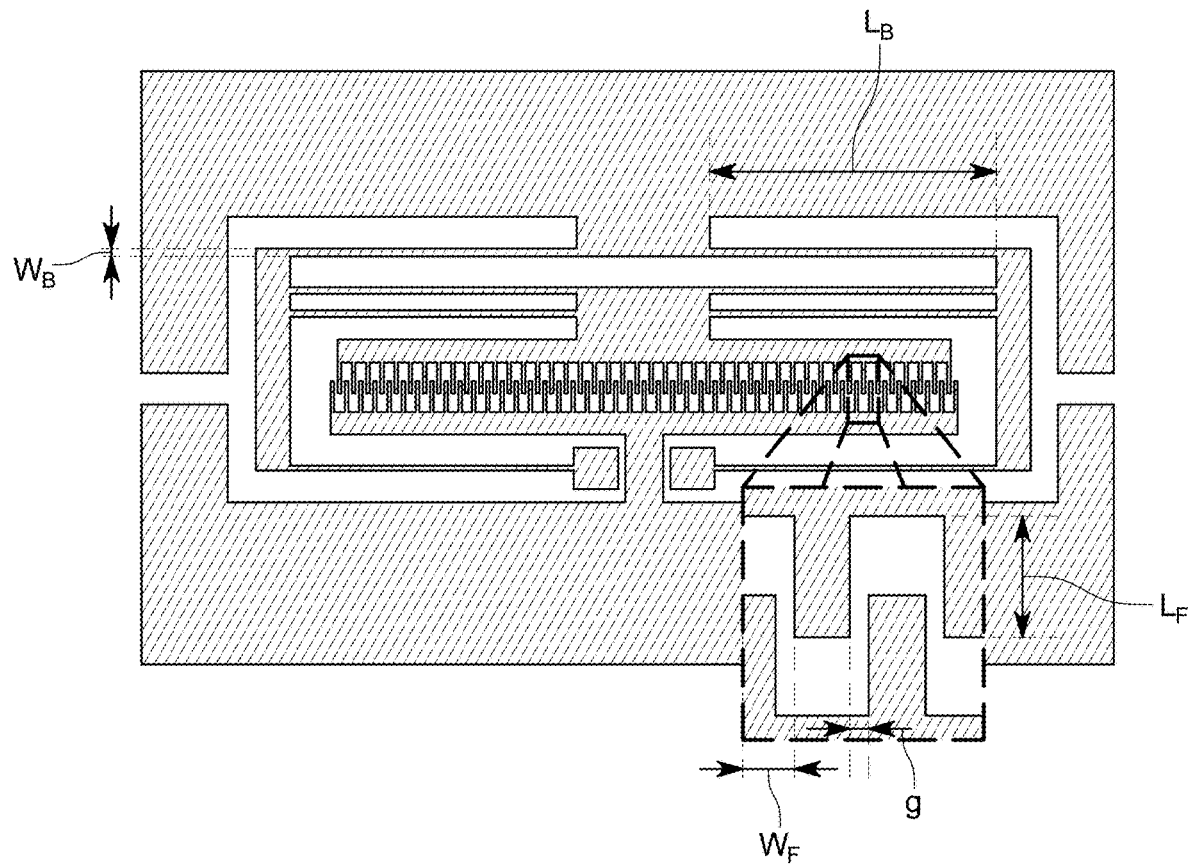
Figure 18A:
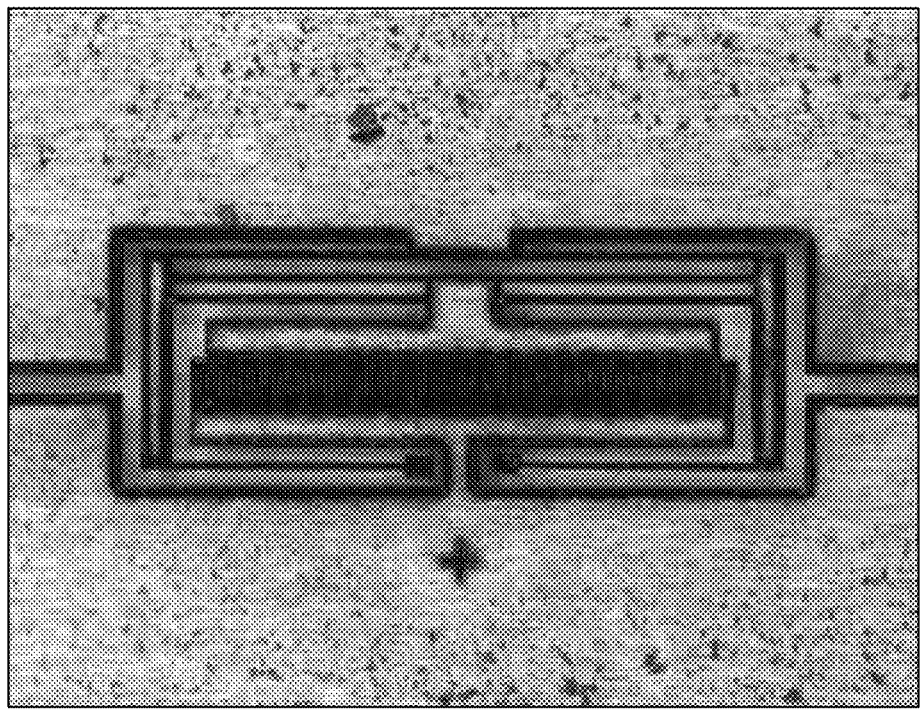
FIGS. 18A-18B show fabrication of comb-drive device layer using LAMPE micromachining of copper: (A) Optical microscope image showing micro-burrs present in LAMPE micro-machined part. (B) Magnified image showing micro-burrs present between the fingers. These burrs result in short circuits between the two sets of fingers.
Figure 18B:
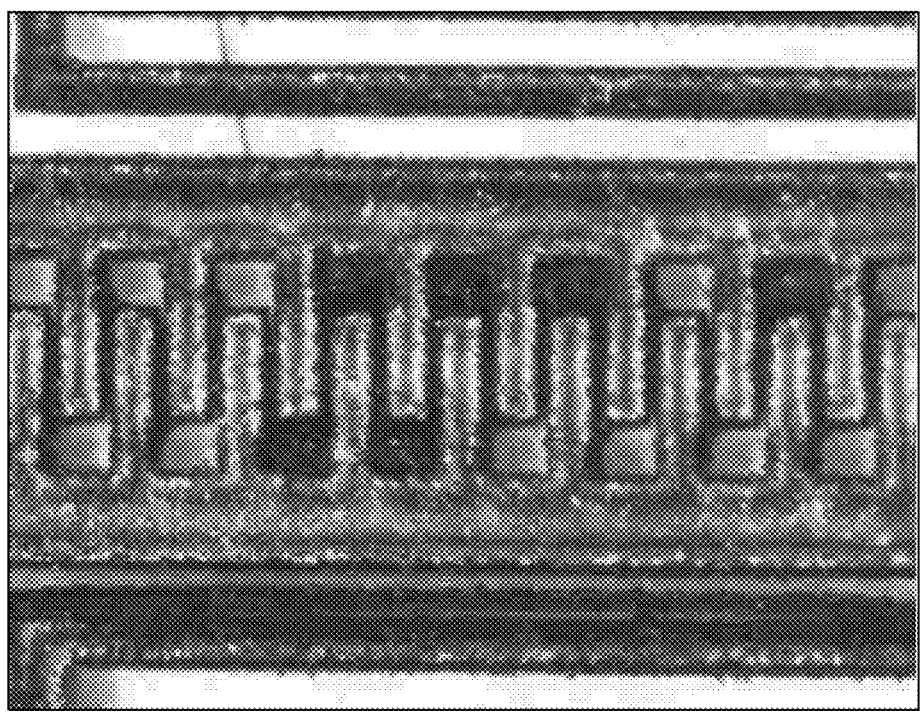

FIGS. 17A-17B show the design of a comb-drive actuator. FIGS. 18A-18B show fabrication of the comb-drive device layer.

2.1.2 Comb-Drive Actuator Fabrication

Figure 19A:
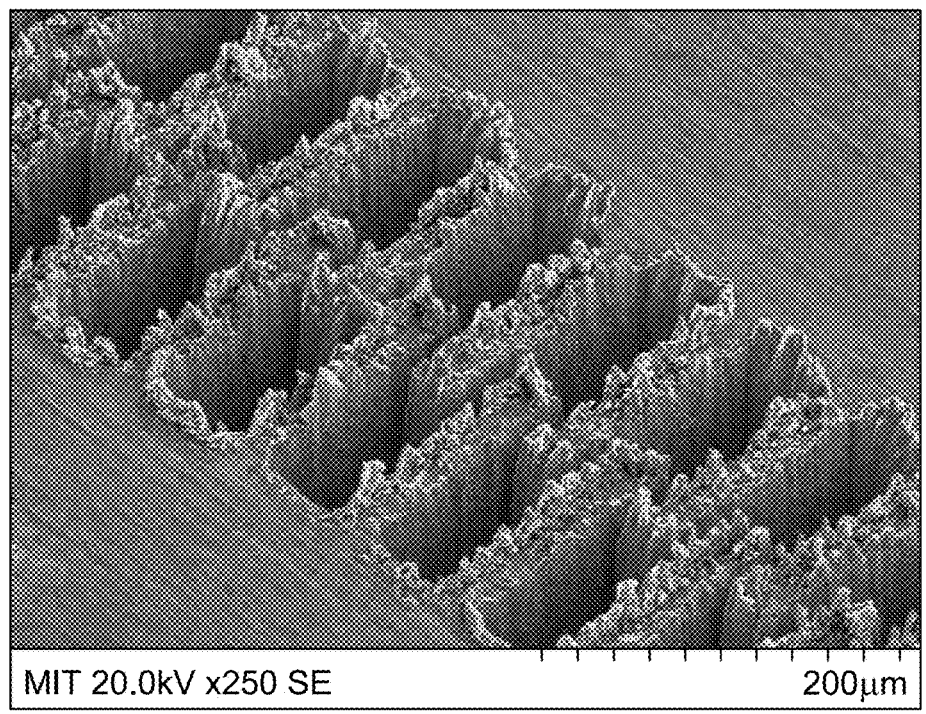
FIGS. 19A-19B show electro-deburring of LAMPE micro-machined comb-drive structure to remove the micro-burrs between the fingers. (A) Before electro-deburring. (b) After electro-deburring showing clean comb-drive fingers.
Figure 19B:
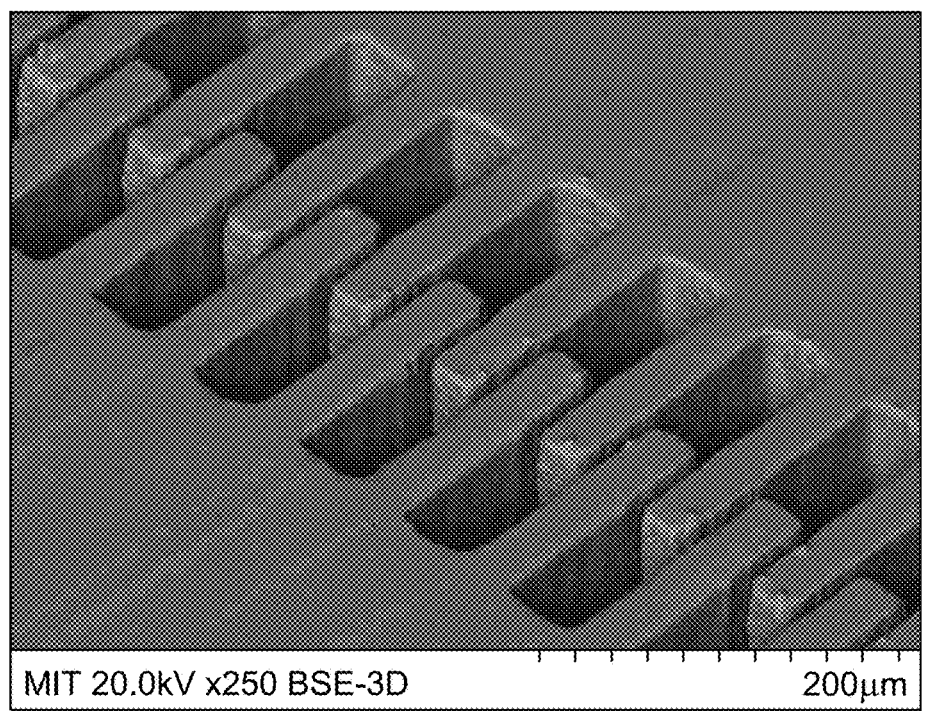

The fabrication of the comb-drive actuator consists of two steps. The first step is to fabricate the individual layer of the device using the LAMPE micromachining process. FIGS. 19A-19B show the optical microscope image of the LAMPE micro-machined copper sheet containing the comb-drive device structure. As can be seen in FIG. 19A, the micro-machined part suffers from carbon deposits and micro-burrs. The micro-burrs result in electrical contact between the two sets of comb fingers and must be removed.

The micro-burrs are removed using the electro-deburring process described in section 1.5.1. The electro-deburring process is carried out in phosphoric acid, and the LAMPE micro-machined part is used as the anode while another copper sheet is used as a cathode. The electro-deburring is carried out at 5V for 30 seconds. FIG. 19B shows the SEM image of the comb-drive structure after removing the micro-burrs.

Figure 20:
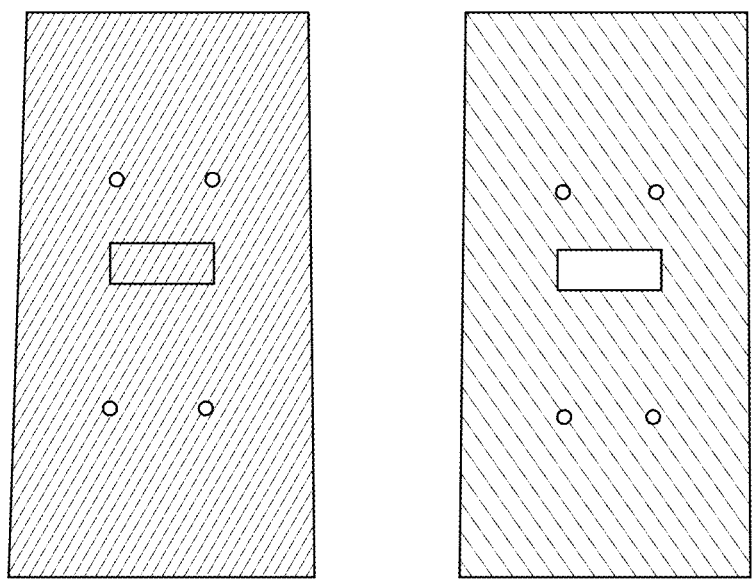
FIG. 20 shows layers of the comb-drive actuator fabricated using LAMPE micromachining. The copper layer is used for the device, and the aluminum oxide layer is used for the substrate layer.
Figure 21A:
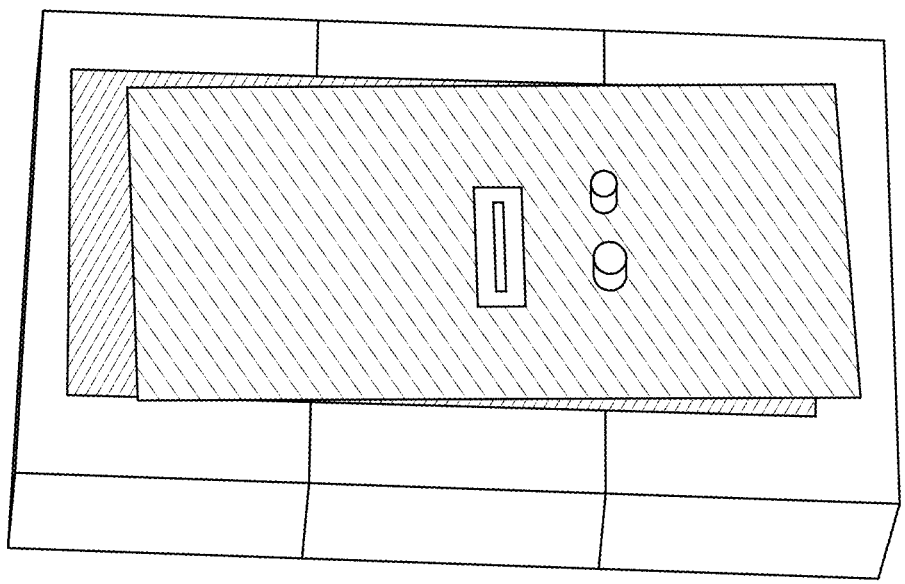
FIGS. 21A-21B show (A) Assembled and bonded layers of comb-drive actuator. (B) The device cut-out from the laminated layers using laser cutting.
Figure 21B:
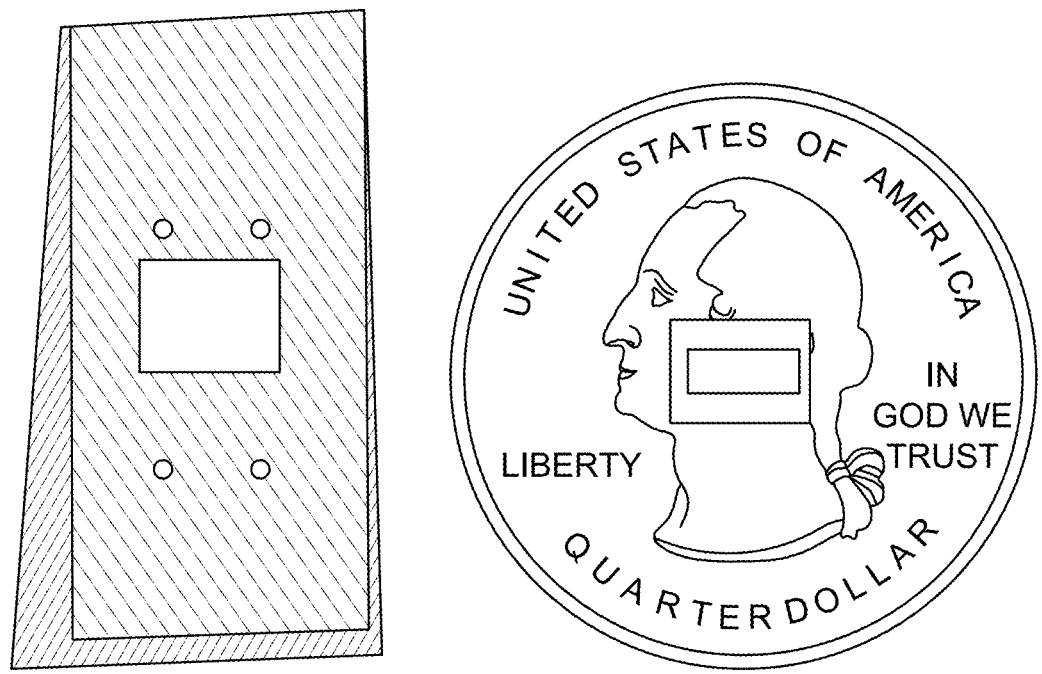

A 100 µm thick aluminum oxide sheet is micro-machined and used as an insulating substrate. Prior to micromachining the aluminum oxide substrate, a 50 µm thick stage-B epoxy adhesive film is bonded to it. This adhesive layer is later used to bond the copper device layer with aluminum oxide substrate layer. FIG. 20 shows fabricated layers of the comb-drive actuator. For every layer, alignment holes are machined along with the device structure. These alignment holes are subsequently used for multi-lamina assembly. Once the layers are bonded (FIG. 21A), the device is cut out from the laminate structure using laser cutting (FIG. 21B).

Figure 22:
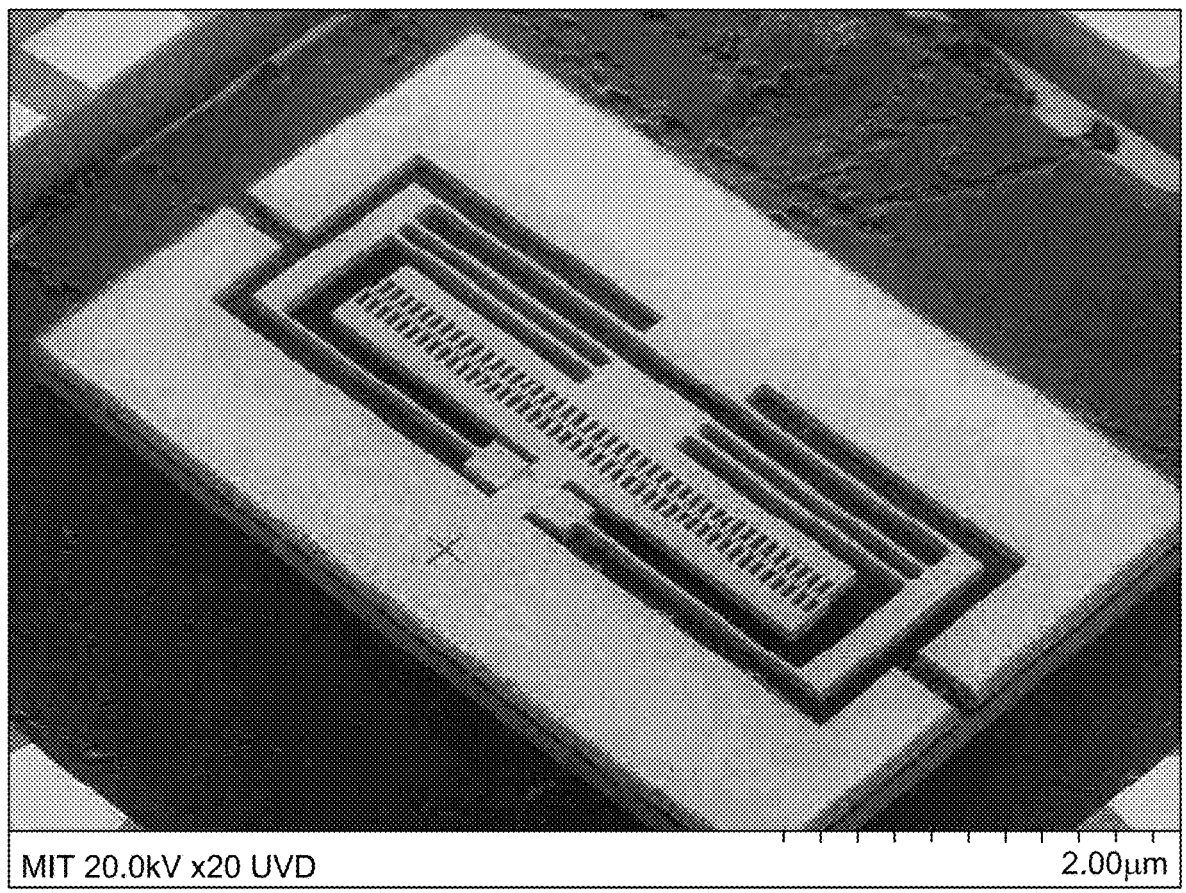
FIG. 22 shows a SEM image of the fabricated comb-drive actuator.
Figure 23A:
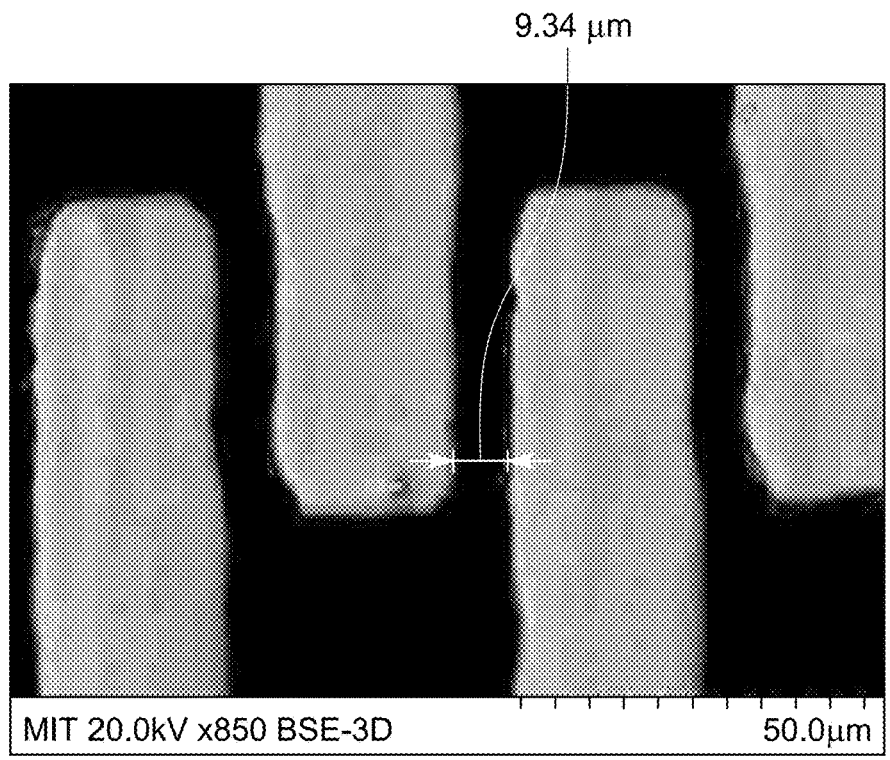
FIGS. 23A-23B shows features of the fabricated comb-drive actuator. (A) The distance between the electrostatic-comb fingers is 10 µm. (B) The width of the micro-beam is 20 µm.
Figure 23B:
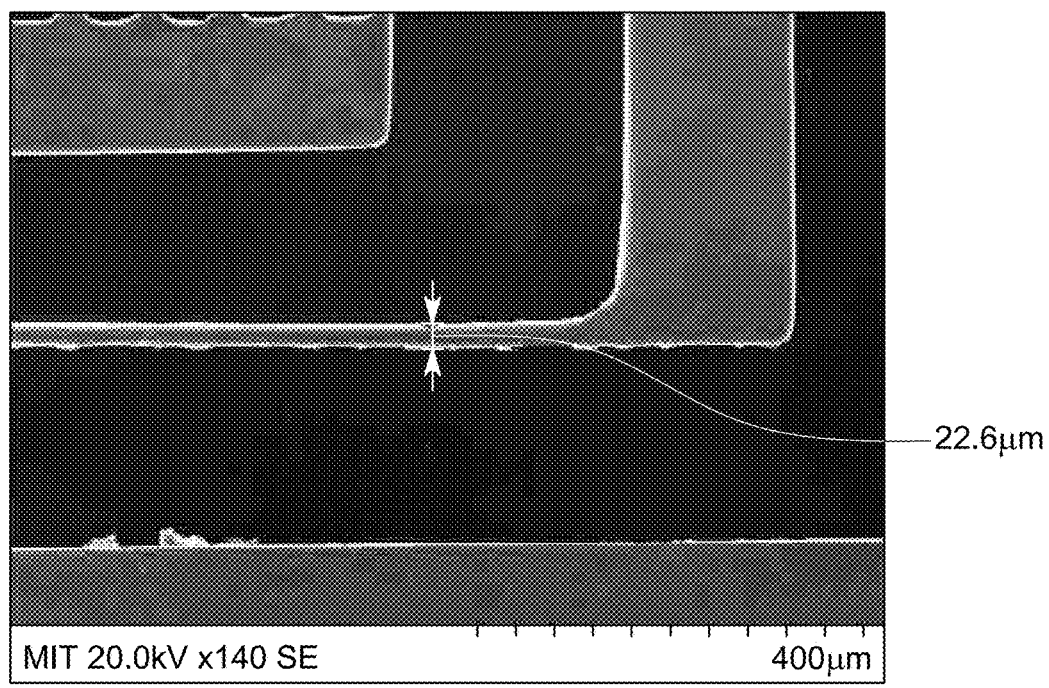

FIG. 22 shows the fabricated comb-drive actuator. The gap between the comb-drive fingers is 10 µm, and the thickness of the beam spring is 20 µm (FIGS. 23A-23B). The gap between the fingers can be further reduced by reducing the thickness of the copper layer.

2.2 Discussion on MALL MEMS Fabrication

Various aspects of MALL fabrication process are discussed below.

2.2.1 Fabricating 2.5D Structures

The conventional microfabrication utilizes deep reactive ion etching (DRIE) and anisotropic wet etching processes [82] [117] to fabricate MEMS structures. These processes allow control over etch depth, and therefore, enable the fabrication of two-and-a-half dimension (2.5D) structures. However, the LAMPE micromachining process is restricted to micromachining layers.

Figure 24A:
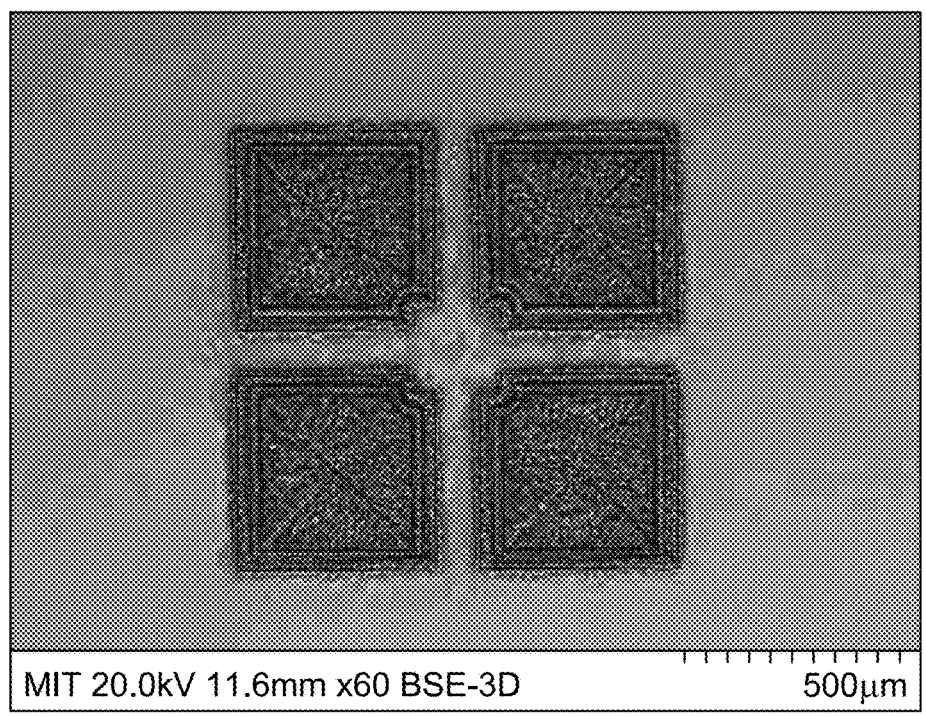
FIGS. 24A-24B show fabrication of 2.5D structure in silicon using laser-micromachining: (A) Silicon nitride mask layer patterned using laser-micromachining. (B) KOH anisotropic etch to fabricate 2.5D structures.
Figure 24B:
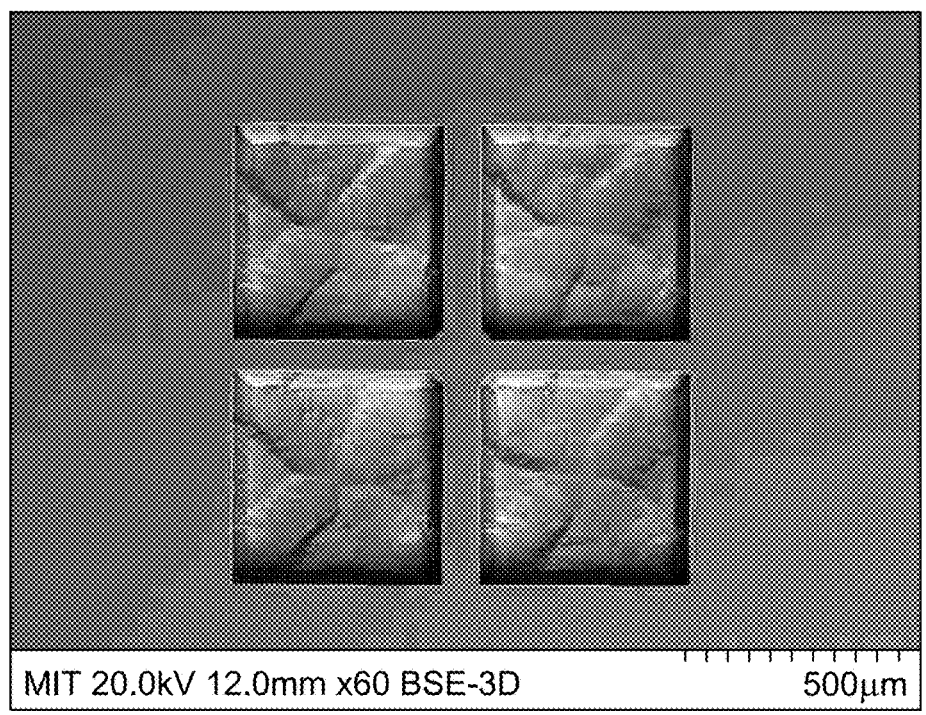
Figure 25A:
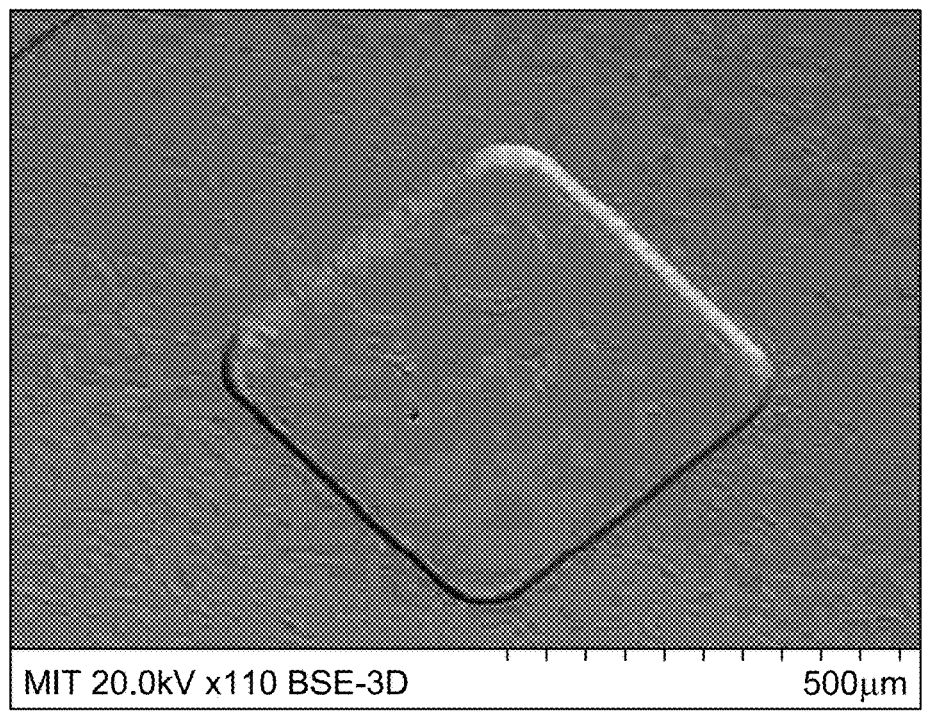
FIGS. 25A-25B show fabrication of 2.5D structures using micro-milling followed by electro-deburring. (A) Square recess fabricated using micro-milling followed by electro-deburring. Feature size as small as 100 µm can be fabricated using this method. (B) The micro-milling method provides a high degree of control over the recess depth. The figure shows fabricated recess with depth 5 µm, 10 µm, and 15 µm.
Figure 25B:
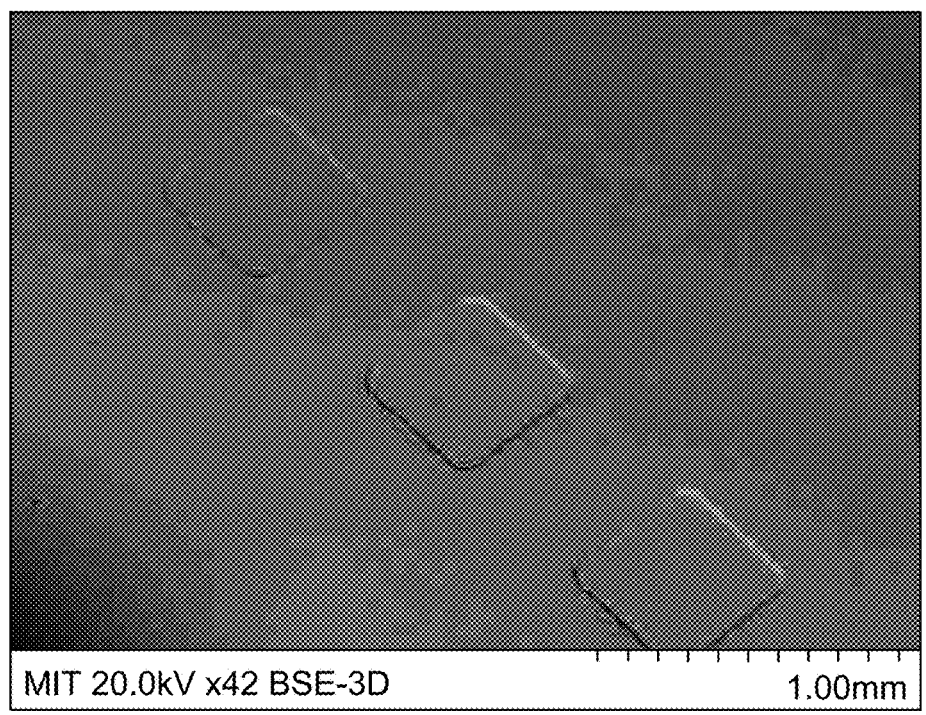

One approach to overcome this limitation is to use 2.5D structures fabricated in polymers using the conventional pulsed ablation laser-micromachining process. Another approach is to integrate the laser-micromachining with silicon anisotropic etching process. In this approach, first, a silicon nitride mask layer is removed using laser-micromachining (FIG. 24A) and then, potassium hydroxide etching [2] is performed to create 2.5D structures (FIG. 24B) the third approach is to use micro-milling followed by the electro-deburring process (section 1.5.1) to create 2.5D structures. The micro-milling offers vertical features as small as 5 µm. However, the minimum achievable feature in the lateral direction is limited to 50 µm. FIGS. 25A-25B show micro-milling 2.5D recess with a varying depth.

In the MALL process, MEMS structures are fabricated with thin sheets of materials and manually assembled or roll-to-roll laminated. Typically, foils with thickness greater than or equal to 20 µm can be used for manual assembly and roll-to-roll lamination process. As the thickness of the laminate is reduced, handling of these ultra-thin laminates becomes difficult.

Figure 26:
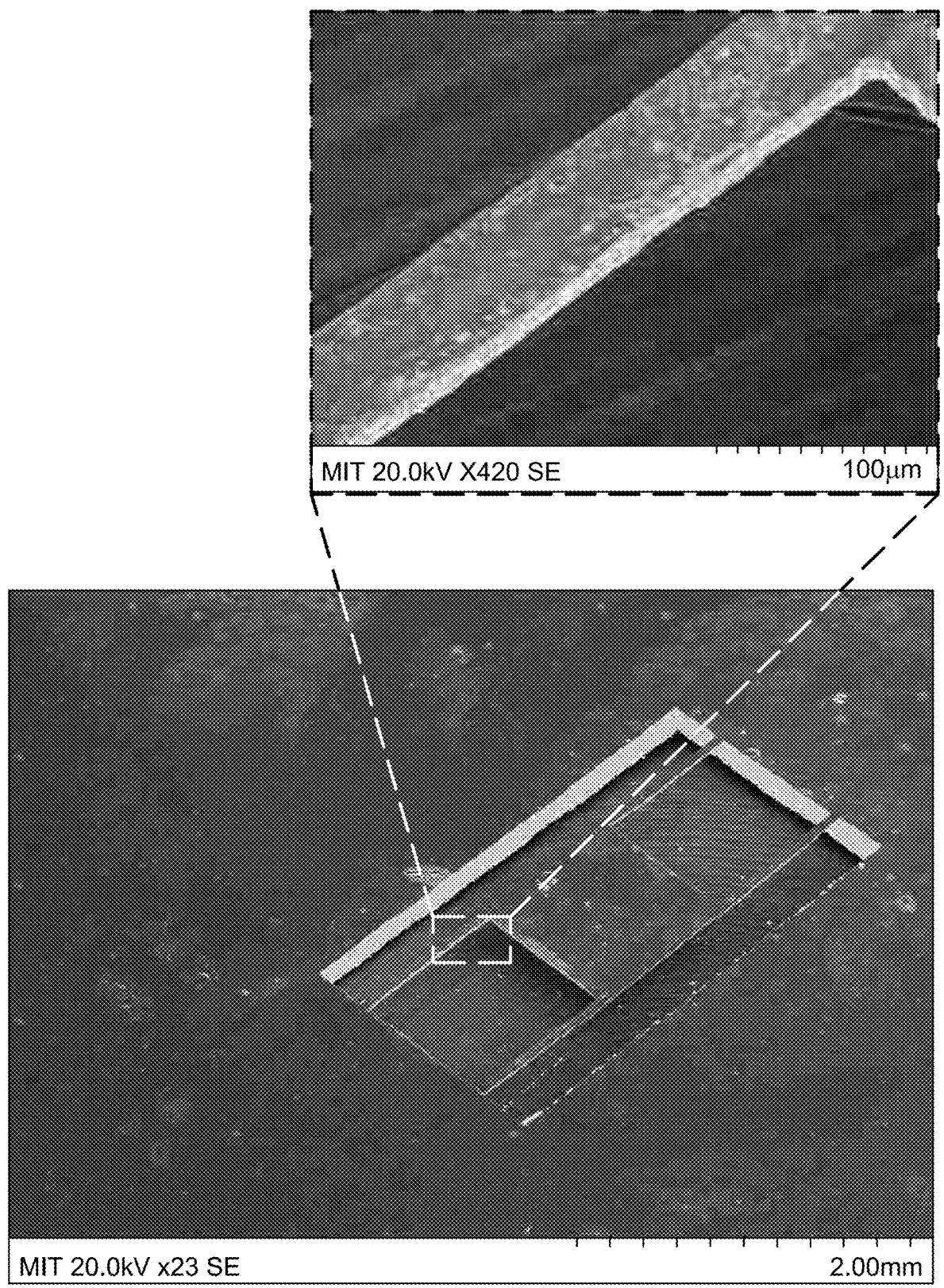
FIG. 26 shows manipulation and laser micromachining of ultra-thin metal foils using a rigid frame. First, a window is micro-machined in the rigid frame. Next, a 10 µm thin metal foil is laminated on this frame. Finally, laser micromachining is performed to create microstructure.

For a MEM device requiring sheets with a thickness between 20 µm to 5 µm, a rigid or flexible frame can be utilized. FIG. 26 shows a 10 µm thin microstructure supported by a frame. For fabricating this structure, first, a window is micro-machined in 200 µm thick silicon substrate. Next, a 10 µm thick silver foil is bonded to the silicon substrate. Finally, the device structure is laser micro-machined on the bonded silver foil. For MEM systems requiring metal foils with thickness in the order of 5 µm to the desired metal can be electrodeposited over water or solvent-soluble films, and such laminates is used to fabricate MEMS.

2.2.2 Gap Between Laminates

Figure 27:
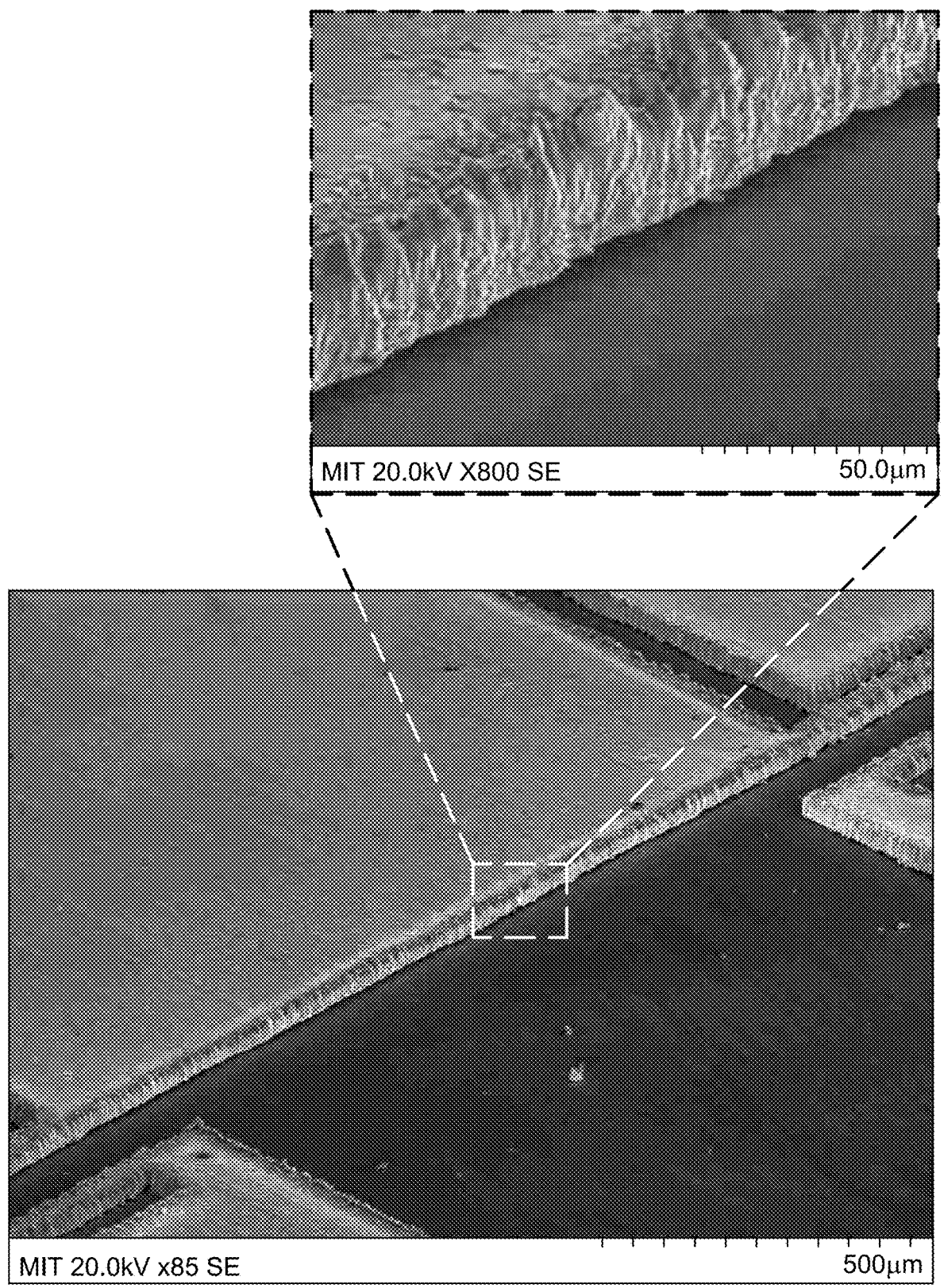
FIG. 27 shows the 12.5 µm gap between the freestanding structure and the substrate fabricated using a 12.5 µm thick adhesive layer.

In the MALL process, the gap between the free-standing structure and substrate depends upon the thickness of the adhesive layer. This work demonstrates that a gap as small as 12.5 µm can be fabricated using a 12.5 µm thick adhesive layer. FIG. 27 shows a cantilever fabricated with a 12.5 µm gap between the structure and substrate. To further reduce the gap, spin-coat the adhesive layer directly on the laminate. This spin coated layer is used as a sacrificial layer to create very small gaps.

2.2.3 Alignment Accuracy

The alignment accuracy is improved by utilizing kinematic coupling [123] and passive mechanical alignment features [124].

2.3 Volume Manufacturing of MEMS using MALL

In deep reactive ion etching (DRIE), many devices can be fabricated in parallel, resulting in a high part production rate. However, the laser direct-write micromachining process used in MALL is a serial process and MEMS are fabricated one device at a time. As a result, the part production rate in MALL process is low. The MALL process is suitable for low volume production and requires less initial investments. However, for investments greater than one million dollars, the part production rate of DRIE process increases significantly.

The part production rate in MALL process is increased by implementing the following changes:

1. Using a roll-to-roll lamination process to automate the assembly.
2. Integrating laser-micromachining and roll-to-roll lamination process by delivering the laser over the laminates using galvanometer scanner mirrors. In this system, individual layers of a device can be fabricated simultaneously, and laminated to manufacturer MEM systems. Using laser-micromachining with the roll-to-roll lamination process also eliminates the need for layer alignment, as the patterns can be spatially offset to ensure accurate alignment.
3. Using multiple laser beams to fabricate many devices in parallel. These multiple beams can be either from different laser sources or split from a single high-power laser beam.
4. Using high power laser and other precision manufacturing methods such as embossing, micro-milling, knife-cutting, wire-EDM to machine large-features at a high machining rate and reserving the low-etch rate laser-micromachining for small-features.
5. Integrating MEMS packaging with the roll-to-roll lamination process by including package layers in the lamination process. These package layers can be fabricated using embossing, micro-milling, and other conventional fabrication tools In conventional MEMS fabrication, upgrading from a 150 mm wafer facility to a 300 mm wafer facility is a significant cost. However, in MALL fabrication, adding additional lasers for parallel manufacturing is easy and the cost is incremental. Thus, the part production rate in MALL can be matched with DRIE.

2.4 Table-Top Manufacturing of MEMS Using MALL

Micro-electromechanical systems have many potential applications in healthcare, automobile, and consumer electronics. Unfortunately, due to the high cost of equipment ownership, research in MEMS has been primarily limited to industries and universities with microfabrication facilities. As can be seen above, the major obstacle in engaging a larger scientific community in MEMS research is the substantial capital investment required to procure microfabrication tools. In addition, the high cost of equipment maintenance and consumables such as silicon wafer, photoresists, developers, and etchants further hinder the access of MEMS fabrication to a large portion of the scientific community.

In contrast, the MALL process utilizes a laser micromachining system, which has three advantages. First, single equipment replaces a set of tools, mainly spin coater, mask aligner, exposure system, and DRIE system, required for micromachining. Second, the cost of laser micromachining system is significantly less than conventional microfabrication tools. Third, the consumables are limited to electropolishing solution and metal foils. These materials cost $0.0015 per device, significantly lower than that of silicon wafers used in conventional MEMS fabrication.

The major cost in a laser micromachining system comes from the laser source. The cost of the laser source depends upon its average power. A high-power laser requires a high-intensity pumping source, resulting in an increase in the cost of the laser. For example, the diode-pumped laser used in this work uses an array of light-emitting diode (LED) to pump the laser medium. These diode-arrays require specialized high-current power supply and cooling system, which are not only expensive but also have a large footprint.

The LAMPE micro-machining process requires average power in the range of 280 mW (Table 3.2), thereby needing a laser with significantly low power. The low power lasers require less intense pumping source; as a result, cost less and have a small footprint. The low-cost laser system, in conjunction with low-cost machine building can be used to develop low-cost table-top MEMS manufacturing systems. The table-top MEMS manufacturing can reduce the cost of MEMS fabrication and enable rapid prototyping, thereby democratizing MEMS fabrication and accelerating the development of novel micro-electromechanical system.

2.5 Comparison with Prior Work

The DRIE is desirable for small lateral features and high aspect ratio, however, falls short on the choice of fabrication material. After DRIE, the LIGA process is desirable for small lateral features and high aspect ratio, however, fall short on creating free-standing microstructures and require expensive x-ray source.

The MALL process disclosed here uses the similar lamination process that is used in PCB-MEMS, laminate MEMS, and Pop-up book MEMS. However, there are two major differences between the MALL process and other laminate PCB-MEMS, laminate MEMS, and pop-up book MEMS processes. These differences are discussed in the following sections.

2.5.1 High Aspect Ratio & Small Lateral Feature

In the conventional MEMS fabrication process, deep reactive ion etching (DRIE) is used to fabricate structures with high aspect ratio and small lateral features. Typically, structures with the aspect ratio as large as 10:1 and lateral features as small as 5-10 μm can be micro-machined using DRIE [20]. The high aspect ratio machining is required to fabricate MEMS structures that can move in the direction parallel to the MEMS device plane such as interdigitated comb fingers and beam springs. These structures are common in many MEMS such as comb-drive actuators [21], accelerometers [22], resonators [23], and electromechanical filters [24].

In the PCB-MEMS, individual layers of the MEM system are fabricated using photolithography, followed by wet etching. However, the wet etching process is isotropic, thereby resulting in low aspect ratio. Similarly, in laminate MEMS, the individual layers are fabricated using various processes such as stamping, laser cutting, and electroforming [6]. These processes produce structures with larger features and limited aspect ratio than DRIE. Hence, the performance of these MEMS has been far from MEMS produced using conventional microfabrication process utilizing DRIE [4][25][26][27][11]. Moreover, the low aspect ratio structures have restricted movement in the direction of the device plane, and the motion is constrained to the direction normal to the device. As a result, the application of PCB-MEMS and laminate MEMS have been limited to MEM systems in which the structures move perpendicular to lamination plane, such as MEMS RF switch [4] and microphones [11].

In the MALL process, individual layers of the MEM systems are fabricated using LAMPE micromachining. The LAMPE micromachining process can fabricate microstructure laminates with aspect ratio as large as 10:1 and features as small as 10 μm. Such high aspect ratio while maintaining the small lateral features is not achievable in PCB-MEMS, laminate MEMS, and pop-up book MEMS fabrication processes. In fact, traditionally, such high aspect ratio and small lateral features were attainable exclusively using deep reactive ion etching (DRIE) [28]. The small features and large aspect ratio structures fabricated using LAMPE micromachining are comparable to structures produced in DRIE. Hence, the MALL fabrication process can manufacture MEMS that are comparable to MEMS fabricated using DRIE.

2.5.2 Freestanding Structures with Six Degrees of Freedom

In conventional MEMS fabrication, surface micromachining [48][49][50] is used to fabricate free-standing microstructures. First, a sacrificial layer is deposited on a substrate and patterned using photolithography and etching. Next, a structural layer is deposited and patterned on top of the sacrificial layer. Finally, the sacrificial layer is removed to create free-standing microstructures. The deposition process, such as chemical vapor deposition (CVD) used to deposit the sacrificial layer and structural layer, allows a high degree of control over the thickness of the deposited material and the gap created between structure and the substrate.

Fabricating similar thin freestanding structures in the lamination process is challenging. The difficulty is due to two reasons. First, as the thickness of the laminate is reduced, handling and micromachining these ultra-thin layers becomes difficult. Second, freestanding structures are created using a spacer layer, which is patterned and sandwiched between the layer containing freestanding structure and the substrate. The thickness of the spacer layer determines the gap between the freestanding structure and the substrate. As this gap and the size of freestanding structures is reduced, manipulating and patterning the ultra-thin spacer layer gets challenging. As a result, the applications of PCB-MEMS and laminate MEMS have been largely limited to either fabricating MEMS with no freestanding structures such as microfluidic devices [51][52] and optical MEMS [7] or MEMS with large gap between the freestanding structure and substrate such as such as MEMS microphone and electromagnetic switch [4][11][8][25][27].

The laser micromachining process used in MALL allows effortless patterning of B-staged epoxy adhesive layers. By using patterned adhesive layers as a spacer layer, tack bonding process, and high alignment accuracy, this work demonstrates fabricating freestanding structures with a gap between the structures as small as 12.5 µm (as shown in FIG. 5-6). Similarly, by bonding ultra-thin film to rigid frame for manipulation and performing LAMPE micromachining, this work demonstrates fabricating freestanding structures as thin as 10 µm (as shown in FIG. 5-5). These microstructures can be fabricated with small features and satisfactory aspect ratio to allow six degrees of freedom (DOF) movement.

2.6 Advantages of MALL MEMS Fabrication

The MALL fabrication process offers several advantages over conventional lithography-based MEMS fabrication processes such as greater material selection and integration, low cost of fabrication, rapid development, and integrated packaging. These advantages are discussed in detail in the following sections.

2.6.1 Greater Choice of Fabrication Materials

The fabrication materials used in the lithography-based MEMS manufacturing process is largely limited to silicon. On the other hand, the MALL process enables fabrication with a wide range of materials such as metals, ceramics, polymers, and composite materials. The ability to fabricate MEMS using a wide range of materials greatly enhances the functionality and performance of these systems. For example, materials with interesting properties such as magnetic, piezoelectric, pyroelectric, thermoelectric, and superconducting materials can be employed to design novel MEM systems.

The application of metals in fabricating MEM systems is especially of great interest. Metals offer a wide range of mechanical and electrical properties, and these properties can be tuned using the alloying process. Moreover, due to the roll forming process, the cost and energy requirement for making metal foils is much less than that of silicon wafers.

2.6.2 Fabrication with Incompatible Materials

In conventional microfabrication process, MEMS are fabricated layer-by-layer by successive deposition and patterning of material layers. Each material layer is deposited and patterned using a unique process, and this process must be compatible with the previously deposited materials. The integration of these processes is often difficult due to material incompatibilities and thermal constraints. However, in the MALL fabrication process, the individual layers of MEMS are fabricated separately, and stack-assembled and bonded to make a system. As a result, materials with incompatible fabrication process can be bonded together, in any order, to manufacture MEMS.

2.6.3 Low-Cost Fabrication

The high cost of MEMS fabrication is due to two reasons. First, the large capital investment in microfabrication tools such as exposure system, mask aligners, chemical vapor deposition (CVD), and deep reactive ion etching (DRIE) systems. Second, the high cost of raw materials and chemicals such as photoresists, developers, etching solutions and gases, and silicon wafers. In contrast, the MALL process requires a laser micromachining system and electrochemical etching tools, which have a much low cost of ownership than the traditional microfabrication tools. Similarly, the raw materials used in MALL fabrication are metal foils, polymers, and ceramics. These materials are much more cost-effective than silicon wafers, utilized in conventional MEMS fabrication process.

2.6.4 Rapid Development

The MALL MEMS fabrication process enables rapid development by allowing rapid material integration, process development, and quick design and prototype iteration as discussed below:

2.6.4.1 Rapid Material Integration

In a conventional lithography-based fabrication process, MEM systems are fabricated layer-by-layer. Fabricating each layer involves a series of deposition and patterning steps such as chemical vapor deposition (CVD), spin-coating photoresist, resist exposure and development, and wet or dry etching. The fabrication process for each layer must be optimized and should be compatible with the previously deposited materials. This step-by-step process optimization and integration is extremely time-consuming. Moreover, in conventional MEMS fabrication, MEMS chips and packages are fabricated separately and integrated at a later stage. This integration of chips and packages further increases the development time.

In the MALL fabrication process, individual layers can be manufactured independently with minimal process development and effortlessly bonded to make MEMS; as a result, significantly reducing the device development time. Moreover, laser micromachining system used in MALL can exist side by side with other macro-fabrication equipment (such as milling, molding, and embossing), and utilizes similar computer-aided design (CAD) and computer aided manufacturing (CAM) tools, thereby enabling integrated design of MEMS and packaging, simultaneous fabrication, and rapid integration.

In conventional MEMS fabrication, the three-dimensional MEMS design is converted into a series of two-dimensional lithography masks, which are subsequently used for fabrication. However, in MALL, the laser micromachining toolpath can be directly exported from the integrated CAD/CAM design tool. This integration of design, manufacturing, and finite element analysis (FEA) of MEMS in one environment enables the rapid iteration of design, simulation, and prototyping.

2.6.4.2 Rapid Process Development

In DRIE, some degree of process development is required to etch the desired MEMS structure. The etching process parameters are determined by performing a series of etch cycles and varying the etching parameters. Each etch cycle requires the loading and unloading of wafer, and often the process is done manually. As a result, the process development takes substantial time.

However, in the MALL process, various laser micromachining parameters such as laser power, pulse frequency, feed rate, and pulse duration can be tested in a single cycle by performing a series of micromachining tests. As a result, considerably shortening the process development time. The laser micromachining process development time for new material or new sheet thickness is about 6 hours.

2.6.4.3 Rapid Design Iteration

In MALL, the micromachining rate of PLA or LAMPE micromachining is independent of the device area (or design). As a result, many designs can be tested without requiring any process development. However, in DRIE, the etch rate depends upon the device area due to the loading effect [113][72]. As a result, for each MEMS design, a new set of DRIE process parameters must be determined, which significantly hinders design iteration and increases device development time.

2.6.5 Ultra-Short Time to First Prototype

The MALL MEMS fabrication process significantly shortens the time require for fabricating the first prototype. This fact is illustrated by using the example of the comb-drive actuator fabricated in this section. The first step in the concept to creation cycle is to design the device and select the desired fabrication material. Once the design and the material is finalized, the next step is to determine the laser micromachining parameters required to micro-machine the material sheet of a given thickness.

For determining process parameters, a micromachining pattern containing horizontal and vertical lines of varying width is used as a test pattern. Multiple instances of this test pattern are micro-machined at various laser power, laser frequency, feed rate, and pulse duration (in this work, the pulse duration is fixed to 20 ns). These micro-machined patterns are inspected in a scanning electron microscope, and the pattern with smallest feature is determined and the laser micro-machining setting corresponding to this pattern is used for device micro-machining. The laser micro-machining process development time for a new material or sheet thickness is about 6 hours. The determined laser micro-machining parameter is used fabricate the comb-drive structure. Depending upon the design, this process can take anywhere between a few minutes to one hour. For this estimate, it is assumed that it will take one hour to micro-machine the whole device.

The next step is to perform electro-deburring. For electro-deburring, the information about the required electrolytic solution can be derived from here [90]. The laser micro-machined part is used as the anode, and another piece of same metal is used as the cathode. The information about the electro-polishing voltage can also be derived from reference [90]. As discussed in section 1.5.1, the electro-deburring voltage must be greater than the electro-polishing voltage to ensure selective etching burrs. Some degree of process development may be required for new material, but any voltage above electro-polishing voltage results in electro-deburring. Often the easiest option to increase the voltage until the bubbles start to appear at the anode, and perform electro-deburring at this voltage. Generally, 30 seconds are enough to completely remove the burrs. For this estimate, it is assumed that the electro-polishing process will take a total of one hour.

The final step is to align and laminate the individual device layer. This experiment used Dupont FR1500 and 3M thermal bonding film 583. These adhesive films are very well studied and do not require any process development. Therefore, the bonding can be performed in a total of one hour (30 minutes of handling and 30 minutes of the adhesive curing cycle). The total time required in fabricating the first prototype is approximately 10 hours. It must be noted that if the fabrication material remains the same, prototyping a new MEMS device takes approximately 4 hours.

2.6.6 Integrated Packaging

The packaging of MEMS is essential for protecting the system from a harsh environment. Moreover, in certain MEM systems, the packaging also acts as an interface between the MEMS system and the external environment. The microfabrication processes used to fabricate MEMS chips are incompatible with the macro-fabrication processes that are used to fabricate MEMS packages. As a result, the MEMS die, and the package are fabricated independently and then integrated later. This integration process is challenging and increases development time and cost. Often, the cost of MEMS packaging is higher than the cost of fabricating MEMS chips.

In MALL, the fabrication process and materials are compatible with the macro-fabrication processes. As a result, the MEMS layers and the packaging layers can be fabricated simultaneously. Moreover, these layers can be laminated in a single step, thereby enabling the fabrication of MEM systems with integrated packaging. However, the lamination process uses polymer adhesive films for bonding the packaging layers. These polymer films are permeable to water molecules [115][116]. Thus, the MALL integrated packaging cannot be used for package MEMS requiring a hermetic seal.

3 Detailed Process Description

The detail process description of MALL MEMS fabrication process is described below.

3.1 Tools Required for MALL MEMS Fabrication

Below is the list of tools required for MALL MEMS fabrication:

1. A laser micromachining system. Preferred is a laser micromachining system from Oxford Laser Ltd [56].
2. Depending upon the feature size of the device, a scanning electron microscope or a high-resolution optical microscope is required to inspect the MEMS device during fabrication. A low magnification stereo microscope is also useful for quick inspection.
3. A chemical hood and a voltage source is required to perform electro-deburring process.
4. A critical point dryer may be required. For MEMS fabricated with metals, dipping the device in isopropanol (IPA) and drying on a hot plate is sufficient. However, for MEMS fabricated with silicon and containing small features, a critical point dryer is desirable.
5. A hot plate is useful for quickly drying the wafers.
6. A toaster oven with a temperature controller is required for certain adhesives that need curing at higher temperatures. Particularly, the Dupont FR1500 adhesive used in a particular MEM relay requires baking at 185 degree centigrade. Another example adhesive is 3M thermal bonding film 583, which can be either solvent activated or pressure activated, and does not require baking.
7. A vacuum tweezer is desirable to facilitate manipulating the delicate sheets after laser micromachining process.
8. Depending upon the MEMS device, addition tools may be required for device testing. For example, a MEM relay, or other simple device, may be tested using a semiconductor parameter analyzer. A probe station may also be required for electrical testing of the device.
9. For certain MEMS devices, a table-top precision milling machine can be useful. The bottom layer of MEM relay can be fabricated using a table-top precision milling machine. A main tool that is useful for LAMPE micromachining is the Oxford laser micromachining system [56]. This system is described in detail below:

3.1.1 Laser-Micromachining System

The system consists of three major components: 1) Laser source, 2) Focusing optics, and 3) Motion system. These components are discussed in the following sections.

3.1.1.1 Laser Source

The laser source is an important component of a laser micromachining system and determines the feature size and type of materials that can be processed. There are two types of lasers that are employed in laser micromachining: pulsed laser and continuous-wave (cw) laser. The pulsed laser has two advantages over continuous-wave laser. First, the short laser pulse enables fine control over the energy dumped into the target, which is essential for machining small features. Second, the peak power of the individual pulse is several orders of magnitude higher than the average power of the laser. As a result, the pulsed laser can ablate the material even with much lower average power.

The laser source used in this work is a Q-switched frequency-doubled Nd:YAG diode-pumped solid-state (DPSS) laser. The wavelength of the laser is 532 nm and the pulse duration is 20 ns. The mode of the laser beam is TEM00 and the beam quality $M^2<1.2$. The average power, $P_{avg}$ of the laser is between 2-6.5 W and depends upon the pulse frequency. The average power at 5 KHz pulse repetition rate is 2.8 W. The pulse energy at 5 KHz pulse repetition rate is 561 µJ. The peak power is in the order of kilowatts even though the average power is less than 6.5 W. The peak power of the laser pulses is responsible for the ablation of the material. The peak power at 5 KHz pulse repetition rate is 28 kW. Table 3 summarizes the values of the parameters calculated for the laser used in this work.

TABLE 3

The values of various parameters of laser source.

| Laser Parameter | Value |
| --- | --- |
| Wavelength, λ | 532 nm |
| Average Power, $P_{avg}$ | 2.8 W |
| Pulse Frequency, $F_p$ | 5 KHz |
| Pulse Duration, $\tau_1$ | ≈ 20 ns |
| Pulse Energy, $E_p$ | 561 µJ |
| Peak Power, $P_{pk}$ | 28 kW |

3.1.1.2 Beam Delivery & Focusing Optics

The laser beam is delivered to the target material using a series of mirrors, lenses, and other optical elements. First, the laser beam emitted from the source is expanded using a beam expander. The diameter of the laser beam after the beam expansion is 10 mm. The beam is then allowed to pass through a variable attenuator, which is used to attenuate the laser beam and control the energy dumped into the target. Finally, the laser beam is focused onto the target using either a lens or a microscope objective.

Diameter of Focused Beam

For the laser used in this work, the wavelength λ=532 nm, beam waist (or aperture diameter) d=10 mm, and focal length f=100 mm. The calculated focused spot size $2\omega_0$=12.98 µm. The focused beam spot size $2\omega_0$ is an important parameter in determining the minimum achievable feature size in laser-micromachining. In addition to lens, microscope objectives can also be used for focusing the beam. Generally, an infinity-corrected objective is desirable as it enables simultaneous laser micromachining and imaging, and easy insertion of additional optical components. In an infinity-corrected objective, the light effectively travels parallel to the optical axis. As a result, additional optical components such as optical filters, polarizer and beam splitters can be inserted between the tube lens. To create an image with an infinity-corrected objective, a tube lens must be used to focus the image.

Intensity of Focused Beam

Figure 28:
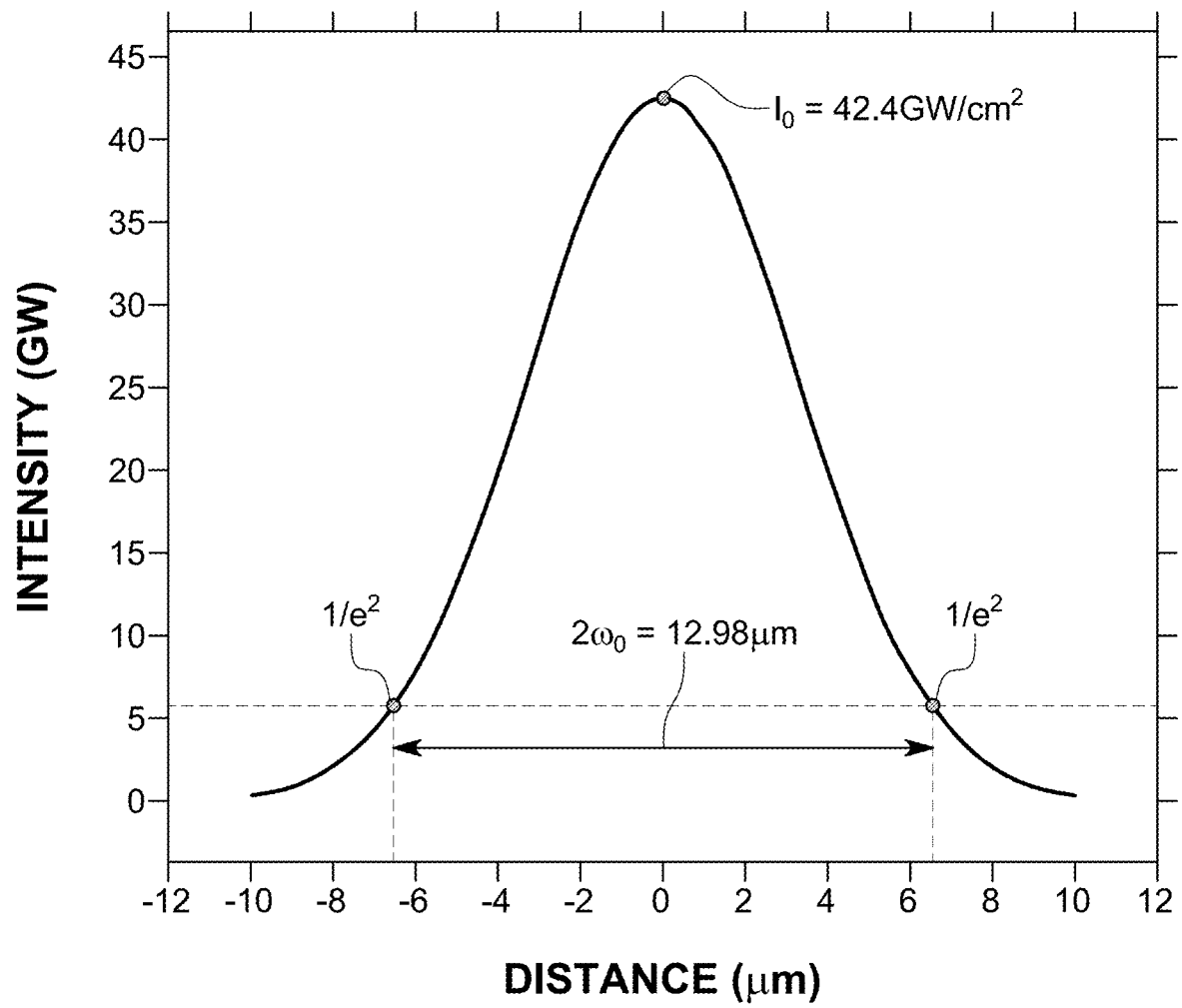
FIG. 28 shows the intensity profile of focused laser beam. The beam spot diameter is I0=21.2 MW/cm².

The peak power of the laser pulse at 5 KHz is 28 W and the diameter of the focused beam spot is ω=12.98 µm; therefore, the pulse intensity is 21.2 GW/cm². The right y-axis of FIG. 28 shows the variation of pulse intensity $I_p$ with respect to the pulse frequency. As can be seen, the intensity of the central peak of a Gaussian beam is twice the average intensity of the laser pulse. The peak power of the laser at 5 KHz pulse frequency is P=28 KW (Table 2.1). The maximum intensity at the center of the beam is $I_0=2I_p$=42.4 GW/cm². FIG. 28 shows the intensity profile of the laser beam.

Rayleigh Length

For the laser used in this work, the wavelength λ=532 nm, beam waist (or aperture diameter) d=10 mm, and focal length f=100 mm. The resulting Rayleigh length of the focused laser beam is $Z_R$=850 µm.

3.1.1.3 Motion System

A 2-axis stage is used to move the target with respect to the laser to perform laser micromachining. For each axis, the resolution is 0.250 µm, repeatability is 0.750 µm, and accuracy is +/−2 µm. The maximum attainable speed is 250 mm/s, and the maximum attainable acceleration/deceleration is 10,000 mm/s². It must be noted that the practical limit on maximum attainable speed for micromachining MEMS parts is restricted to 1 mm/s or less due to their small size and limited acceleration/deceleration of the stage.

The feature size in laser micromachining process depends upon the laser energy dumped into the target. This dumped energy is controlled by changing the pulse energy and the overlap between the successive laser pulse exposure. For MEMS requiring small features, using a galvanometer scanner is desirable instead of using a 2-axis stage. The galvanometer can provide a much higher feed rate, thereby enabling fabricating small features by allowing fine control over the energy dumped into the target. Moreover, the high feed rate can increase the micromachining rate. A typical 2-axis galvanometer mirror can operate at 100 Hz [60]. Assuming, the scan distance of 1 mm, a feed rate of 100 mm/s can be easily achieved.

3.2 Materials Required for MALL MEMS Fabrication

Below is the list of materials required for MALL fabrication:

1. The main material used in MALL MEMS fabrication is metal foils. These metal foils can be sourced from https://www.mcmaster.com/.
2. The main adhesive layers used in this work are Dupont FR1500, 3M thermal bonding film 583, and scotch double-sided tape. These adhesives can be sourced from their corresponding vendors.
3. Electrolyte for electro-deburring process. For copper, either copper sulfate or phosphoric acid can be used.
4. Dowel pins or gauge pins as alignment pins.

3.3 MEMS Design Procedure for MALL MEMS Fabrication

Fusion 360 may be used for designing MEMS. The software offers the advantage of integrating the computer aided design (CAD) and computer aided manufacturing (CAM), and is well suited for MALL MEMS design. Since the MALL process is a laminate process, it is advantageous to design the MEMS system in form of layers. Once the design is finished, the g-code for laser toolpath can be exported using the CAM interface of the Fusion 360 program. This g-code program is used for performing the laser micromachining.

Depending upon the MEMS device design it is advisable to export two different laser toolpaths. The first toolpath is for the part of the region where small feature sizes are not required and high-power laser can be used to remove the material at high micromachining rate. The second toolpath is for parts of the MEMS design which have small features, and require LAMPE micromachining process.

Figure 29:
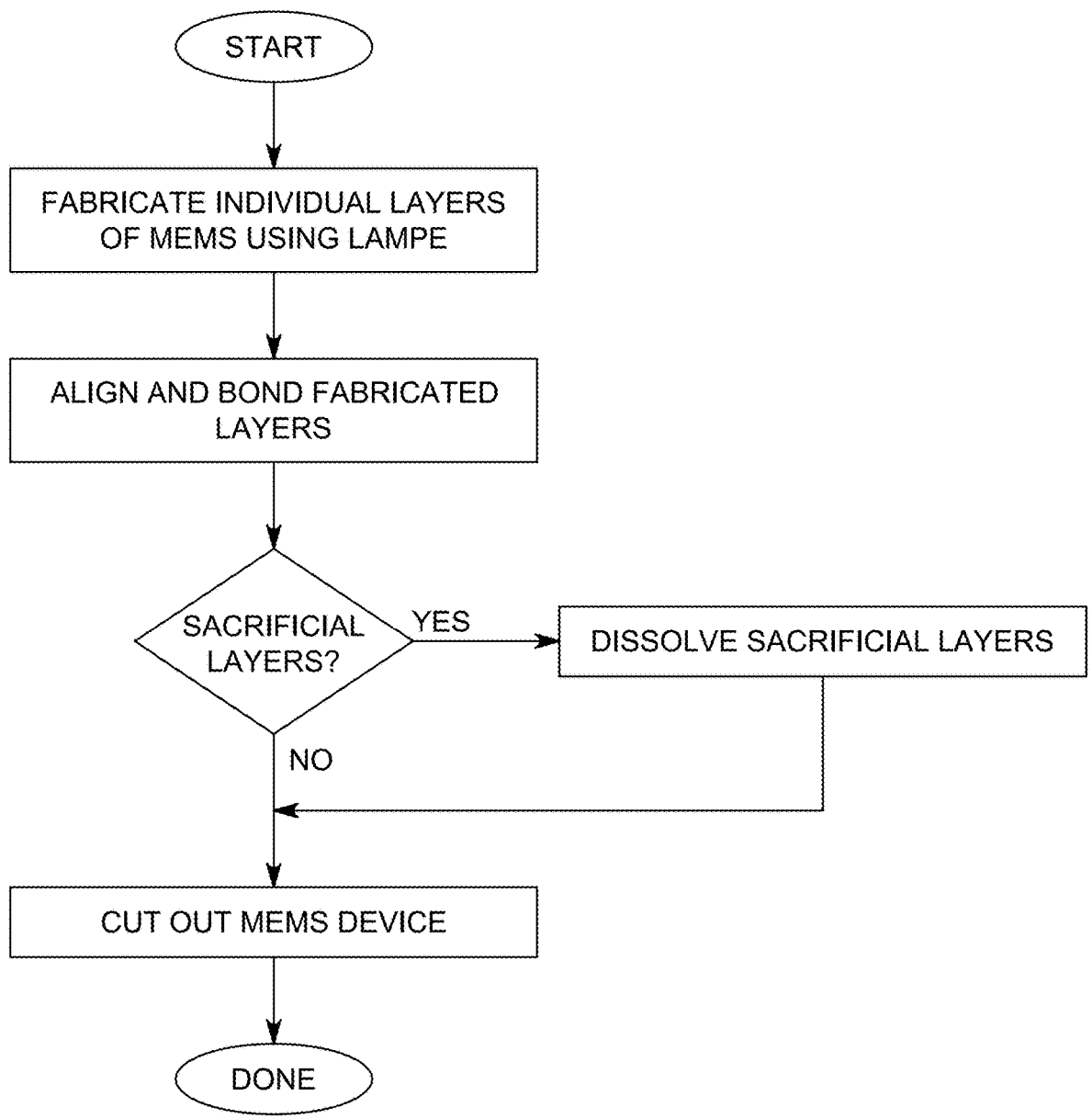
FIG. 29 shows a process flowchart for the MALL MEMS fabrication process.

3.4 Step-by-Step Guide and Process Flowchart for MALL MEMS Fabrication Process The process flowchart of FIG. 29 describes the MALL MEMS fabrication process.

The process steps are as follows:
1. Fabricate individual layer of MEMS using LAMPE micromachining or laser micromachining.
2. Align the individual layer of MEMS and bond.
3. Dissolve sacrificial layer.
4. Dice device using laser cutting.

3.4.1 Fabrication of Individual MEMS Layer

Figure 30:
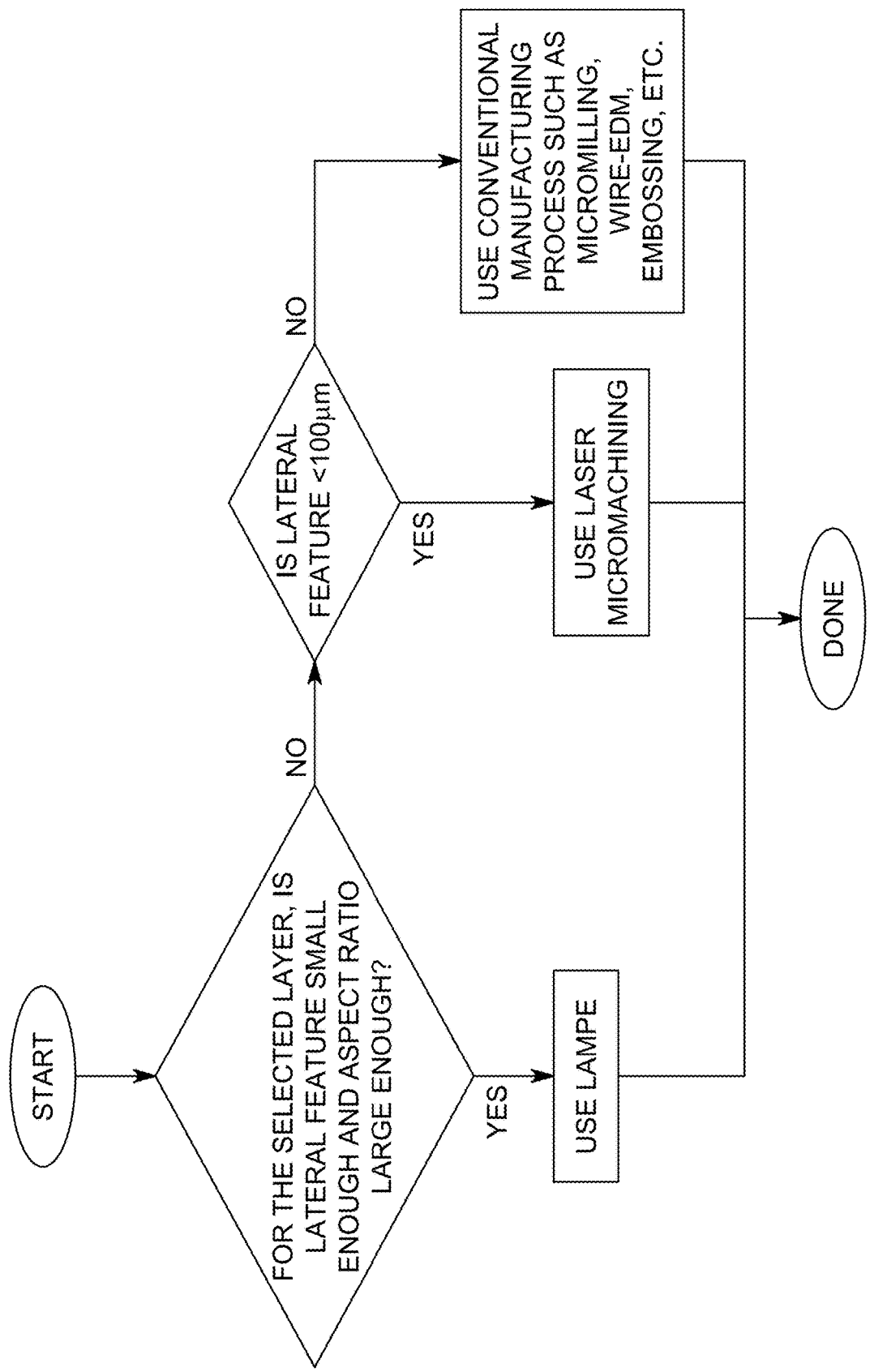
FIG. 30 shows fabrication of an individual MEMS layer.

A MEMS device consists of layers of materials. Each layer has features such as lateral feature size, aspect ratio, and geometry (2D, 2.5D or 3D). Depending upon these features different manufacturing process could be used. For example, for device layers with lateral features larger than 100 µm, conventional manufacturing process such as micro-milling, wire-EDM and embossing and the like can be used. For device layer with features in the range of 100 µm-25 µm, laser micromachining process can be used. For device layer with features smaller than 10 µm and aspect ratio larger than 10:1, LAMPE micromachining process can be used. The flowchart of FIG. 30 shows the process for fabricating an individual MEMS layer.

3.4.2 LAMPE Micromachining of MEMS Layers

In this work, the laser micromachining is performed using a commercially available laser micromachining system from Oxford Laser Ltd [56]. Following are the general steps used for LAMPE micromachining:

1. The material foil is clamped to the stage using a clip. For material foils with thickness up to 20 µm, tweezers can be used for manipulations. However, for thickness below 20 µm, it is desirable to attach the metal foil with a rigid frame for easy manipulation.
2. Selecting the laser source: For metals, the laser micromachining process is generally independent of the laser wavelength. This is due to the fact that the absorption of laser by the metal is low in the UV, Vis, and IR range. The pulse duration of the laser is essential to get the small feature size. Equations or tables may be used to determine the required pulse width for a desired feature size. Often the laser pulse width is fixed, and the user only has control over the pulse power.
3. Selecting the focusing optics: Depending upon the feature size, the desired lens or objective is installed. The laser micromachining system is equipped with a digital camera for sample inspection. Next, the sample is brought into the focal plane of the lens by inspecting in the imaging system.
4. Selecting laser power and process development: A series of power tests in the vicinity of this calculated laser power can be used to determine the exact value of the power which gives the minimum feature size. The laser micromachining should be performed at this value. It must be noted that, the feature size also depends upon the degree to which the sample is at the focal plane. Usually, before performing the power test, one performs a series of focus tests to determine the best focus. Sometimes a second pass might be required if the laser micro-machined part does not fall off during the laser micromachining process.

One can use the flowchart in FIG. 30 to determine the LAMPE micromachining process according the layer material.

3.4.2.1 LAMPE Micromachining of Metal

Figure 31:
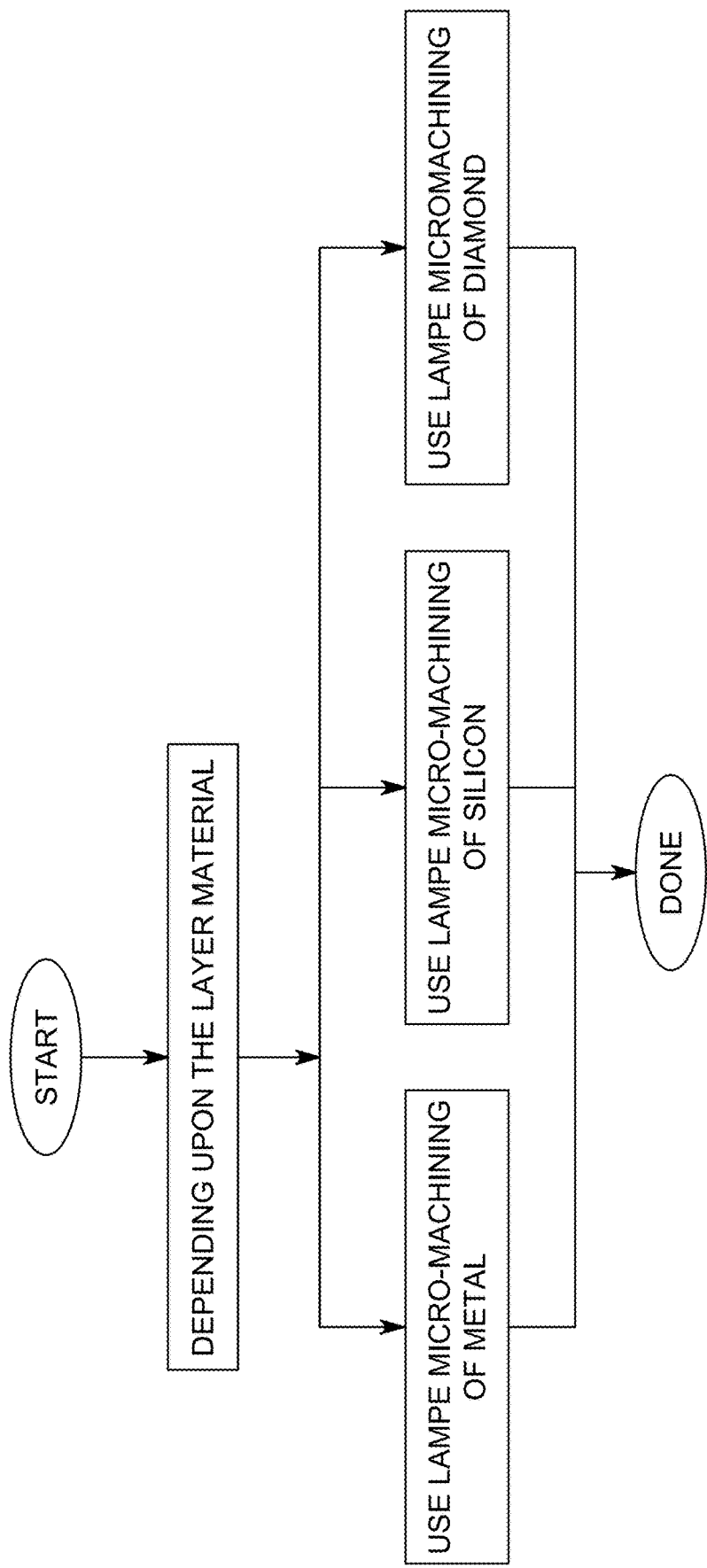
FIG. 31 shows a flowchart used to determine the LAMPE micro-machining process according the layer material.
Figure 32:
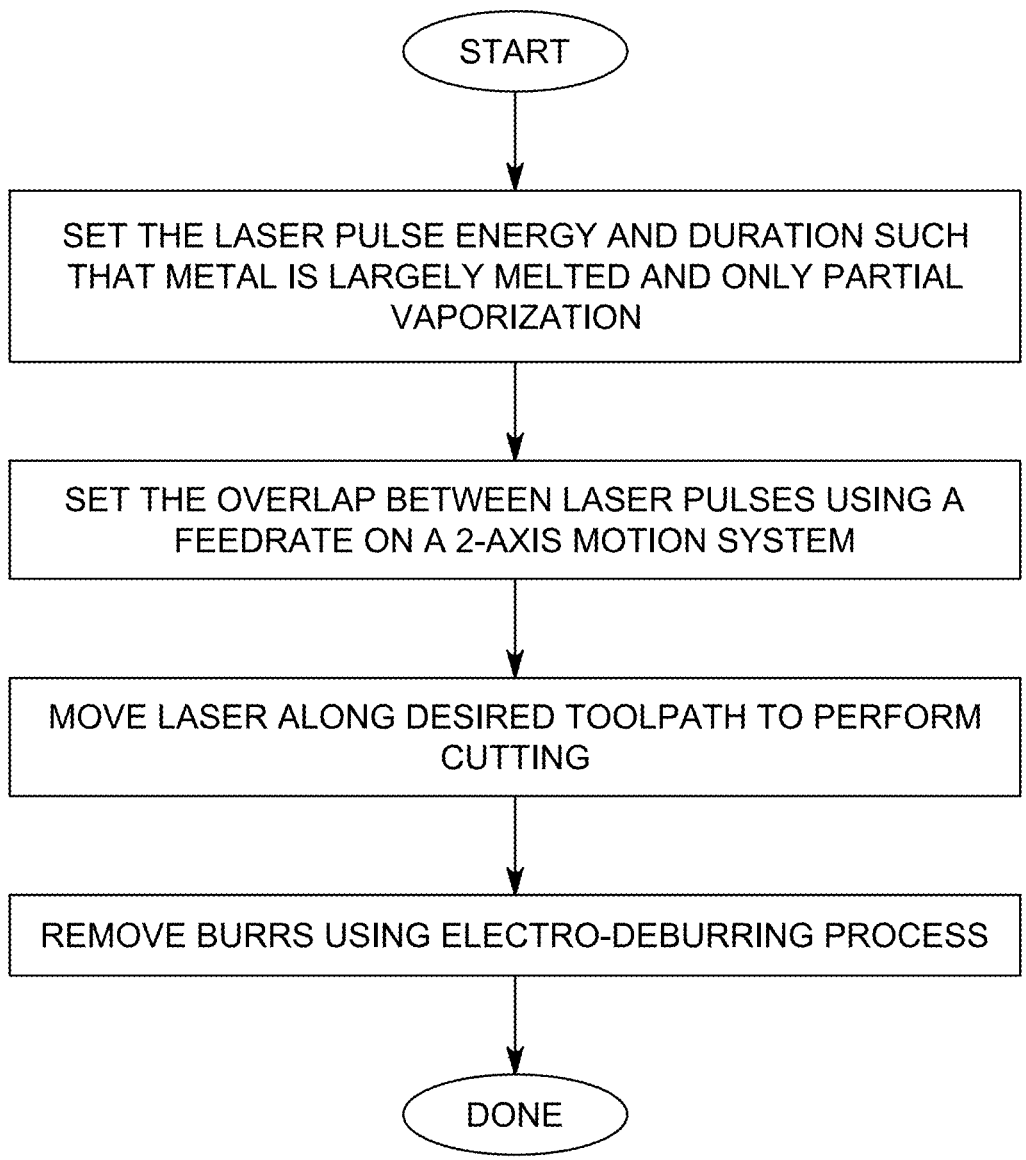
FIG. 32 shows a flowchart used to fabricate metal layers using the LAMPE micromachining.
Figure 33:
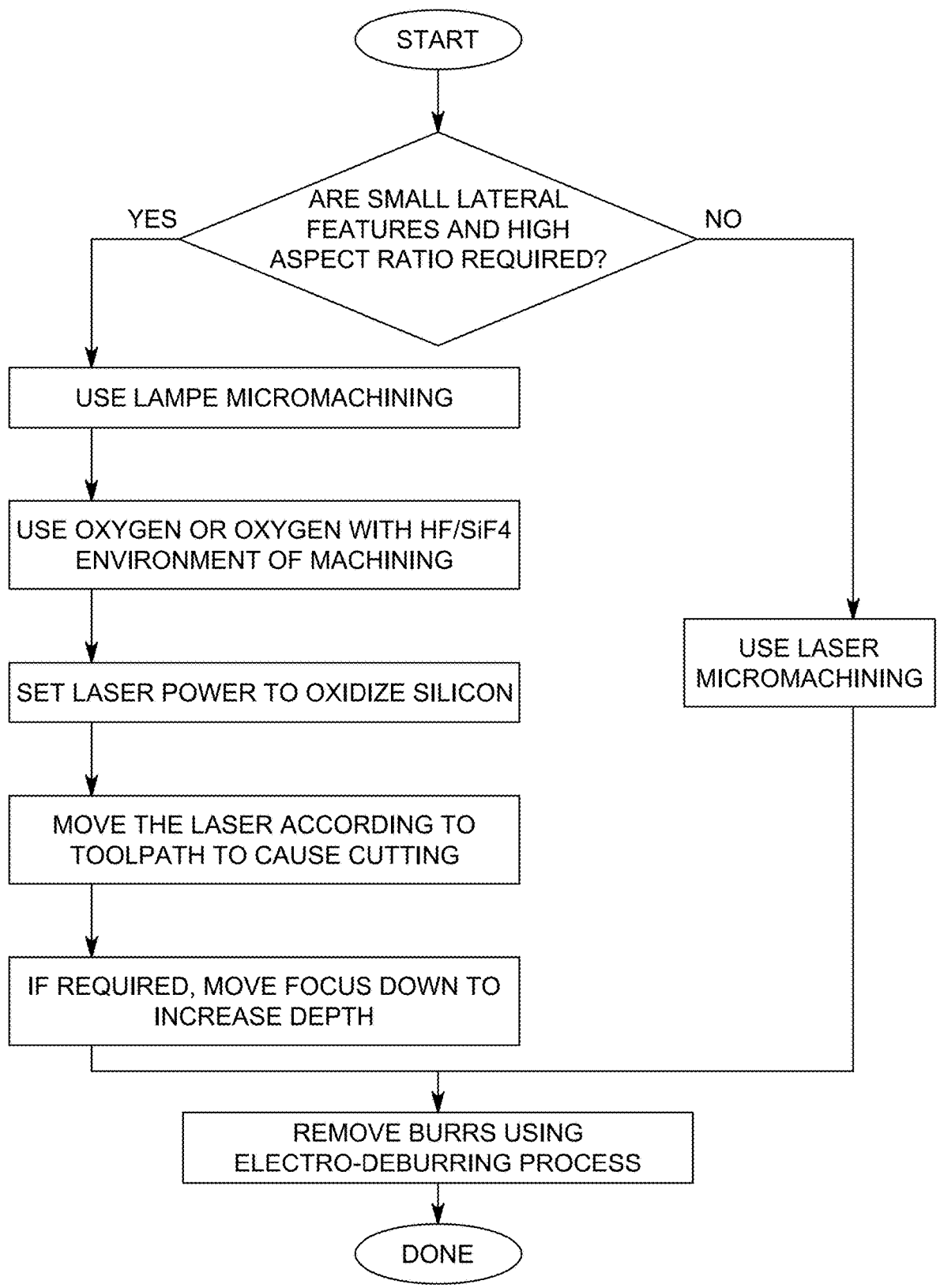
FIG. 33 shows a flowchart for using LAMPE in the micro-machining of silicon.

Follow the steps described in the flowchart of FIG. 31 to fabricate metal layers using the LAMPE micromachining.

For machining metal films with thickness less than 10 µm, it is recommended to use ultra-short pulsed lasers irrespective of the absorption coefficient of the material. In ultra-short pulsed laser micromachining, the micromachining depth per pulse is equal to the optical penetration depth of the material. The high pulse energy and repetition rate (100 KHz) lead to sufficient number of pulse irradiation per spot, resulting in machining depth in the order 10 µm.

Electro-Deburring

Figure 35:
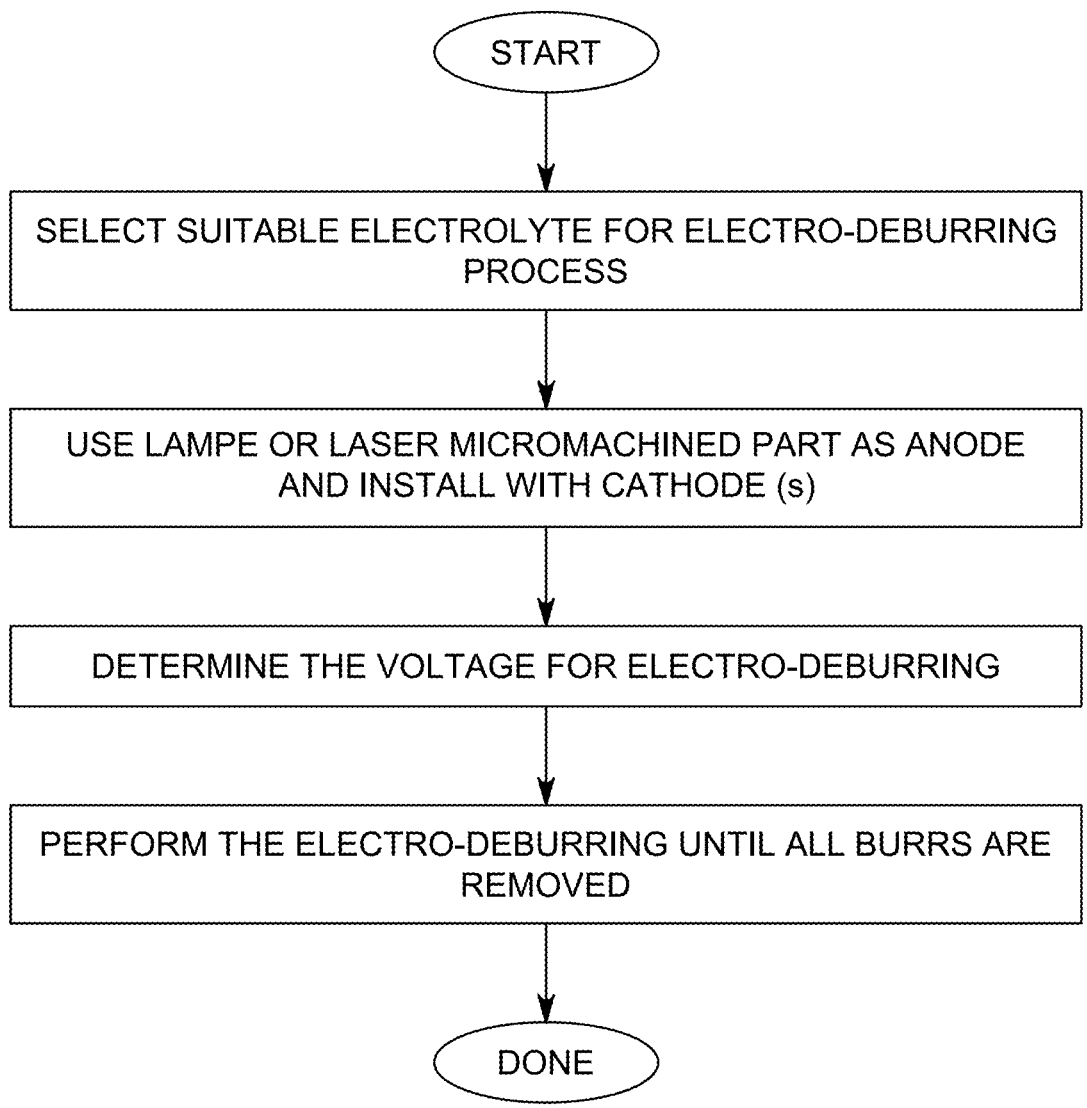
FIG. 35 shows a flowchart summarizing the electro-deburring process.

The steps for performing electro-deburring (summarized in FIG. 35) are as follows:

1. Selecting the electrolyte: The choice of electrolyte depends upon the deburring metal. Since the electro-deburring process is similar to electro-polishing and electroplating process, the choice of electrolyte is the same as that used for electro-polishing or electroplating. There is a great body of work on available electrolytes for various metals. In this work, copper is used for fabricating MEMS. For copper, 14M phosphoric acid is used as the electrolytic solution.
2. Electro-deburring setup: The laser micro-machined copper part is connected to anode and another copper sheet is connected to the cathode. Both electrodes are dipped inside 4M phosphoric acid solution.
3. Selecting the electro-deburring voltage: Setting the right voltage is essential to remove burrs. As can be seen in FIG. 28, the electro-deburring voltage must be greater than the electro-polishing temperature to ensure the removal of the burrs. The electro-polishing process is well studied and the value of the electro-polishing voltage for a given metal and electrolyte can be found in the literature. The electro-deburring voltage should be above this value. In this work, the electro-deburring of laser micro-machined parts is performed at 5V for 30 seconds. Generally, the electro-deburring voltage is a little less than the voltage at which the bubbles start to form at the anode.
4. For some MEMS devices, a gold electroplating may be desirable to prevent oxidation of the metal.
5. After the electro-deburring, the laser micro-machined part can be rinsed in DI water followed by isopropanol rinse. The cleaned laser micromachining part can be either air dried at room temperature or at 85 degree centigrade inside an oven

3.4.2.2 LAMPE Micromachining of Silicon

Flowchart below describes the LAMPE micromachining of silicon

Follow the steps described in the flowchart below to fabricate metal layers using the LAMPE micromachining.

To further increase the aspect ratio in LAMPE micromachining of silicon, perform LAMPE micromachining in HF vapor environment. The HF vapor reacts with the newly formed $SiO_2$ to form colorless gaseous silicon tetrafluoride $SiF_4$, which is removed efficiently. Now, the depth of the micromachining can be further increased by gradually moving the focus downwards as the material is removed. The burrs in LAMPE or laser micro-machined parts are removed using the electro-deburring process. The silicon micro-machined part is used as anode, and HF is used as electrolyte.

3.4.3 Multi-Lamina Assembly & Bonding

The second step in the MALL process is to stack assemble the LAMPE micro-machined laminates to fabricate MEM systems. For many MEMS, the alignment accuracy better than a few micrometers is desirable. Mechanical alignment of laminates using dowel pins and alignment holes is widely used in precision macro-fabrication. This method is employed to align and bond microstructure laminates. The alignment accuracy exceeding 2.5 µm is demonstrated using the method.

FIGS. 34A-34D show a schematic diagram of the alignment-pin and alignment-hole assembly process. The precise hand-assembly is carried out under an eyepiece-less stereo microscope with long working distance and large depth of focus [85]. The microscope uses multi-lenticular technology to provide true depth perception, which aids in hand-to-eye coordination; as a result, facilitating the micro-assembly process.

Figure 34A:
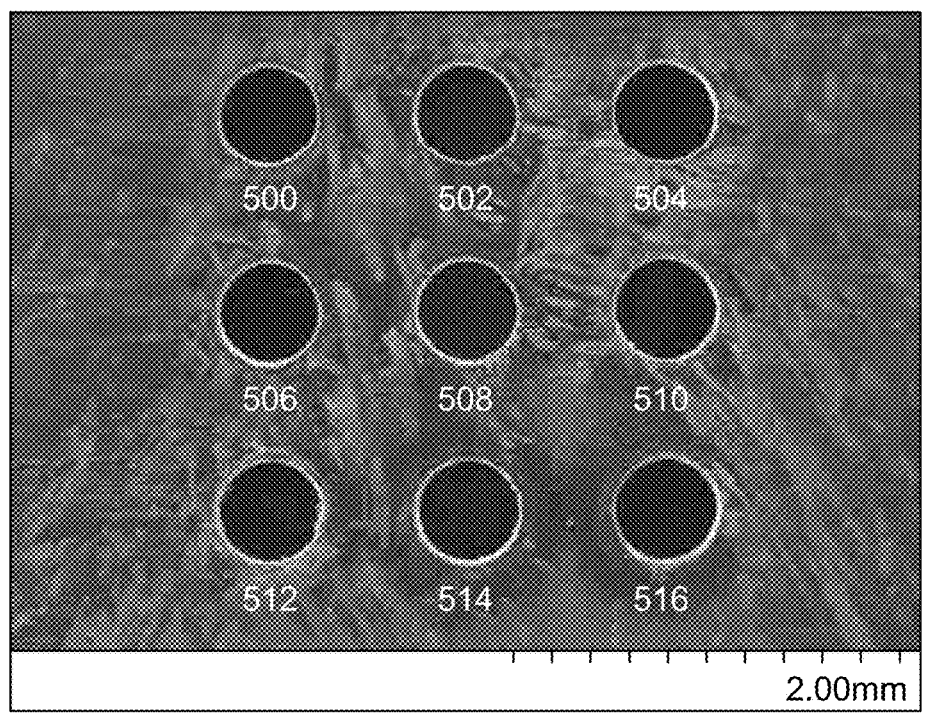
FIGS. 34A-34D show (A) Micro-assembly of discrete lamina sheets using alignment pins. (B) Alignment pin inserted inside the alignment hole. (C) The clearance between the alignment pin and the alignment-hole. (D) SEM image of aligned alignment marks, showing alignment accuracy down to 2 µm. The inset shows the black-lit optical image of an alignment of marks.
Figure 34B:
Figure 34C:
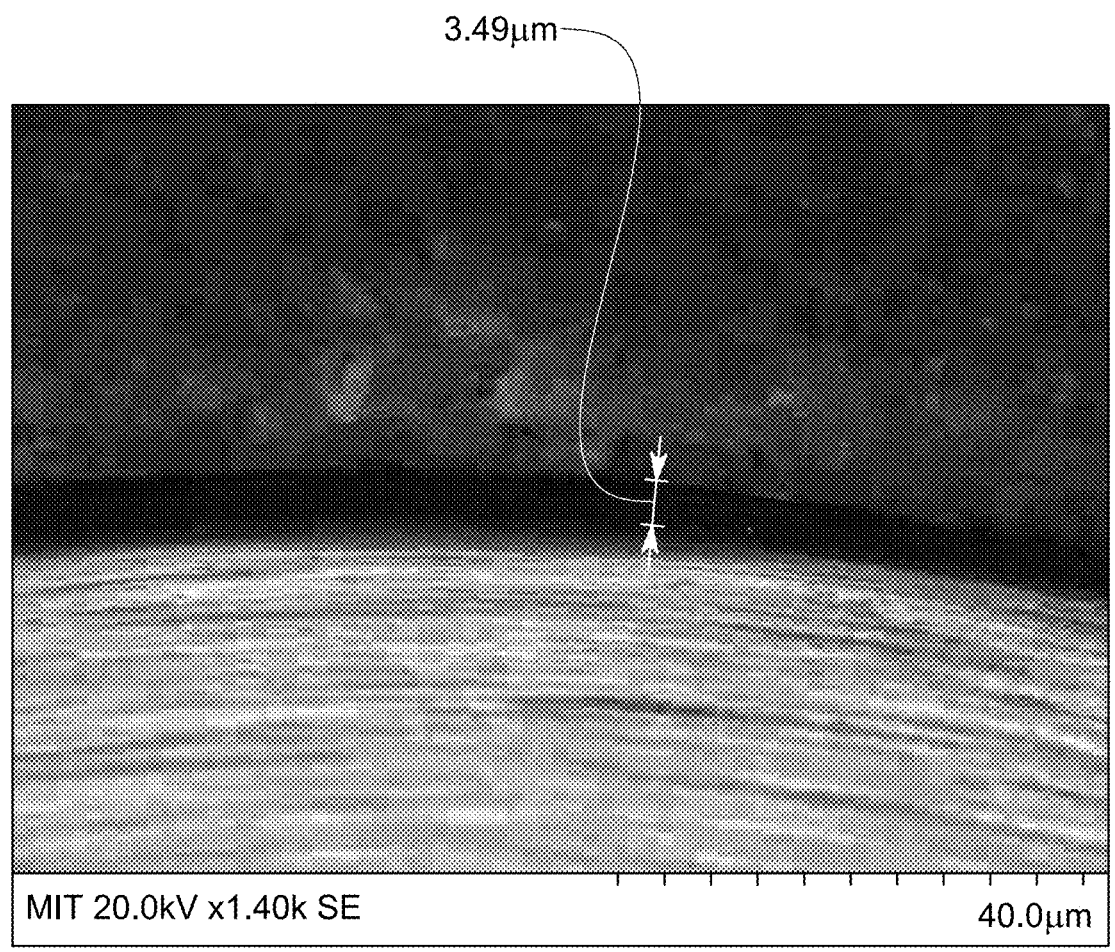

Four precision-ground alignment pins with 508 µm diameter are used for alignment. The clearance between the alignment pin and alignment hole determines the alignment accuracy and must be minimized. For a given alignment pin, first, a series of holes is micro-machined (FIG. 34A). Subsequently, the alignment pins are inserted and the clearance between the pin and the hole is measured (FIG. 34B). Finally, laser micromachining setting for the hole that gave the minimum clearance (FIG. 34C) used to micro-machine alignment holes.

Figure 34D:
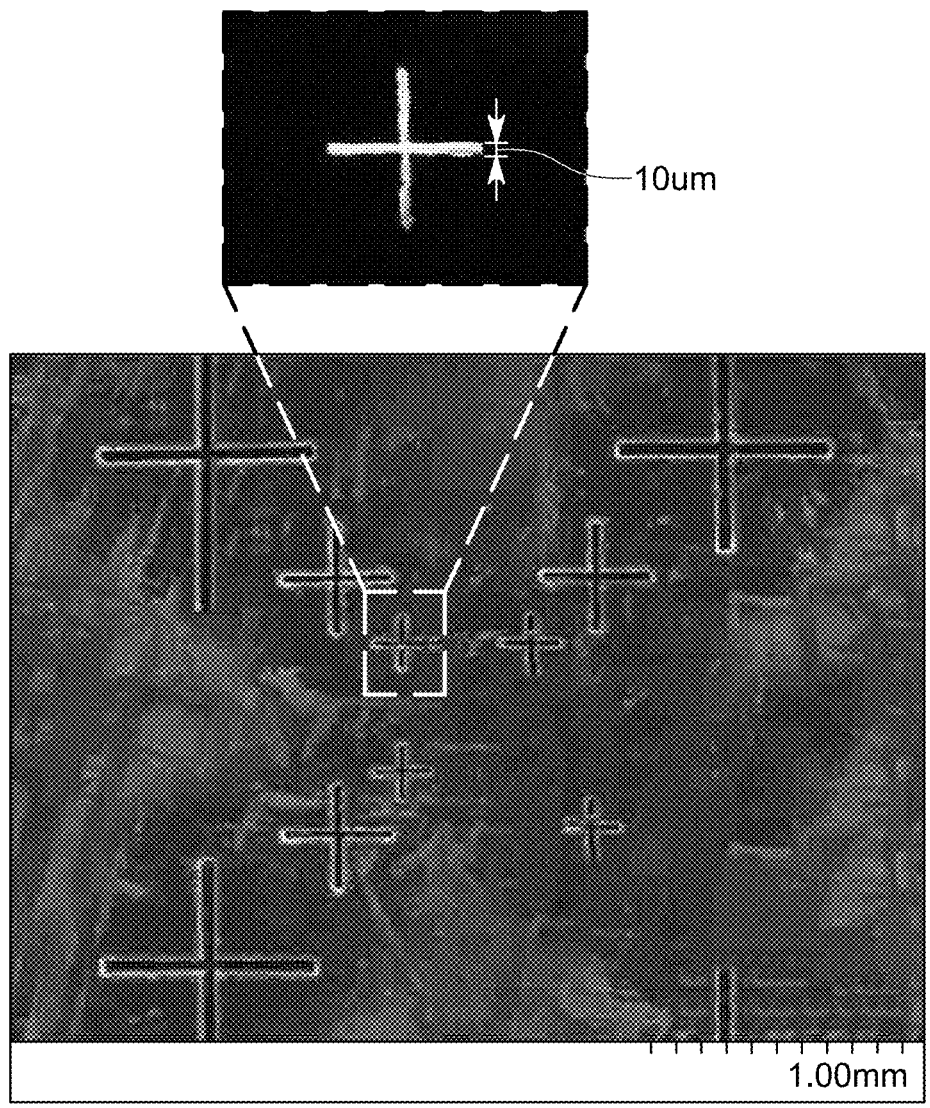

To characterize the alignment accuracy, two layers with alignment marks are assembled and bonded. The bonded layers are illuminated from the rear, and the alignment marks are studied using an optical microscope. The inset of FIG. 34D shows back-illuminated light transmitting through the two aligned marks. The width of the slit is 10 µm, and the overlap between the two aligned markers is better than 75%. As a result, it can be concluded that the alignment accuracy is better than 2.5 µm. The alignment accuracy can be further improved by creating passive alignment features in laminates [86][87][88].

The aligned layers are bonded using Dupont FR1500 and 3M thermal bonding film 583 adhesive sheets. For adhesion, the Dupont FR1500 is cured at 185° C. for 5-20 minutes, depending upon the device design. Similarly, the 3M thermal bonding film 583 can be bonded by using pressure, applying solvent or heating at 120° C. In some devices, it is desirable to first tack bond the adhesive sheet to one layer, and then attach another layer and perform complete cure for lamination. For tack bonding, the FR1500 sheet is cured at 120° C. for 10 minutes, and 3M thermal bonding film 583 is pressure or solvent activated.

The steps for lamination are as follows:
1. For the lamination process, the adhesive layer is first tack bonded to the substrate layer. For tack bonding the Dupont FR1500 adhesive layer, the curing is performed at 120° C.
2. Once the adhesive is tack bonded to the substrate, the backing layer is removed and the top device layer is attached. Alignment pins are used for the alignment. For devices requiring high alignment accuracy, alignment pins with diameter of 500 µm is used to improve the alignment accuracy. However, for the device which does not require a high alignment accuracy, thicker alignment pins (for example, 1.5 mm diameter dowel pins) can be used to simplify the assembly process.
3. Once aligned, the laminate structure is sandwiched between a custom-made alignment fixture and clamped using a paper clip and put inside the oven for full curing. The temperature of the oven is set to 185° C., and the baking is performed for 5-20 minutes depending upon the device and adhesive layer thickness.
4. After the lamination process, the MEMS device can be cut-out from the laminate structure using laser cutting. However, this step is not required during the device development.

3.4.4 MEMS Device Testing

The actual steps for testing the device depend upon the actual design of the device. Here are the general steps which are common to many MEMS devices:
1. After the device fabrication, it is advised to inspect the device in an optical microscope to check the integrity of the device.
2. Care must be taken to handle the MEMS devices, as they are very fragile. Do not blow air to dry or remove dust particles, it will break the device.
3. For electrical testing, use probe station probes to make the electrical connection. A wire-bonder can be used as well. For devices made out of copper, using gold ball-bonding at 100° C. works very well.

4 Summary

In summary, the MALL MEMS fabrication process disclosed here can replace the conventional microfabrication process used for MEMS manufacturing. The MALL process enables MEMS fabrication with a wide range of material, thereby empowering a new paradigm in MEMS design, functionality, and applications. Moreover, the manufacturing cost per device in MALL fabrication is low due to using low-cost fabrication materials such as metal foils. In contrast, in conventional microfabrication, the fabrication material is largely limited to silicon, which restricts the design, functionality, and application of MEMS, and increases the manufacturing cost per device.

The development time and cost in MALL is less due to the independent development of device layers and their effortless integration. The MALL process is well suited for one-of-a-kind and low-demand MEMS market because of the low cost of development. In contrast, creating new MEMS devices in conventional microfabrication requires developing and integrating various material deposition/etching processes, which increases the development time and cost. Thus, even though the cost of manufacturing per device is low, the total cost per device is large. Due to this limitation, the commercialization of MEMS products has been largely limited to markets in which the huge demand can compensate for the high cost of development.

The tools and material cost of MALL fabrication is approximately $25,000, which is affordable to a wider scientific community. This democratization of MEMS fabrication can expedite the development of novel MEMS systems. Traditionally, the research and development of novel MEMS devices have been largely limited to a few industries and universities, due to the high cost of equipment ownership.

Several descriptions and illustrations have been presented to aid in understanding the features of the present invention. One with skill in the art will understand that numerous changes and variations may be made without departing from the spirit of the invention. Each of these changes and variations is within the scope of the present invention.

BIBLIOGRAPHY

[1] D. Niarchos, "Magnetic MEMS: key issues and some applications," Sensors and Actuators, A: Physical, vol. 109, no. 1-2, pp. 166-173, 2003.
[2] S. D. Senturia, Microsystem Design. Springer Science & Business Media, 2007.
[3] R. Ramadoss, S. Lee, Y. C. Lee, V. M. Bright, and K. C. Gupta, "Fabrication, Assembly, and Testing of RF MEMS Capacitive Switches Using Flexible Printed Circuit Technology," IEEE Transactions on Advanced Packaging, vol. 26, no. 3, pp. 248-254, 2003

[4] M. Weber B S and L. C. Kretly, "PCB-MEMS RF switch: Parametric analysis and design guide lines," SBMO/IEEE MTT-S International Microwave and Optoelectronics Conference Proceedings, pp. 141-144, 2007.

[5] H. P. Chang, J. Qian, B. A. Cetiner, F. De Flaviis, M. Bachman, and G. P. Li, "RF MEMS switches fabricated on microwave-laminate printed circuit boards," IEEE Electron Device Letters, vol. 24, no. 4, pp. 227-229, 2003.

[6] M. A. Mapar and M. Omidian, "Laminate MEMS for Heterogeneous Integrated Systems," MRS Online Proceedings Library Archive, vol. 1427, 2012.

[7] J. Tsai, A. Y. Zhang, G. P. Li, and M. Bachman, "A laminate cantilever waveguide optical switch," Proceedings—Electronic Components and Technology Conference, pp. 203-207, 2012.

[8] M. Bachman and G.-P. Li, "MEMS in laminates and package substrates," 2013 IEEE International Symposium on Advanced Packaging Materials, vol. 1, no. Paper 32, pp. 121-125, 2013.

[9] J. P. Whitney, P. S. Sreetharan, K. Y. Ma, and R. J. Wood, "Pop-up book MEMS," Journal of Micromechanics and Microengineering, vol. 21, no. 11, 2011.

[10] H. McClintock, F. Z. Temel, N. Doshi, J.-S. Koh, and R. J. Wood, "The milliDelta: A high-bandwidth, high-precision, millimeter-scale Delta robot," Science Robotics, vol. 3, no. 14, p. eaar3018, 2018.

[11] M. Bachman and G. P. Li, "Laminates for MEMS and BioMEMS," 14th International Conference on Electronic Materials and Packaging, EMAP 2012, no. figure 2, 2012.

[12] A. S. Holmes, "Laser processes for MEMS manufacture," Proceedings of SPIE—The International Society for Optical Engineering, vol. 4426, no. 43, pp. 203-209, 2002.

[13] M. C. Gower, "Laser micromachining for manufacturing MEMS devices," MEMS Components and Applications for Industry, Automobiles, Aerospace, and Communication, vol. 4559, no. October 2001, pp. 53-59, 2001.

[14] M. El-Bandrawy and M. Gupta, "Femtosecond laser micromachining of silicon for MEMS," Proc. SPIE 4977, Photon Processing in Microelectronics and Photonics II, vol. 4977, no. October 2003, pp. 219-225, 2003.

[15] C. Abbott, R. M. Allott, B. Bann, K. L. Boehlen, M. C. Gower, P. T. Rumsby, I. Stassen Boehlen, and N. Sykes, "New techniques for laser micromachining MEMS devices," High-Power Laser Ablation IV, vol. 4760, no. September 2002, pp. 281-288, 2002.

[16] M. R. H. Knowles, G. Rutterford, D. Karnakis, and A. Ferguson, "Micro-machining of metals, ceramics and polymers using nanosecond lasers," International Journal of Advanced Manufacturing Technology, vol. 33, no. 1-2, pp. 95-102, 2007.

[17] H. K. Tonshoff, C. Momma, A. Ostendorf, S. Nolte, and G. Kamlage, "Microdrilling of metals with ultrashort laser pulses," Journal of Laser Applications, vol. 12, no. 1, pp. 23-27, 2000.

[18] N. H. Rizvi, "Femtosecond Laser Micromachining: Current Status and Applications," Optics Communications, vol. 114, no. 1-2, pp. 5660-7, 2002.

[19] R. A. Lawes, A. S. Holmes, and F. N. Goodall, "The formation of moulds for 3D microstructures using excimer laser ablation," Microsystem Technologies, vol. 3, no. 1, pp. 17-19, 1996.

[20] J. Yeom, Y. Wu, J. C. Selby, and M. A. Shannon, "Maximum achievable aspect ratio in deep reactive ion etching of silicon due to aspect ratio dependent transport and the microloading effect," Journal of Vacuum Science & Technology B: Microelectronics and Nanometer Structures, vol. 23, no. 6, p. 2319, 2005.

[21] P. Jaecklin, C. Linder, N. F. D. Rooij, and R. Vuilleumier, "Optical Microshutters and Torsional Micromirrors for Light Modulator Arrays," Cycle, pp. 124-127, 2007.

[22] K. C. Yung, S. M. Mei, and T. M. Yue, "Rapid prototyping of polymer-based MEMS devices using UV YAG laser," Journal of Micromechanics and Microengineering, vol. 14, no. 12, pp. 1682-1686, 2004.

[23] W. C. Tang, T. C. H. Nguyen, and R. T. Howe, "Laterally driven polysilicon resonant microstructures," Micromechanics and MEMS: Classic and Seminal Papers to 1990, vol. 20, pp. 187-193, 1997.

[24] L. Lin, C.-C. Nguyen, R. Howe, and A. Pisano, "Microelectromechanical filters for signal processing," Proceedings IEEE Micro Electro Mechanical Systems, vol. 7, no. 3, pp. 226-231, 1992.

[25] J. N. Palasagaram and R. Ramadoss, "MEMS-capacitive pressure sensor fabricated using printed-circuit-processing techniques," IEEE Sensors Journal, vol. 6, no. 6, pp. 1374-1375, 2006.

[26] B. J. Janney, J. J. Christilda, and S. S. Mary, "MEMS Accelerometer Fabricated Using Printed Circuit Processing Techniques," in IEEE International Symposium on Industrial Electronics, pp. 3250-3254, 2007.

[27] M. Bachman, S. J. Kim, G.-P. Li, Y. Zhang, and M. Wang, "Latched microswitches in laminates for high power 0-6.5 GHz applications," Electronics Letters, vol. 50, no. 14, pp. 1010-1012, 2014.

[28] J. Henri, G. Han, B. Meint de, E. Miko, and F. Jan, "A survey on the reactive ion etching of silicon in microtechnology," Journal of Micromechanics and Microengineering, vol. 6, no. 1, p. 14, 1996.

[29] F. Marty, L. Rousseau, B. Saadany, B. Mercier, O. Francais, Y. Mita, and T. Bourouina, "Advanced etching of silicon based on deep reactive ion etching for silicon high aspect ratio microstructures and three-dimensional micro-and nanostructures," Microelectronics journal, vol. 36, no. 7, pp. 673-677, 2005.

[30] A. Ayon, R. Bayt, and K. Breuer, "Deep reactive ion etching: a promising technology for micro-and nanosatellites," Smart materials and structures, vol. 10, no. 6, p. 1135, 2001.

[31] K. Fujimoto, N. Maeda, H. Kitada, Y. Kim, A. Kawai, K. Arai, T. Nakamura, K. Suzuki, and T. Ohba, "Development of multi-stack process on wafer-on-wafer (wow)," in 2010 IEEE CPMT Symposium Japan, pp. 1-4, IEEE, 2010.

[32] A. Luque, J. M. Soto, F. Perdigones, C. Aracil, and J. M. Quero, "Electroosmotic impulsion device for integration in PCB-MEMS," Proceedings of the 2013 Spanish Conference on Electron Devices, CDE 2013, pp. 119-122, 2013.

[33] M. Bachman and G. P. Li, "MEMS in laminates," Proceedings—Electronic Components and Technology Conference, pp. 262-267, 2011.

[34] M. Bachman and G. Li, "Integrated mems in package," Circuit World, vol. 38, no. 4, pp. 184-192, 2012.

[35] Y. Shim, J. Ruan, Z. Wu, and M. Rais-Zadeh, "An integrated rf mems tunable filter," in 2012 IEEE 25th International Conference on Micro Electro Mechanical Systems (MEMS), pp. 15-18, IEEE, 2012.

[36] P. Goel, "Mems non-silicon fabrication technologies," Sensors & Transducers, vol. 139, no. 4, p. 1, 2012.

[37] M. Bachman and G.-P. Li, "Laminates for mems and biomems," in 2012 14th International Conference on Electronic Materials and Packaging (EMAP), pp. 1-5, IEEE, 2012.

[38] M. Maddela, R. Ramadoss, and R. Lempkowski, "A mems-based tunable coplanar patch antenna fabricated using pcb processing techniques," Journal of Micromechanics and Microengineering, vol. 17, no. 4, p. 812, 2007.

[39] A. Luque, G. Flores, F. Perdigones, D. Medina, J. Garcia, and J. Quero, "Single axis accelerometer fabricated using printed circuit board techniques and laser ablation," Sensors and Actuators A: Physical, vol. 192, pp. 119-123, 2013.

[40] J. Rogers, R. Ramadoss, P. Ozmun, and R. Dean, "A microelectromechanical accelerometer fabricated using printed circuit processing techniques," Journal of Micromechanics and Microengineering, vol. 18, no. 1, p. 015013, 2007.

[41] A. Cardenas-Valencia, J. Dlutowski, S. Knighton, C. Biver, J. Bumgarner, and L. Langebrake, "Aluminum-anode, silicon-based micro-cells for powering expendable mems and lab-on-a-chip devices," Sensors and Actuators B: Chemical, vol. 122, no. 1, pp. 328-336, 2007.

[42] J. P. Whitney, P. S. Sreetharan, K. Y. Ma, and R. J. Wood, "Pop-up book MEMS," Journal of Micromechanics and Microengineering, vol. 21, no. 11, 2011.

[43] P. A. York, N. T. Jafferis, and R. J. Wood, "Meso scale flextensional piezoelectric actuators," Smart Materials and Structures, vol. 27, no. 1, p. 015008, 2017.

[44] J. Lessing, A. C. Glavan, S. B. Walker, C. Keplinger, J. A. Lewis, and G. M. Whitesides, "Inkjet printing of conductive inks with high lateral resolution on omniphobic "rf paper" for paper-based electronics and mems," Advanced Materials, vol. 26, no. 27, pp. 4677-4682, 2014.

[45] J. A. Lewis, "Direct-write assembly of ceramics from colloidal inks," Current Opinion in Solid State and Materials Science, vol. 6, no. 3, pp. 245-250, 2002.

[46] C. W. Visser, R. Pohl, C. Sun, G.-W. Römer, B. Huis in 't Veld, and D. Lohse, "Toward 3d printing of pure metals by laser-induced forward transfer," Advanced materials, vol. 27, no. 27, pp. 4087-4092, 2015.

[47] C. G. K. Malek, "Su8 resist for low-cost x-ray patterning of high-resolution, high-aspect-ratio mems," Microelectronics Journal, vol. 33, no. 1-2, pp. 101-105, 2002.

[48] R. T. Howe, "Surface micromachining for microsensors and microactuators," Journal of Vacuum Science & Technology B: Microelectronics and Nanometer Structures, vol. 6, no. 6, p. 1809, 1988.

[49] J. W. Gardner, O. O. Awadelkarim, and V. K. Varadan, Microsensors, MEMS, and Smart Devices. Wiley New York, 2001.

[50] J. G. Korvink, MEMS: A Practical Guide to Design, Analysis and Applications. Springer Science \& Business Media, 2010.

[51] L. L. Wu, S. Babikian, G. P. Li, and M. Bachman, "Microfluidic printed circuit boards," Proceedings—Electronic Components and Technology Conference, pp. 1576-1581, 2011.

[52] B. H. Weigl, R. Bardell, T. Schulte, F. Battrell, and J. Hayenga, "Design and rapid prototyping of thin-film laminate-based microfluidic devices," Biomedical Microdevices, vol. 3, no. 4, pp. 267-274, 2001.

[53] B. N. Chichkov, C. Momma, S. Nolte, F. von Alvensleben, and A. Tünnermann, "Femtosecond, picosecond and nanosecond laser ablation of solids," Appl. Phys, vol. 63, pp. 109-115, 1996.

[54] K. H. Leitz, B. Redlingshoer, Y. Reg, A. Otto, and M. Schmidt, "Metal ablation with short and ultrashort laser pulses," Physics Procedia, vol. 12, no. PART 2, pp. 230-238, 2011.

[55] D. Bauerle, Laser Processing and Chemistry. Springer Science \& Business Media, third ed., 2013.

[56] Laser micromachining, accessed Aug. 10, 2019. https://www.oxfordlasers.com/laser-micromachining/.

[57] W. M. Steen and J. Mazumder, Laser Material Porcessing. springer science \& business media, 2010.

[58] R. Paschotta et al., Encyclopedia of laser physics and technology, vol. 1. Wiley Online Library, 2008.

[59] Optical Intensity, accessed Aug. 8, 2019. https://www.rp-photonics.com/optical_intensity.html.

[60] Small Beam Diameter Scanning Galvo Mirror Systems, accessed Aug. 2, 2019. https://www.thorlabs.com/thorproduct.cfm?partnumber=GVS202.

[61] W. F. Hosford and R. M. Caddell, Metal forming: mechanics and metallurgy. Cambridge University Press, 2011.

[62] D. Karnakis, G. Rutterford, M. Knowles, T. Dobrev, P. Petkov, and S. Dimov, "High quality laser milling of ceramics, dielectrics and metals using nanosecond and picosecond lasers," in Photon Processing in Microelectronics and Photonics V, vol. 6106, p. 610604, 2006.

[63] P. Heyl, T. Olschewski, and R. W. Wijnaendts, "Manufacturing of 3D structures for micro-tools using laser ablation," Microelectronic Engineering, vol. 57-58, pp. 775-780, 2001.

[64] J. Meijer, "Laser beam machining (LBM), state of the art and new opportunities," Journal of Materials Processing Technology, vol. 149, no. 1-3, pp. 2-17, 2004.

[65] D. Breitling, A. Ruf, and F. Dausinger, "Fundamental aspects in machining of metals with short and ultrashort laser pulses," Photon Processing in Microelectronics and Photonics III, vol. 5339, no. July 2004, p. 49, 2004.

[66] A. C. Forsman, P. S. Banks, M. D. Perry, E. M. Campbell, A. L. Dodell, and M. S. Armas, "Double-pulse machining as a technique for the enhancement of material removal rates in laser machining of metals," Journal of Applied Physics, vol. 98, no. 3, 2005.

[67] R. W. Pryor, Multiphysics modeling using COMSOL: a first principles approach. Jones & Bartlett Publishers, 2009.

[68] Modeling thermal ablation for material removal, accessed Aug. 8, 2019. https://www.comsol.com/blogs/modeling-thermal-ablation-for-material-removal/.

[69] D. B. Go and A. Venkattraman, "Microscale gas breakdown: Ion-enhanced field emission and the modified Paschen's curve," Journal of Physics D: Applied Physics, vol. 47, no. 50, 2014.

[70] D. Landolt, "Fundamental Aspects of Electropolishing," Ekcuochimiru Aore, vol. 12, 1987.

[71] K. E. Petersen, "Silicon as a mechanical material," in Proceedings of the IEEE, vol. 70, pp. 420-457, IEEE, 1982.

[72] B. Wu, A. Kumar, and S. Pamarthy, "High aspect ratio silicon etch: A review," Journal of Applied Physics, vol. 108, no. 5, 2010.

[73] F. Brandi, N. Burdet, R. Carzino, and A. Diaspro, "Very large spot size effect in nanosecond laser drilling efficiency of silicon," Optics Express, vol. 18, no. 22, p. 23488, 2010.

[74] C. Molpeceres, S. Lauzurica, J. L. Ocãa, J. J. Gandia, L. Urbina, and J. Cárabe, "Microprocessing of ITO and a-Si thin films using ns laser sources," Journal of Micromechanics and Microengineering, vol. 15, no. 6, pp. 1271-1278, 2005.

[75] J. Kaspar, A. Luft, S. Nolte, M. Will, and E. Beyer, "Laser helical drilling of silicon wafers with ns to fs pulses: Scanning electron microscopy and transmission electron microscopy characterization of drilled through-holes," Journal of Laser Applications, vol. 18, no. 2, pp. 85-92, 2006.

[76] S. T. Hendow and S. A. Shakir, "Structuring materials with nanosecond laser pulses," Optics Express, vol. 18, no. 10, p. 10188, 2010.

[77] D. J. Lim, H. Ki, and J. Mazumder, "Mass removal modes in the laser ablation of silicon by a Q-switched diode-pumped solid-state laser (DPSSL)," Journal of Physics D: Applied Physics, vol. 39, no. 12, pp. 2624-2635, 2006.

[78] Y. H. Lee and K. J. Choi, "Analysis of silicon via hole drilling for wafer level chip stacking by UV laser," International Journal of Precision Engineering and Manufacturing, vol. 11, no. 4, pp. 501-507, 2010.

[79] H. Herfurth, R. Patwa, T. Lauterborn, S. Heinemann, and H. Pantsar, "Micromachining with tailored nanosecond pulses," Photonics North 2007, vol. 6796, no. October 2007, p. 67961G, 2007.

[80] D. Karnakis, G. Rutterford, and M. Knowles, "High power dpss laser micromachining of silicon and stainless steel," in Proceedings of the Third International WLT-Conference on Lasers in Manufacturing, no. June, 2005.

[81] J. H. Yoo, S. H. Jeong, X. L. Mao, R. Greif, and R. E. Russo, "Evidence for phase-explosion and generation of large particles during high power nanosecond laser ablation of silicon," Applied Physics Letters, vol. 76, no. 6, pp. 783-785, 2000.

[82] B. Wu, A. Kumar, and S. Pamarthy, "High aspect ratio silicon etch: A review," Journal of Applied Physics, vol. 108, no. 5, 2010.

[83] F. Beyeler, A. Neild, and S. Oberti, "Monolithically Fabricated Microgripper With Integrated Force Sensor for Manipulating Microobjects and Biological Cells Aligned in an Ultrasonic Field," Journal of Microelectromechanical Systems, vol. 16, no. 1, pp. 7-15, 2007.

[84] E. J. Garcia and J. J. Sniegowski, "Surface Micromachined Microengine as the Driver for Electromechanical Gears," Eurosensors IX, pp. 365-368, 1995.

[85] Lynx Evo Eyepiece-less Stereo Microscope, accessed Aug. 10, 2019. http://www.visioneng.us/products/stereo-microscopes/lynx-evo-dynascope-inspection/.

[86] X. Xie and C. Livermore, "Passively self-aligned assembly of compact barrel hinges for high-performance, out-of-plane mems actuators," Proceedings of the IEEE International Conference on Micro Electro Mechanical Systems (MEMS), pp. 813-816, 2017.

[87] X. Xie and C. Livermore, "A pivot-hinged, multilayer SU-8 micro motion amplifier assembled by a self-aligned approach," Proceedings of the IEEE International Conference on Micro Electro Mechanical Systems (MEMS), vol. 2016. January, pp. 75-78, 2016.

[88] S. H. Lee, F. Niklaus, J. J. McMahon, J. Yu, R. J. Kumar, H.-f. Li, R. J. Gutmann, T. S. Cale, and J.-Q. Lu, "Fine Keyed Alignment and Bonding for Wafer-Level 3D ICs," MRS Proc., vol. 914, pp. F10-05, 2006.

[89] M. Elwenspoek, R. Legtenberg, and a. W. Groeneveld, "Comb-drive actuators for large displacements," Journal of Micromechanics and Microengineering, vol. 6, no. 3, pp. 320-329, 1999.

[90] L. J. Durney, Graham's Electroplating Engineering Handbook. Springer Science & Business Media, 1984.

[91] V. Kaajakari, Practical MEMS. Small Gear Publishing, 2009.

[92] F. W. Strong, J. L. Skinner, P. M. Dentinger, and N. C. Tien, "Electrical breakdown across micron scale gaps in MEMS structures," Reliability, Packaging, Testing, and Characterization of MEMS/MOEMS V, vol. 6111, p. 611103, 2006.

[93] M. Klas, S. Matejík, B. Radjenović, and M. Radmilović-Radjenović, "Experimental and theoretical studies of the breakdown voltage characteristics at micrometre separations in air," Epl, vol. 95, no. 3, 2011.

[94] A. Hariri, J. W. Zu, and R. Ben Mrad, "Modeling of dry stiction in micro electro-mechanical systems (MEMS)," Journal of Micromechanics and Microengineering, vol. 16, no. 7, pp. 1195-1206, 2006.

[95] Y. X. Zhuang, O. Hansen, T. Knieling, C. Wang, P. Rombach, W. Lang, W. Benecke, M. Kehlenbeck, and J. Koblitz, "Vapor-phase self-assembled monolayers for anti-stiction applications in MEMS," Journal of Microelectromechanical Systems, vol. 16, no. 6, pp. 1451-1460, 2007.

[96] W. R. Ashurst, C. Carraro, and R. Maboudian, "Vapor phase anti-stiction coatings for MEMS," IEEE Transactions on Device and Materials Reliability, vol. 3, no. 4, pp. 173-178, 2003.

[97] T. P. Knowles, M. Vendruscolo, and C. M. Dobson, "The amyloid state and its association with protein misfolding diseases," Nature Reviews Molecular Cell Biology, vol. 15, no. 6, pp. 384-396, 2014.

[98] H. Jang, J. Zheng, R. Lal, and R. Nussinov, "New structures help the modeling of toxic amyloidβ ion channels," Trends in Biochemical Sciences, vol. 33, no. 2, pp. 91-100, 2008.

[99] R. Andrew, E R and Bradbury, A and Eades, "Nuclear magnetic resonance spectra from a crystal rotated at high speed," Nature, vol. 182, no. 4650, p. 1658, 1958.

[100] M. Cohen, R. P. Feynman, and L. J. Lowe, "Physical Review Letters Free Induction Decays of Rotating Solids," Phys. Rev. Lett, vol. 2, no. 7, p. 71, 1957.

[101] C. P. Jaroniec, C. E. MacPhee, V. S. Bajaj, M. T. McMahon, C. M. Dobson, and R. G. Griffin, "High-resolution molecular structure of a peptide in an amyloid fibril determined by magic angle spinning NMR spectroscopy," Proceedings of the National Academy of Sciences of the United States of America, vol. 101, no. 3, pp. 711-716, 2004.

[102] R. Tycko, "Solid State NMR Studies of Amyloid Fibril Structure Robert," Annual review of physical chemistry, vol. 62, no. 1, pp. 279-299, 2011.

[103] A. Bockmann, M. Ernst, and B. H. Meier, "Spinning proteins, the faster, the better?," Journal of Magnetic Resonance, vol. 253, pp. 71-79, 2015.

[104] T. Polenoval, R. Gupta, and A. Goldbourt, "Magic Angle Spinning NMR Spectroscopy: A Versatile Technique for Structural and Dynamic Analysis of Solid-Phase Systems," vol. 25, no. 3, pp. 289-313, 2016.

[105] S. Penzel, A. Oss, M. L. Org, A. Samoson, A. Bockmann, M. Ernst, and B. H. Meier, "Spinning faster: protein NMR at MAS frequencies up to 126 kHz," Journal of Biomolecular NMR, vol. 73, no. 1-2, pp. 19-29, 2019.

[106] E. Bouleau, P. Saint-Bonnet, F. Mentink-Vigier, H. Takahashi, J. F. Jacquot, M. Bardet, F. Aussenac, A. Purea, F. Engelke, S. Hediger, D. Lee, and G. De Paepe, "Pushing NMR sensitivity limits using dynamic nuclear polarization with closed-loop cryogenic helium sample spinning," Chemical Science, vol. 6, no. 12, pp. 6806-6812, 2015.

[107] W. H. Potter, "Apparatus to rotate samples rapidly at temperatures less than 2 K in high transverse magnetic fields," Review of Scientific Instruments, vol. 42, no. 5, pp. 618-625, 1971.

[108] S. Wegner, Solid State NMR News and Updates, accessed Aug. 10, 2019. https://www.bruker.com/fileadmin/user_upload/8-PDF-Docs/MagneticResonance/Events_NMR/UM_DE18/Solid_State_NMR_Workshop_2.pdf.

[109] J. Jensen, R. G. Stewart, W. Tuttle, and H. Brechna, Brookhaven national laboratory selected cryogenic data notebook: sections I-IX, vol. 1. Brookhaven National Laboratory, 1980.

[110] D. Olson, G. Reynolds, G. Virshup, F. Friedlander, B. James, and L. Partain, "Tensile strength of synthetic chemical-vapor-deposited diamond," Journal of Applied Physics, vol. 5177, no. August, 1995.

[111] A. G. Hamlir, B. J. Roberts, U. Kingdom, and A. Energy, "Feb. 20, 1960," Nature, vol. 185, no. 4712, p. 522, 1960.

[112] A. D. Vita, G. Galli, A. Canningt, and R. Car, "Diamond-To-Graphite Transitions," vol. 379, no. February, pp. 523-526, 1996.

[113] C. Hedlund, H. Blom, and S. Berg, "Microloading effect in reactive ion etching," Journal of Vacuum Science & Technology A: Vacuum, Surfaces, and Films, vol. 12, no. 4, pp. 1962-1965, 1994.

[114] University wafer, accessed Aug. 10, 2019. https://order.universitywafer.com.

[115] P. Ramm, J. J.-Q. Lu, and M. M. Taklo, Handbook of wafer bonding. John Wiley & Sons, 2011.

[116] S. Beeby, G. Ensel, N. M. White, and M. Kraft, MEMS mechanical sensors. Artech House, 2004.

[117] J. Henri, G. Han, B. Meint de, E. Miko, and F. Jan, "A survey on the reactive ion etching of silicon in microtechnology," Journal of Micromechanics and Microengineering, vol. 6, no. 1, p. 14, 1996.

[118] M. W. Judy and R. T. Howe, "Polysilicon Hollow Lateral Resonators," in [1993] Proceedings IEEE Micro Electro Mechanical Systems, pp. 265-271, IEEE, 1993.

[119] Y.-H. Yoon, Y. Jin, C.-K. Kim, and S. Hong, "4-Terminal MEMS relay with an extremely low contact resistance employing a novel one-contact design," in 2017 19th International Conference on Solid-State Sensors, Actuators and Microsystems (TRANSDUCERS), pp. 906-909, IEEE, 2017.

[120] R. Nathanael, V. Pott, H. Kam, J. Jeon, E. Alon, and T. J. K. Liu, "Four-terminal-relay body-biasing schemes for complementary logic circuits," IEEE Electron Device Letters, vol. 31, no. 8, pp. 890-892, 2010.

[121] S. Farrens, Wafer level 3-D ICs process technology. Springer Science \& Business Media, 2009.

[122] S. H. Lee, K. N. Chen, and J. J. Q. Lu, "Wafer-to-wafer alignment for three-dimensional integration: A review," Journal of Microelectromechanical Systems, vol. 20, no. 4, pp. 885-898, 2011.

[123] B. T. Tung, N. Watanabe, F. Kato, K. Kikuchi, and M. Aoyagi, "Flip-chip bonding alignment accuracy enhancement using self-aligned interconnection elements to realize low-temperature construction of ultrafine-pitch copper bump interconnections," Proceedings—Electronic Components and Technology Conference, pp. 62-67, 2014.

[124] A. H. Slocum and A. C. Weber, "Precision passive mechanical alignment of wafers," Journal of Microelectromechanical Systems, vol. 12, no. 6, pp. 826-834, 2003.

[125] M. Stafe, A. Marcu, and N. Puscas, Pulsed Laser Ablation of Solids: Basics, Theory and Applications, vol. 53. Springer Science \& Business Media, 2013.

[126] K. Sugioka and Y. Cheng, "Femtosecond laser three-dimensional micro-and nanofabrication," Applied Physics Reviews, vol. 1, no. 4, 2014.

[127] A. A. Tseng, "Recent developments in micromilling using focused ion beam technology," Journal of micromechanics and microengineering, vol. 14, no. 4, p. R15, 2004.

[128] K. Watanabe, M. Kinoshita, T. Mine, M. Morishita, K. Fujisaki, R. Matsui, M. Sagawa, S. Machida, H. Oba, Y. Sugiyama, et al., "Plasma ion-beam 3d printing: A novel method for rapid fabrication of customized mems sensors," in 2018 IEEE Micro Electro Mechanical Systems (MEMS), pp. 459-462, IEEE, 2018.

[129] M. Vaezi, H. Seitz, and S. Yang, "A review on 3D micro-additive manufacturing technologies," International Journal of Advanced Manufacturing Technology, vol. 67, no. 5-8, pp. 1721-1754, 2013.

[130] S. Maruo and K. Ikuta, "Submicron stereolithography for the production of freely movable mechanisms by using single-photon polymerization," Sensors and Actuators, A: Physical, vol. 100, no. 1, pp. 70-76, 2002.

[131] S. Maruo and K. Ikuta, "Movable microstructures made by two-photon three-dimensional microfabrication," in MHS'99. Proceedings of 1999 International Symposium on Micromechatronics and Human Science (Cat. No. 99TH8478), pp. 173-178, IEEE, 1999.

[132] Agilis Piezo Motor Driven Linear Stages, accessed Aug. 2, 2019. https://www.newport.com/f/agilis-piezo-motor-linear-stages.

[133] N. N. M. Peek, Making machines that make: object-oriented hardware meets object-oriented software. PhD thesis, Massachusetts Institute of Technology, 2016.

[134] Machine That Makes, accessed Aug. 2, 2019. http://mtm.cba.mit.edu/.

[135] J. T. Schwartz, J. von Neumann, and A. W. Burks, "Theory of Self-Reproducing Automata," 2006.

[136] Nimrod copper, accessed Aug. 10, 2019. https://www.nimrodcopper.com/shop/4-mil-copper-foils-(-004)-13250.

We claim:

1. A laser micro-machining and assembly process comprising:
    producing a plurality of layers of an object, each layer having a cutting surface;
    cutting a plurality of features in the cutting surface of each layer using a pulsed laser with intensity, pulse width and pulse rate set to melt surface material and thereby create liquid material, and eject said liquid material away from the cutting surface of each layer so cut, with vaporizing of said surface material only to an extent sufficient to form vapor bubble pressure and with no oxidizing of said surface material;
    removing burrs from the cutting surface of each layer after said cutting by electro-deburring the cutting surface with a dilute acid solution in the presence of an applied electric potential;
    stack assembling the plurality of layers to form the object.

2. The process of claim 1, wherein the layers are metal and wherein said liquid material is ejected away from the opposite side of the cutting surface to which the laser is directed.

3. The process of claim 2, wherein the metal is copper.

4. The process of claim 3, wherein the laser has a wavelength of 532 nm and a lens of focal length 100 mm, and wherein the average power and beam size results in a power density at a beam spot of 2.12 kW/mm$^2$.

5. The process of claim 2, wherein the layers are a metal alloy.

6. The process of claim 1, wherein the layers are chosen from the group consisting of metals, ceramics, polymers and composite materials.

7. The process of claim 1, wherein the layers are magnetic, piezoelectric, pyroelectric, thermoelectric or superconducting.

8. The process of claim 1 further comprising using a plurality of alignment pins with a plurality of alignment holes in the layers to achieve alignment of the layers during stack assembling.

9. The process of claim 1, wherein each layer is a metal foil bonded to, or electro-plated onto a substrate during said cutting.

10. A laser micro-machining process comprising:
cutting a plurality of features in a cutting surface of a material using a pulsed laser with intensity, pulse width and pulse rate set to melt said material thereby to create liquid material, and eject said liquid material away from the cutting surface of each layer so cut, with vaporizing of said surface material only to an extent sufficient to form vapor bubble pressure;
removing burrs from the cutting surface after said cutting by electro-deburring the cutting surface with a dilute acid solution in the presence of an electric potential.

11. The process of claim 10, wherein the cutting surface is metal and wherein said liquid material is ejected away from the opposite side of the cutting surface to which the laser is directed.

12. The process of claim 11, wherein the metal is copper.

13. The process of claim 12, wherein the cutting surface is a metal alloy.

14. The process of claim 11, wherein the cutting surface is chosen from the group consisting of metals, ceramics, polymers and composite materials.

15. The process of claim 11, wherein the cutting surface is magnetic, piezoelectric, pyroelectric, thermoelectric or superconducting.

16. The process of claim 10, wherein the laser has a wavelength of 532 nm and a lens of focal length 100 mm, and wherein the average power and beam size results in a power density at a beam spot of 2.12 kW/mm$^2$.

* * * * *